United States Patent
Lin et al.

(10) Patent No.: US 8,034,645 B2
(45) Date of Patent: Oct. 11, 2011

(54) METHOD OF MAKING A SEMICONDUCTOR CHIP ASSEMBLY WITH A COPPER/ALUMINUM POST/BASE HEAT SPREADER

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 12/626,941

(22) Filed: Nov. 30, 2009

(65) Prior Publication Data
US 2010/0087020 A1    Apr. 8, 2010

Related U.S. Application Data

(60) Division of application No. 12/626,884, filed on Nov. 28, 2009, which is a continuation-in-part of application No. 12/616,773, filed on Nov. 11, 2009, and a continuation-in-part of application No. 12/616,775, filed on Nov. 11, 2009, said application No. 12/616,773 and a continuation-in-part of application No. 12/557,540, filed on Sep. 11, 2009, is a continuation-in-part of application No. 12/406,510, filed on Mar. 18, 2009, said application No. 12/557,540 and a continuation-in-part of application No. 12/557,541, filed on Sep. 11, 2009, now Pat. No. 7,948,076, is a continuation-in-part of application No. 12/406,510, filed on Mar. 18, 2009, said application No. 12/616,775 and a continuation-in-part of application No. 12/557,540, filed on Sep. 11, 2009, is a continuation-in-part of application No. 12/406,510, filed on Mar. 18, 2009, said application No. 12/616,775 and a continuation-in-part of application No. 12/557,541, filed on Sep. 11, 2009, now Pat. No. 7,948,076.

(60) Provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
*H01L 21/00* (2006.01)
(52) U.S. Cl. .......................................... 438/26; 438/122
(58) Field of Classification Search .................... 438/25, 438/26, 118, 122; 257/707
See application file for complete search history.

(56) References Cited

U.S. PATENT DOCUMENTS
3,689,993 A    9/1972  Tolar ............................ 438/380
(Continued)

FOREIGN PATENT DOCUMENTS
JP    2005-166775    6/2005

*Primary Examiner* — Walter L Lindsay, Jr.
*Assistant Examiner* — Bryan Junge
(74) *Attorney, Agent, or Firm* — David M. Sigmond

(57) ABSTRACT

A method of making a semiconductor chip assembly includes providing a post and a base that include a copper surface layer and an aluminum core, mounting an adhesive on the base including inserting the post into an opening in the adhesive, mounting a conductive layer on the adhesive including aligning the post with an aperture in the conductive layer, then flowing the adhesive into and upward in a gap located in the aperture between the post and the conductive layer, solidifying the adhesive, then providing a conductive trace that includes a pad, a terminal and a selected portion of the conductive layer, mounting a semiconductor device on a heat spreader that includes the post and the base, electrically connecting the semiconductor device to the conductive trace and thermally connecting the semiconductor device to the heat spreader.

60 Claims, 31 Drawing Sheets

U.S. PATENT DOCUMENTS

| | | | |
|---|---|---|---|
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |
| 5,457,605 A | 10/1995 | Wagner et al. | 361/720 |
| 5,644,163 A | 7/1997 | Tsuji | 257/706 |
| 6,057,601 A | 5/2000 | Lau et al. | 257/738 |
| 6,160,705 A | 12/2000 | Stearns et al. | 361/704 |
| 6,313,525 B1 | 11/2001 | Sasano | 257/704 |
| 6,376,908 B1 * | 4/2002 | Gaku et al. | 257/707 |
| 6,495,914 B1 | 12/2002 | Sekine et al. | 257/723 |
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,583,444 B2 | 6/2003 | Fjelstad | 257/82 |
| 6,603,209 B1 | 8/2003 | DiStefano et al. | 257/781 |
| 6,625,028 B1 | 9/2003 | Dove et al. | 361/707 |
| 6,670,219 B2 | 12/2003 | Lee et al. | 438/107 |
| 6,683,795 B1 | 1/2004 | Yoo | 361/816 |
| 6,720,651 B2 | 4/2004 | Gaku et al. | 257/707 |
| 6,861,750 B2 * | 3/2005 | Zhao et al. | 257/739 |
| 6,900,535 B2 | 5/2005 | Zhou | 257/707 |
| 6,906,414 B2 | 6/2005 | Zhao et al. | 257/707 |
| 6,936,855 B1 | 8/2005 | Harrah | 257/88 |
| 6,964,877 B2 | 11/2005 | Chen et al. | 438/20 |
| 7,038,311 B2 | 5/2006 | Woodall et al. | 257/706 |
| 7,196,403 B2 | 3/2007 | Karim | 257/675 |
| 7,335,522 B2 * | 2/2008 | Wang et al. | 438/26 |
| 7,470,935 B2 | 12/2008 | Lee et al. | 257/98 |
| 7,582,951 B2 | 9/2009 | Zhao et al. | 257/660 |
| 7,642,137 B2 * | 1/2010 | Lin et al. | 438/127 |
| 7,690,817 B2 | 4/2010 | Sanpei et al. | 362/294 |
| 7,741,158 B2 | 6/2010 | Leung et al. | 438/122 |
| 7,781,266 B2 | 8/2010 | Zhao et al. | 438/123 |
| 7,808,087 B2 | 10/2010 | Zhao et al. | 257/670 |
| 7,956,372 B2 | 6/2011 | Kamada et al. | 257/98 |
| 2003/0189830 A1 | 10/2003 | Sugimoto et al. | 362/294 |
| 2004/0061433 A1 | 4/2004 | Izuno et al. | 313/498 |
| 2004/0065894 A1 | 4/2004 | Hashimoto et al. | 257/100 |
| 2005/0135105 A1 | 6/2005 | Teixeira et al. | 362/294 |
| 2005/0185880 A1 | 8/2005 | Asai | 385/14 |
| 2006/0012967 A1 | 1/2006 | Asai et al. | 361/764 |
| 2006/0054915 A1 | 3/2006 | Chang | 257/100 |
| 2006/0109632 A1 * | 5/2006 | Berlin et al. | 361/719 |
| 2006/0131735 A1 | 6/2006 | Ong et al. | 257/706 |
| 2006/0209632 A1 * | 9/2006 | Goodman et al. | 367/13 |
| 2007/0063213 A1 | 3/2007 | Hsieh et al. | 257/99 |
| 2007/0077416 A1 * | 4/2007 | Ito et al. | 428/339 |
| 2007/0252166 A1 | 11/2007 | Chang et al. | 257/98 |
| 2007/0267642 A1 | 11/2007 | Erchak et al. | 257/98 |
| 2007/0290322 A1 | 12/2007 | Zhao et al. | 257/690 |
| 2008/0019133 A1 | 1/2008 | Kim et al. | 362/294 |
| 2008/0099770 A1 | 5/2008 | Mendendorp et al. | 257/79 |
| 2008/0102631 A1 | 5/2008 | Andryushchenko et al. | 438/686 |
| 2008/0180824 A1 | 7/2008 | Endoh et al. | 359/894 |
| 2010/0149756 A1 | 6/2010 | Rowcliffe et al. | 361/714 |

* cited by examiner

US 8,034,645 B2

METHOD OF MAKING A SEMICONDUCTOR CHIP ASSEMBLY WITH A COPPER/ALUMINUM POST/BASE HEAT SPREADER

CROSS-REFERENCE TO RELATED APPLICATIONS

This application is a divisional of U.S. application Ser. No. 12/626,884 filed Nov. 28, 2009, which is a continuation-in-part of U.S. application Ser. No. 12/616,773 filed Nov. 11, 2009, which is incorporated by reference. U.S. application Ser. No. 12/626,884 filed Nov. 28, 2009 is also a continuation-in-part of U.S. application Ser. No. 12/616,775 filed Nov. 11, 2009, which is incorporated by reference. U.S. application Ser. No. 12/626,884 filed Nov. 28, 2009 also claims the benefit of U.S. Provisional Application Ser. No. 61/250,492 filed Oct. 9, 2009, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009 now U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

Conventional heat spreaders are typically copper since copper has high thermal conductivity, good bondability and low cost. Aluminum is significantly lighter and less expensive that copper. However, aluminum is difficult to plate, solder and wire bond to since it oxidizes rapidly. Furthermore, aluminum has a higher coefficient of thermal expansion and lower structural integrity than copper. As a result, aluminum heat spreaders have major drawbacks.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The semiconductor device is electrically connected to the conductive trace and thermally connected to the heat spreader. The heat spreader includes a post and a base that include a copper surface layer and an aluminum core. The post extends upwardly from the base into an opening in the adhesive, and the base extends laterally from the post. The adhesive extends between the post and the conductive trace and between the base and the conductive trace. The conductive trace provides signal routing between a pad and a terminal.

In accordance with an aspect of the present invention, a semiconductor chip assembly includes a semiconductor device, an adhesive, a heat spreader and a conductive trace. The adhesive includes an opening. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The post and the base include a copper surface layer and an aluminum core, wherein the copper surface layer conformally coats and extends above the aluminum core and the aluminum core of the post extends above the copper surface layer of the base. The conductive trace includes a pad and a terminal.

The semiconductor device is above and overlaps the post, is electrically connected to the pad and thereby electrically connected to the terminal, and is thermally connected to the post and thereby thermally connected to the base. The adhesive is mounted on and extends above the base, extends into a gap between the post and the pad, extends laterally from the post to or beyond the terminal and is sandwiched between the base and the pad. The pad is mounted on the adhesive and extends above the base. The post extends into the opening, and the base extends below the semiconductor device, the adhesive and the pad.

The conductive trace can include the pad, the terminal and a routing line, an electrically conductive path between the pad and the terminal can include the routing line and the pad, the terminal and the routing line can contact and overlap the adhesive.

In accordance with another aspect of the present invention, a semiconductor chip assembly includes a semiconductor device, an adhesive, a heat spreader, a substrate and a terminal. The adhesive includes an opening. The heat spreader includes a post and a base, wherein the post is adjacent to the base and extends above the base in an upward direction, and the base extends below the post in a downward direction opposite the upward direction and extends laterally from the post in lateral directions orthogonal to the upward and downward directions. The post and the base include a copper surface layer and an aluminum core, wherein the copper surface layer conformally coats and extends above the aluminum core and the aluminum core of the post extends above the copper surface layer of the base. The substrate includes a pad and a dielectric layer, and an aperture extends through the substrate.

The semiconductor device is above and overlaps the post, is electrically connected to the pad and thereby electrically connected to the terminal, and is thermally connected to the post and thereby thermally connected to the base. The adhesive is mounted on and extends above the base, extends into a gap in the aperture between the post and the substrate, extends across the dielectric layer in the gap, extends laterally from the post to or beyond the terminal and is sandwiched between the post and the dielectric layer and between the base and the substrate. The substrate is mounted on the adhesive and extends above the base. The post extends into the opening and the aperture, and the base extends below the semiconductor device, the adhesive and the substrate.

The heat spreader can include a cap that is above and adjacent to and covers in the upward direction and extends laterally in the lateral directions from a top of the post. For instance, the cap can have a rectangular or square shape and the top of the post can have a circular shape. In this instance, the cap can be sized and shaped to accommodate a thermal contact surface of the semiconductor device whereas the top of the post is not sized and shaped to accommodate the thermal contact surface of the semiconductor device. The cap can also contact and cover a portion of the adhesive that is coplanar with and adjacent to the post. The cap can also be coplanar with the pad and/or the terminal above the dielectric layer. The cap can also be copper and the copper surface layer can provide the top of the post. In addition, the post can thermally connect the base and the cap.

The heat spreader can consist of the post and the base or the post, the base and the cap. The heat spreader can also include a nickel buffer layer that contacts and is sandwiched between and separates the aluminum core and the copper surface layer. The heat spreader can also consist of copper/nickel/aluminum although an amorphous spotty random monolayer of zinc or palladium may reside between the aluminum core and the nickel buffer layer. The heat spreader can also be primarily aluminum. In any case, the heat spreader provides heat dissipation and spreading from the semiconductor device to the next level assembly.

The copper surface layer can conformally coat and extend above the aluminum core and covers the aluminum core in the upward direction, the aluminum core can extend below the copper surface layer and cover the copper surface layer in the downward direction, the aluminum core of the post can extend above the copper surface layer of the base, and the copper surface layer of the post can cover and surround the aluminum core of the post in the lateral directions. Furthermore, the post aluminum core height can be greater than the base aluminum core thickness and greater than five times the copper surface layer thickness, and the base aluminum core thickness can be greater than the copper surface layer thickness.

The semiconductor device can be mounted on the heat spreader. For instance, the semiconductor device can be mounted on the heat spreader and the substrate, overlap the post and the pad, be electrically connected to the pad using a first solder joint and be thermally connected to the heat spreader using a second solder joint. Alternatively, the semiconductor device can be mounted on the heat spreader but not the substrate, overlap the post but not the substrate, be electrically connected to the pad using a wire bond and be thermally connected to the heat spreader using a die attach.

The semiconductor device can be a packaged or unpackaged semiconductor chip. For instance, the semiconductor device can be an LED package that includes an LED chip, is mounted on the heat spreader and the substrate, overlaps the post and the pad, is electrically connected to the pad using a first solder joint and is thermally connected to the heat spreader using a second solder joint. Alternatively, the semiconductor device can be a semiconductor chip that is mounted on the heat spreader but not the substrate, overlaps the post but not the substrate, is electrically connected to the pad using a wire bond and is thermally connected to the heat spreader using a die attach.

The adhesive can contact the post and the dielectric layer in the gap and contact the base and the dielectric layer outside the gap. The adhesive can also contact the copper surface layer and be spaced from the aluminum core. The adhesive can also cover the substrate in the downward direction, cover and surround the post in the lateral directions and cover the base outside the post in the upward direction. The adhesive can also conformally coat the sidewalls of the post and a top surface of the base outside the post. The adhesive can also be coplanar with a top of the post. The adhesive can also fill the space between the post and the dielectric layer, fill the space between the base and the substrate and be contained in the space between the heat spreader and the substrate.

The adhesive can extend laterally from the post to or beyond the terminal. For instance, the adhesive and the terminal can extend to peripheral edges of the assembly. In this instance, the adhesive extends laterally from the post to the terminal. Alternatively, the adhesive can extend to peripheral edges of the assembly and the terminal can be spaced from the peripheral edges of the assembly. In this instance, the adhesive extends laterally from the post beyond the terminal.

The adhesive can overlap or be overlapped by the terminal. For instance, the terminal can extend above and overlap the dielectric layer and the adhesive and be coplanar with the pad and the cap. In this instance, the adhesive is overlapped by the terminal and the assembly provides horizontal signal routing between the pad and the terminal. Alternatively, the terminal can extend below and be overlapped by the dielectric layer and the adhesive and be coplanar with the base. In this instance, the adhesive overlaps the terminal and the assembly provides vertical signal routing between the pad and the terminal.

The post can be integral with the base. For instance, the post and the base can include single-piece aluminum, single-piece nickel and single-piece copper stack at their interface. The post can also extend through the aperture. The post can also be coplanar with the adhesive above the dielectric layer. The post can also have a cut-off conical shape in which its diameter decreases as it extends upwardly from the base to its flat top.

The base can cover the semiconductor device, the post, the cap, the adhesive and the substrate in the downward direction, support the substrate and extend to peripheral edges of the assembly.

The substrate can be spaced from the post and the base. The substrate can also be a laminated structure. The substrate can also include a single conductive layer or multiple conductive layers. For instance, the substrate can include a single conductive layer that contacts and extends above the dielectric layer. In this instance, the conductive layer includes the pad and the terminal. Thus, the substrate includes the terminal, the adhesive is overlapped by the terminal and the signal routing between the pad and the terminal occurs above but not through the dielectric layer. Alternatively, the substrate can include a first conductive layer that contacts and extends above the dielectric layer, a second conductive layer that contacts and extends below the dielectric layer, and a via that extends through the dielectric layer and electrically connects the conductive layers. In this instance, the first conductive layer includes the pad. Furthermore, (1) the first conductive layer includes the terminal and the substrate includes another via that extends through the dielectric layer and electrically connects the conductive layers, in which case the substrate includes the terminal, the adhesive is overlapped by the terminal and the signal routing between the pad and the terminal occurs through the dielectric layer but not the adhesive, or alternatively, (2) the terminal is below the adhesive and the substrate and the assembly includes another via that extends through the adhesive and electrically connects the terminal and the second conductive layer, in which case the substrate excludes the terminal, the adhesive overlaps the terminal and the signal routing between the pad and the terminal occurs through the dielectric layer and the adhesive. In any case, the substrate includes the pad and provides some or all of the signal routing between the pad and the terminal.

The pad can be an electrical contact for the semiconductor device, the terminal can be an electrical contact for the next level assembly, and the pad and the terminal can provide signal routing between the semiconductor device and the next level assembly.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a post and a base that include a copper surface layer and an aluminum core, mounting an adhesive on the base including inserting the post into an opening in the adhesive, mounting a conductive layer on the adhesive including aligning the post with an aperture in the conductive layer, then flowing the adhesive into and upward in a gap located in the aperture between the post and the conductive trace, solidifying the adhesive, then providing a conductive trace that includes a pad, a terminal and a selected portion of the conductive layer, mounting a semiconductor device on a heat spreader that includes the post and the base, electrically connecting the semiconductor device to the conductive trace and thermally connecting the semiconductor device to the heat spreader.

In accordance with an aspect of the present invention, a method of making a semiconductor chip assembly includes (1) providing a post, a base, an adhesive and a conductive layer, wherein (a) the post is adjacent to the base, extends above the base in an upward direction, extends into an opening in the adhesive and is aligned with an aperture in the conductive layer, (b) the base extends below the post in a downward direction opposite the upward direction and extends laterally from the post in lateral directions orthogonal to the upward and downward directions, (c) the post and the base include a copper surface layer and an aluminum core, the copper surface layer conformally coats and extends above the aluminum core, and the aluminum core of the post extends above the copper surface layer of the base, (d) the adhesive is mounted on and extends above the base, is sandwiched between the base and the conductive layer and is non-solidified, and (e) the conductive layer is mounted on and extends above the adhesive, then (2) flowing the adhesive into and upward in a gap located in the aperture between the post and the conductive layer, (3) solidifying the adhesive, then (4) providing a conductive trace that includes a pad, a terminal and a selected portion of the conductive layer, (5) mounting a semiconductor device on a heat spreader that includes the post and the base, wherein the semiconductor device overlaps the post, (6) electrically connecting the semiconductor device to the pad, thereby electrically connecting the semiconductor device to the terminal, and (7) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer and an aluminum core, the copper surface layer conformally coats and extends above the aluminum core, and the aluminum core of the post extends above the copper surface layer of the base, (2) providing an adhesive, wherein an opening extends through the adhesive, (3) providing a conductive layer, wherein an aperture extends through the conductive layer, (4) mounting the adhesive on the base, including inserting the post into the opening, wherein the adhesive extends above the base and the post extends through the opening, (5) mounting the conductive layer on the adhesive, including aligning the post with the aperture, wherein the conductive layer extends above the adhesive and the adhesive is sandwiched between the base and the conductive layer and is non-solidified, then (6) applying heat to melt the adhesive, (7) moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer, (8) applying heat to solidify the molten adhesive, thereby mechanically attaching the post and the base to the conductive layer, then (9) providing a conductive trace that includes a pad and a terminal, wherein the conductive trace includes selected portions of the conductive layer and an electrically conductive path is between the pad and the terminal, (10) mounting a semiconductor device on a heat spreader that includes the post and the base, wherein the semiconductor device overlaps the post, (11) electrically connecting the semiconductor device to the pad, thereby electrically connecting the semiconductor device to the terminal, and (12) thermally connecting the semiconductor device to the post, thereby thermally connecting the semiconductor device to the base.

Mounting the conductive layer can include mounting the conductive layer alone on the adhesive, or alternatively, attaching the conductive layer to a carrier, then mounting the conductive layer and the carrier on the adhesive such that the carrier overlaps the conductive layer and the conductive layer contacts the adhesive and is sandwiched between the adhesive and the carrier, and then, after solidifying the adhesive, removing the carrier and then providing the conductive trace.

In accordance with another aspect of the present invention, a method of making a semiconductor chip assembly includes (1) providing a post, a base, an adhesive and a substrate, wherein (a) the substrate includes a conductive layer and a dielectric layer, (b) the post is adjacent to the base, extends above the base in an upward direction, extends through an opening in the adhesive and extends into an aperture in the substrate, (c) the base extends below the post in a downward direction opposite the upward direction and extends laterally from the post in lateral directions orthogonal to the upward and downward directions, (d) the post and the base include an aluminum core and a copper surface layer, the aluminum core of the post extends above the copper surface layer of the base and the copper surface layer conformally coats and extends above the aluminum core, (e) the adhesive is mounted on and extends above the base, is sandwiched between the base and the substrate and is non-solidified, (f) the substrate is mounted on and extends above the adhesive and the conductive layer extends above the dielectric layer, and (g) a gap is located in the aperture between the post and the substrate, then (2) flowing the adhesive into and upward in the gap, (3) solidifying the adhesive, then (4) mounting a semiconductor device on a heat spreader that includes the post and the base, wherein the semiconductor device overlaps the post, a conductive trace includes a pad, a terminal and a selected portion of the conductive layer and the pad is electrically connected to the terminal, (5) electrically connecting the semiconductor device to the pad, thereby electrically connecting the semiconductor device to the terminal, and (6) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include an aluminum core and a copper surface layer, the aluminum core of the post extends above the copper surface layer of the base and the copper surface layer conformally coats and extends above the aluminum core, (2) providing an adhesive, wherein an opening extends through the adhesive, (3) providing a substrate that includes a conductive layer and a dielectric layer, wherein an aperture extends through the substrate, (4) mounting the adhesive on the base, including inserting the post through the opening, wherein the adhesive extends above the base and the post extends through the opening, (5) mounting the substrate on the adhesive, including inserting the post into the aperture, wherein the substrate extends above the adhesive, the conductive layer extends above the dielectric layer, the post extends through the opening into the aperture, the adhesive is sandwiched between the base and the substrate and is non-solidified, and a gap is located in the aperture between the post and the substrate, then (6) applying heat to melt the adhesive, (7) moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer, (8) applying heat to solidify the molten adhesive, thereby mechanically attaching the post and the base to the substrate, then (9) mounting a semiconductor device on a heat spreader that includes the post and the base, wherein the semiconductor device overlaps the post, a conductive trace includes a pad, a terminal and a selected portion of the conductive layer and the pad is electrically connected to the terminal, (10) electrically connecting the semiconductor device to the pad, thereby electrically connecting the semiconductor device to the terminal, and (11) thermally connecting the semiconductor device to the post, thereby thermally connecting the semiconductor device to the base.

Providing the post and the base can include providing an aluminum plate, forming an etch mask on the aluminum plate that selectively exposes the aluminum plate, etching the aluminum plate in a pattern defined by the etch mask, thereby forming a recess in the aluminum plate that extends into but not through the aluminum plate, and then removing the etch mask, wherein the aluminum core of the post is an unetched portion of the aluminum plate that is laterally surrounded by the recess, and the aluminum core of the base is an unetched portion of the aluminum plate below the recess.

Providing the post and the base can also include electrolessly plating a nickel buffer layer on the aluminum core, electrolessly plating a first copper layer on the nickel buffer layer, and electroplating a second copper layer on the first copper layer, wherein the copper surface layer includes the first and second copper layers.

Providing the adhesive can include providing a prepreg with uncured epoxy, flowing the adhesive can include melting the uncured epoxy and compressing the uncured epoxy between the base and the substrate, and solidifying the adhesive can include curing the molten uncured epoxy.

Providing the heat spreader can include grinding the post, the adhesive and the conductive layer such that the post, the adhesive and the conductive layer are laterally aligned with one another at a top lateral surface that includes the copper surface layer, excludes the nickel buffer layer and the aluminum core and faces in the upward direction. The grinding can include grinding the adhesive without grinding the post and then grinding the post, the adhesive and the conductive layer. The grinding can also remove about one-half the thickness of the copper surface layer at the top of the post, thereby leaving the copper surface layer at the top of the post intact. In any case, the grinding halts before it reaches the nickel buffer layer or the aluminum core.

Providing the heat spreader can also include providing a cap on the post that is above and adjacent to and covers in the upward direction and extends laterally in the lateral directions from a top of the post after solidifying the adhesive and before mounting the semiconductor device.

Providing the pad can include removing selected portions of the conductive layer after solidifying the adhesive.

Providing the pad can also include removing selected portions of the conductive layer after the grinding such that the pad includes selected portions of the conductive layer. The removing can include applying a wet chemical etch to the conductive layer using an etch mask that defines the pad.

Providing the pad can also include depositing a second conductive layer on the post, the adhesive and the conductive layer after the grinding and then removing selected portions of the conductive layers such that the pad includes selected portions of the conductive layers. Depositing the second conductive layer can include electrolessly plating a first plated layer on the post, the adhesive and the conductive layer and then electroplating a second plated layer on the first plated layer. The removing can include applying the wet chemical etch to the conductive layers using the etch mask to define the pad.

Providing the terminal can include removing selected portions of the conductive layer after solidifying the adhesive. Providing the terminal can also include the grinding and then removing selected portions of the conductive layer using the etch mask to define the terminal such that the terminal includes selected portions of the conductive layer. Providing the terminal can also include the grinding and then removing selected portions the conductive layers using the etch mask to define the terminal such that the terminal includes selected portions of the conductive layers. Thus, the pad and the terminal can be formed simultaneously using the same grinding, wet chemical etch and etch mask.

Providing the cap can include removing selected portions of the second conductive layer. Providing the cap can also include the grinding and then removing selected portions of the second conductive layer using the etch mask to define the cap such that the cap includes selected portions of the second conductive layer. Thus, the pad and the cap can be formed simultaneously using the same grinding, wet chemical etch and etch mask Likewise, the pad, the terminal and the cap can be formed simultaneously using the same grinding, wet chemical etch and etch mask.

Flowing the adhesive can include filling the gap with the adhesive. Flowing the adhesive can also include squeezing the adhesive through the gap, above the post and the substrate and on top surface portions of the post and the substrate adjacent to the gap.

Solidifying the adhesive can include mechanically bonding the post and the base to the substrate.

Mounting the semiconductor device can include mounting the semiconductor device on the post or the cap. Mounting the semiconductor device can also include positioning the semiconductor device above and overlapping the post, the opening and the aperture.

Mounting the semiconductor device can include providing a first solder joint between an LED package that includes an LED chip and the pad and a second solder joint between the LED package and the heat spreader, electrically connecting the semiconductor device can include providing the first solder joint between the LED package and the pad, and thermally connecting the semiconductor device can include providing the second solder joint between the LED package and the heat spreader.

Mounting the semiconductor device can include providing a die attach between a semiconductor chip and the heat spreader, electrically connecting the semiconductor device can include providing a wire bond between the chip and the pad, and thermally connecting the semiconductor device can include providing the die attach between the chip and the heat spreader.

The adhesive can contact the post, the base, the cap and the dielectric layer, contact the copper surface layer and be spaced from the nickel buffer layer and the aluminum core, cover the substrate in the downward direction, cover and surround the post in the lateral directions and extend to peripheral edges of the assembly after the assembly is manufactured and detached from other assemblies in a batch.

The base can cover the semiconductor device, the post, the cap, the adhesive and the substrate in the downward direction, support the substrate and extend to peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The post and the base can be integral with one another, thereby enhancing reliability. The post and the base can also be primarily aluminum with a copper surface layer, thereby maintaining bondability and reducing cost. The cap can be customized for the semiconductor device, thereby enhancing the thermal connection. The adhesive can be sandwiched between the post and the substrate and between the base and the substrate, thereby providing a robust mechanical bond between the heat spreader and the substrate. The substrate can provide single-layer signal routing with simple circuitry patterns or flexible multi-layer signal routing with complex circuitry patterns. The conductive trace can provide horizontal signal routing between the pad and the terminal above the dielectric layer or vertical signal routing between the pad above the dielectric layer and the terminal below the adhesive. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
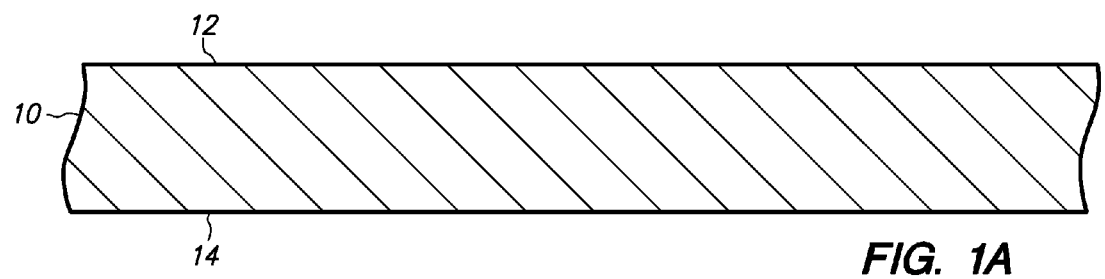
FIGS. 1A-1F are cross-sectional views showing a method of making a post and a base in accordance with an embodiment of the present invention.
Figure 1B:
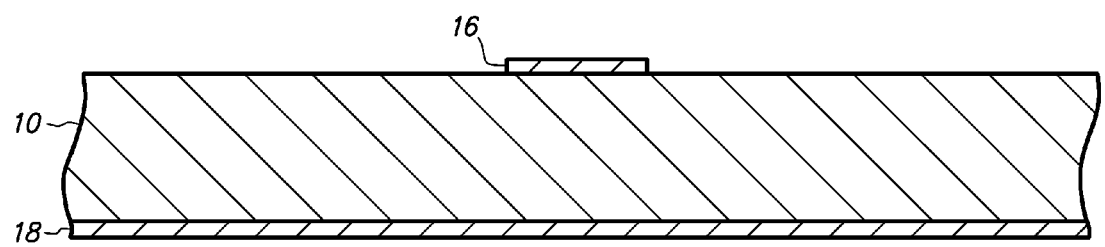
Figure 1C:
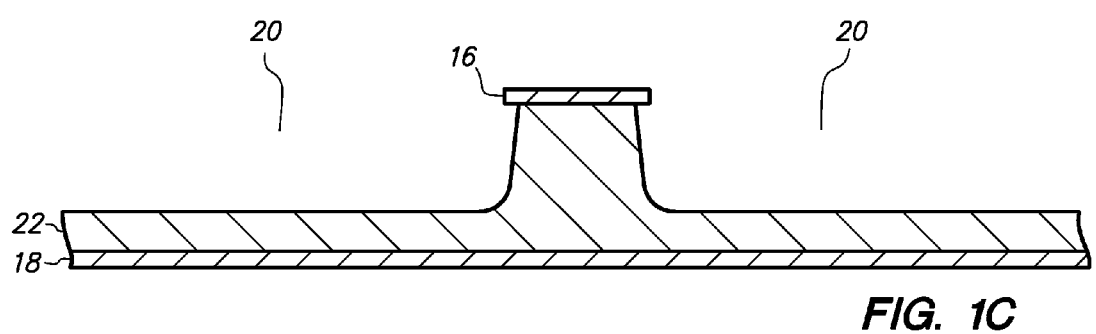
Figure 1D:
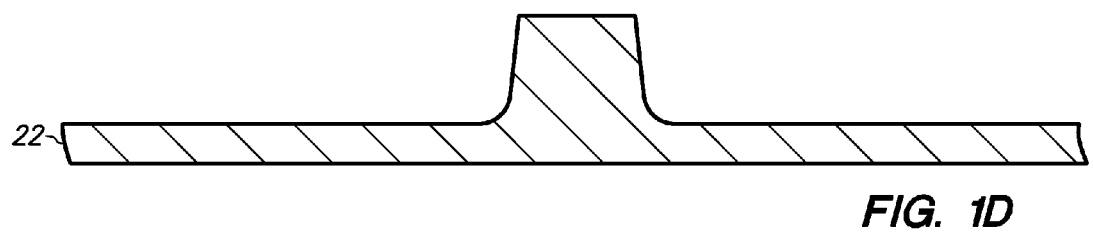
Figure 1E:
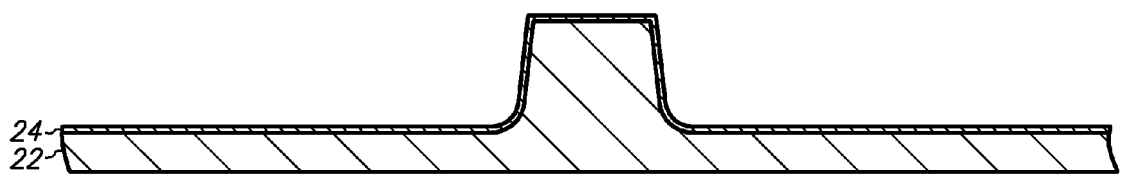
Figure 1F:
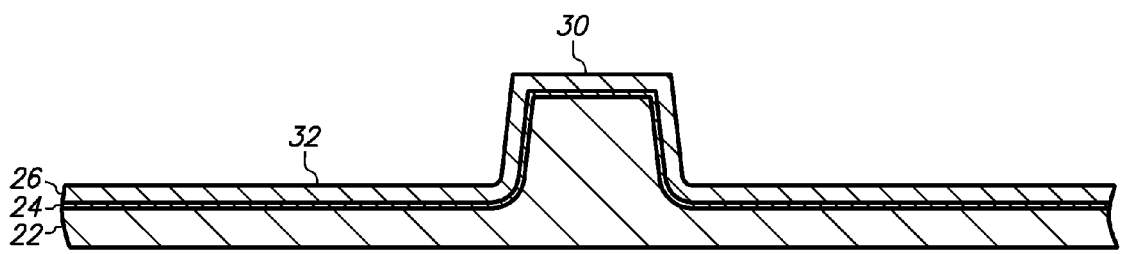
Figure 1G:
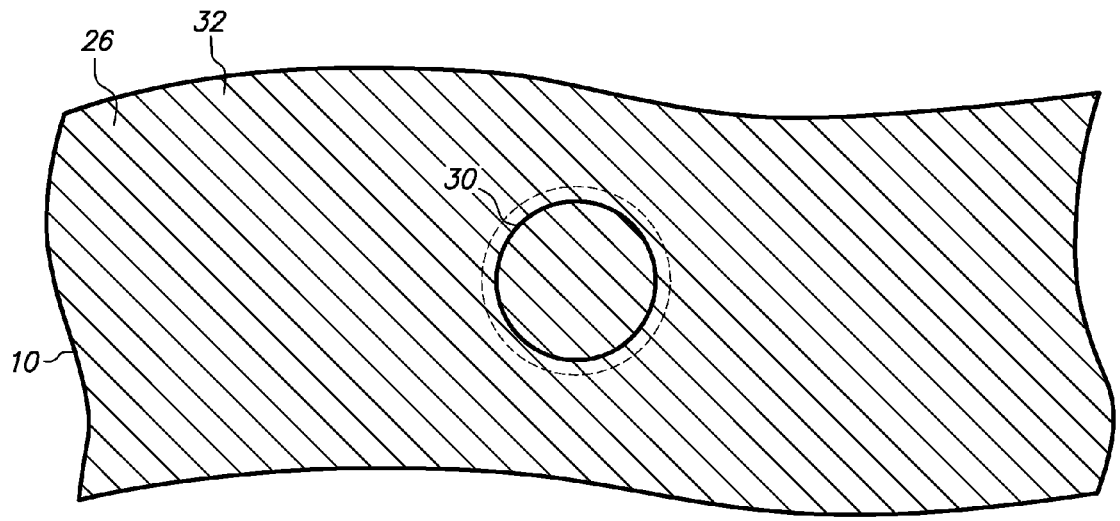
FIGS. 1G and 1H are top and bottom views, respectively, corresponding to FIG. 1F.
Figure 1H:
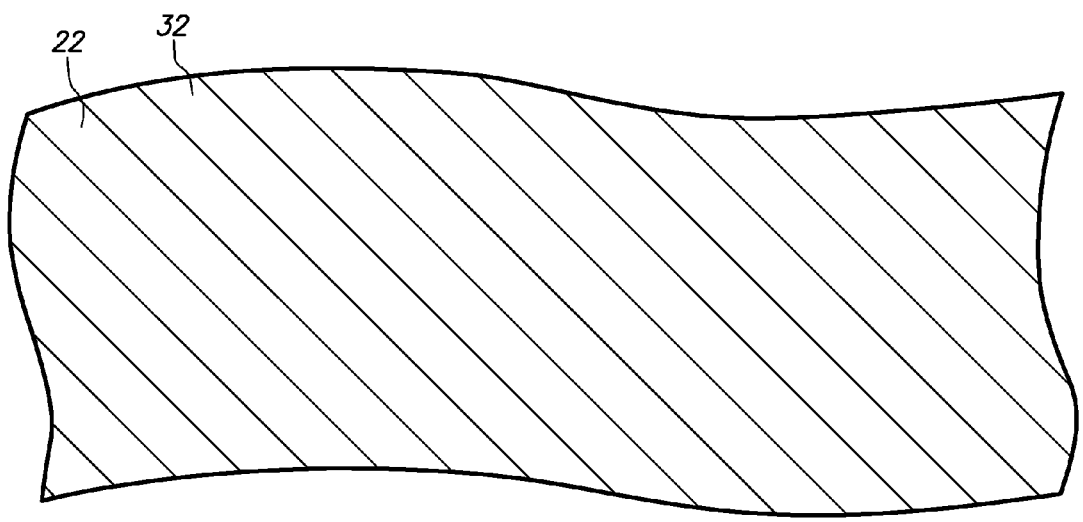

FIGS. 1A-1F are cross-sectional views showing a method of making a post and a base in accordance with an embodiment of the present invention, and FIGS. 1G and 1H are top and bottom views, respectively, corresponding to FIG. 1F.

FIG. 1A is a cross-sectional view of aluminum plate 10 which includes opposing major surfaces 12 and 14 and has a thickness of 500 microns.

FIG. 1B is a cross-sectional view of etch mask 16 and cover mask 18 formed on aluminum plate 10. Etch mask 16 and cover mask 18 are illustrated as photoresist layers which are deposited on aluminum plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through aluminum plate 10 by etching aluminum plate 10 in the pattern defined by etch mask 16. The etching is illustrated as a front-side wet chemical etch. For instance, the structure can be inverted so that etch mask 16 faces downward and cover mask 18 faces upward as a bottom spray nozzle (not shown) that faces etch mask 16 upwardly sprays the wet chemical etch on aluminum plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides back-side protection. The wet chemical etch is highly selective of aluminum and etches 300 microns into aluminum plate 10. As a result, recess 20 extends from surface 12 into but not through aluminum plate 10, is spaced from surface 14 by 200 microns and has a depth of 300 microns. The wet chemical etch also laterally undercuts aluminum plate 10 beneath etch mask 16. A suitable wet chemical etch can be provided by an acidic solution containing ferric chloride or a mixture of nitric acid and phosphoric acid. Likewise, the wet chemical etch can be alkaline. The optimal etch time for forming recess 20 without excessively exposing aluminum plate 10 to the wet chemical etch can be established through trial and error.

FIG. 1D is a cross-sectional view of aluminum plate 10 after etch mask 16 and cover mask 18 are removed. The photoresist layers are stripped using a solvent, such as a strong alkaline solution containing potassium hydroxide with a pH of 14, that is highly selective of photoresist with respect to aluminum. Aluminum plate 10 as etched provides aluminum core 22.

FIG. 1E is a cross-sectional view of the structure with nickel buffer layer 24 deposited on aluminum core 22. Nickel buffer layer 24 contacts and conformally coats aluminum core 22 and covers aluminum core 22 in the upwards direction. For instance, the aluminum core 22 is dipped in a zinc activator solution to render aluminum core 22 catalytic to electroless nickel, and then nickel buffer layer 24 is electrolessly plated on zincated aluminum core 22. Nickel buffer layer 24 has a thickness of 3 microns.

FIGS. 1F, 1G and 1H are cross-sectional, top and bottom views, respectively, of copper surface layer 26 formed on the structure.

Copper surface layer 26 contacts nickel buffer layer 24, is separated from aluminum core 22 by nickel buffer layer 24 and covers aluminum core 22 and nickel buffer layer 24 in the upwards direction. Copper surface layer 26 conformally coats and extends above aluminum core 22 and nickel buffer layer 24, nickel buffer layer 24 contacts and is sandwiched between aluminum core 22 and copper surface layer 26, and aluminum core 22 extends below nickel buffer layer 24 and copper surface layer 26 and covers nickel buffer layer 24 and copper surface layer 26 in the downward direction.

For instance, a first copper layer is electrolessly plated on nickel buffer layer 24, and then a second copper layer is electroplated on the first copper layer. The first copper layer has a thickness of 2 microns, the second copper layer has a thickness of 25 microns, and copper surface layer 26 has a thickness of 27 microns.

Aluminum core 22, nickel buffer layer 24 and copper surface layer 26 provide post 30 and base 32. Likewise, post 30 and base 32 include aluminum core 22, nickel buffer layer 24 and copper surface layer 26.

Post 30 is an unetched portion of aluminum plate 10 defined by etch mask 16 and surrounded by recess 20 that is subsequently coated with nickel buffer layer 24 and copper surface layer 26. Post 30 is adjacent to and integral with and protrudes above base 32. Post 30 has a height of 300 microns (recess 20 depth), a diameter at its top surface (circular portion of surface 12) of 1000 microns and a diameter at its bottom (circular portion adjacent to base 32) of 1100 microns. Thus, post 30 has a cut-off conical shape (resembling a frustum) with tapered sidewalls in which its diameter decreases as it extends upwardly from base 32 to its flat circular top surface. The tapered sidewalls arise from the lateral undercutting by the wet chemical etch beneath etch mask 16. The top surface is concentrically disposed within a periphery of the bottom (shown in phantom in FIG. 1G).

Base 32 is an unetched portion of aluminum plate 10 below recess 20 that is subsequently coated with nickel buffer layer 24 and copper surface layer 26. Base 32 extends laterally from post 30 in a lateral plane (with lateral directions such as left and right) and has a thickness of 230 microns (500−300+3+27).

The aluminum core of post 30 has a height of 300 microns above the aluminum core of base 30 and extends 270 microns (300−30) above the copper surface layer of the base 32, the aluminum core of base 32 has a thickness of 200 microns, and copper surface layer 26 has a thickness of 27 microns. Therefore, the aluminum core of post 30 has a height above the aluminum core of base 32 (300 microns) that is greater than thickness the aluminum core of base 32 (200 microns) and is greater than five times the thickness of copper surface layer 26 (27 microns).

Post 30 and base 32 can be treated to improve bondability to epoxy and solder. For instance, post 30 and base 32 can be chemically oxidized or microetched to provide rougher surfaces.

Post 30 and base 32 are illustrated as semi-additively formed by depositing nickel buffer layer 24 and copper surface layer 26 on subtractively formed aluminum core 22. Post 30 and base 32 can also be formed by stamping aluminum plate 10 with a contact piece with a recess or hole that defines post 30 and then depositing nickel buffer layer 24 and copper surface layer 26 on aluminum core 22. Furthermore, nickel buffer layer 24 and copper surface layer 26 can be deposited on aluminum core 22 using electroplating, chemical vapor deposition (CVD), physical vapor deposition (PVD) and so on.

Figure 2A:
FIGS. 2A and 2B are cross-sectional views showing a method of making an adhesive in accordance with an embodiment of the present invention.
Figure 2B:
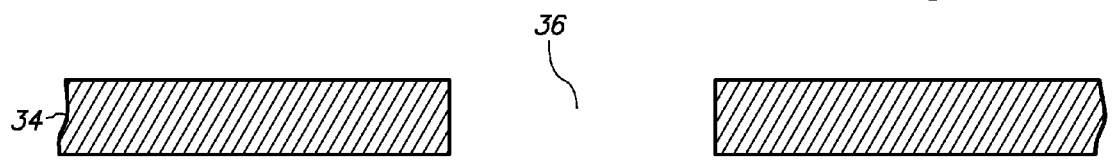
Figure 2C:
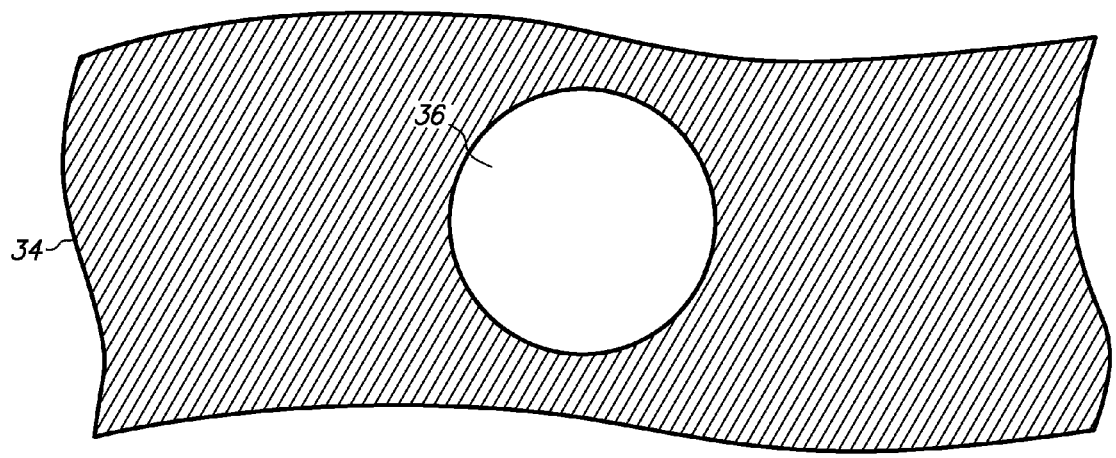
FIGS. 2C and 2D are top and bottom views, respectively, corresponding to FIG. 2B.
Figure 2D:
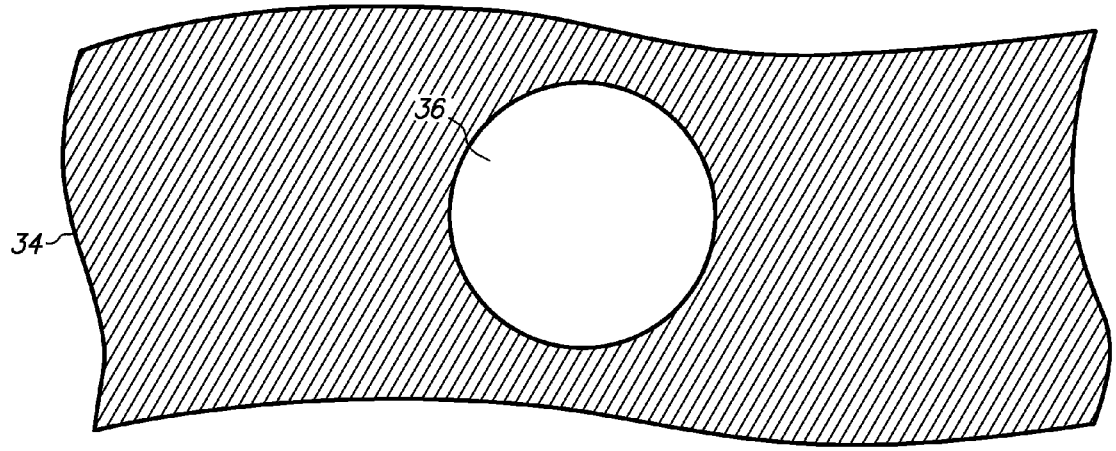

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 34. Adhesive 34 is illustrated as a prepreg with B-stage uncured epoxy provided as a non-solidified unpatterned sheet with a thickness of 180 microns.

Adhesive 34 can be various dielectric films or prepregs formed from numerous organic or inorganic electrical insulators. For instance, adhesive 34 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wisconsin are suitable.

FIGS. 2B, 2C and 2D are cross-sectional, top and bottom views, respectively, of adhesive 34 with opening 36. Opening 36 is a central window that extends through adhesive 34. Opening 36 is formed by mechanical drilling through the prepreg and has a diameter of 1150 microns. Opening 36 can be formed by other techniques such as punching and stamping.

Figure 3A:
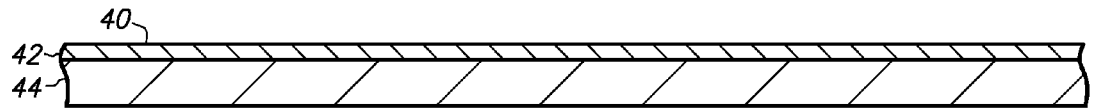
FIGS. 3A and 3B are cross-sectional views showing a method of making a substrate in accordance with an embodiment of the present invention.
Figure 3B:
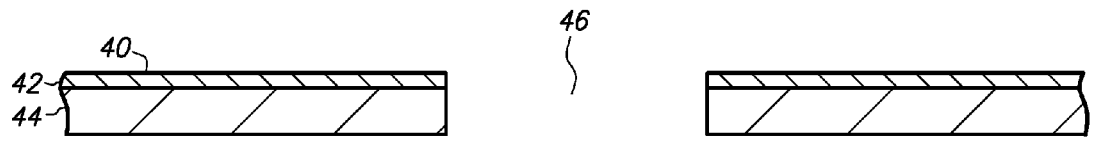
Figure 3C:
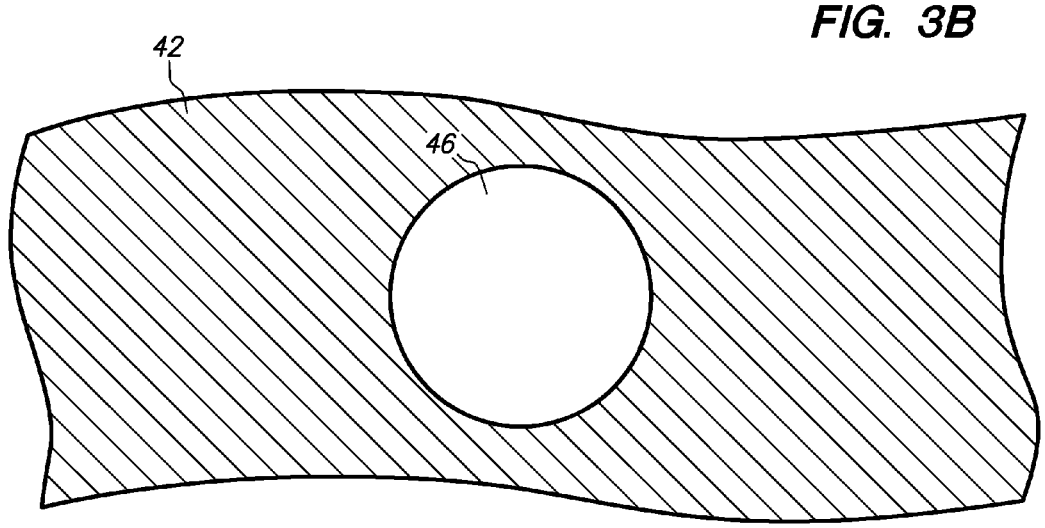
FIGS. 3C and 3D are top and bottom views, respectively, corresponding to FIG. 3B.
Figure 3D:
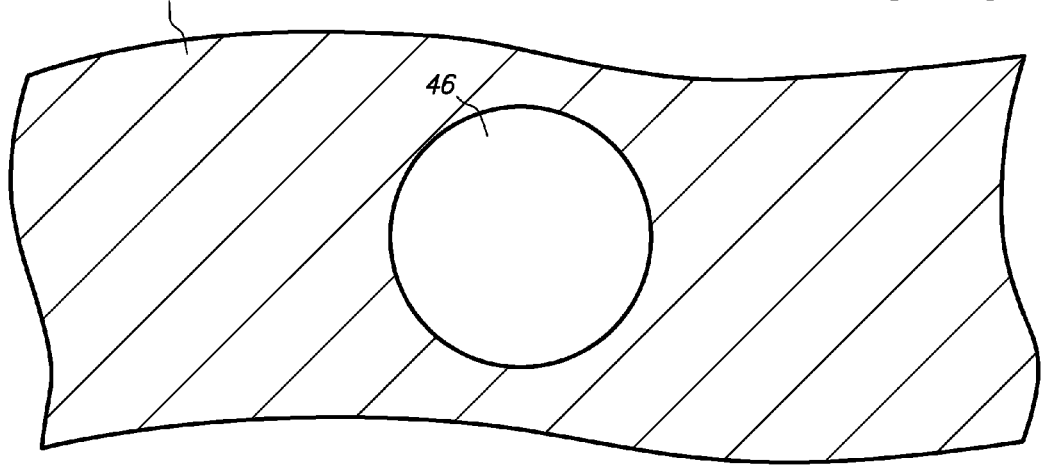

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 40 that includes conductive layer 42 and dielectric layer 44. Conductive layer 42 is an electrical conductor that contacts and extends above dielectric layer 44, and dielectric layer 44 is an electrical insulator. For instance, conductive layer 42 is an unpatterned copper sheet with a thickness of 30 microns, and dielectric layer 44 is epoxy with a thickness of 150 microns.

FIGS. 3B, 3C and 3D are cross-sectional, top and bottom views, respectively, of substrate 40 with aperture 46. Aperture 46 is a central window that extends through substrate 40. Aperture 46 is formed by mechanical drilling through conductive layer 42 and dielectric layer 44 and has a diameter of 1150 microns. Aperture 46 can be formed with other techniques such as punching and stamping. Preferably, opening 36 and aperture 46 have the same diameter and are formed in the same manner with the same drill bit at the same drilling station.

Substrate 40 is illustrated as a laminated structure. Substrate 40 can be other electrical interconnects such as a ceramic board or a printed circuit board. Likewise, substrate 40 can include additional layers of embedded circuitry.

Figure 4A:
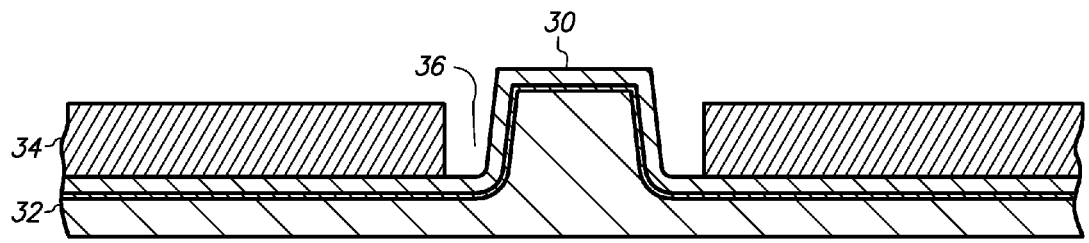
FIGS. 4A-4L are cross-sectional views showing a method of making a thermal board with horizontal signal routing in accordance with an embodiment of the present invention.
Figure 4B:
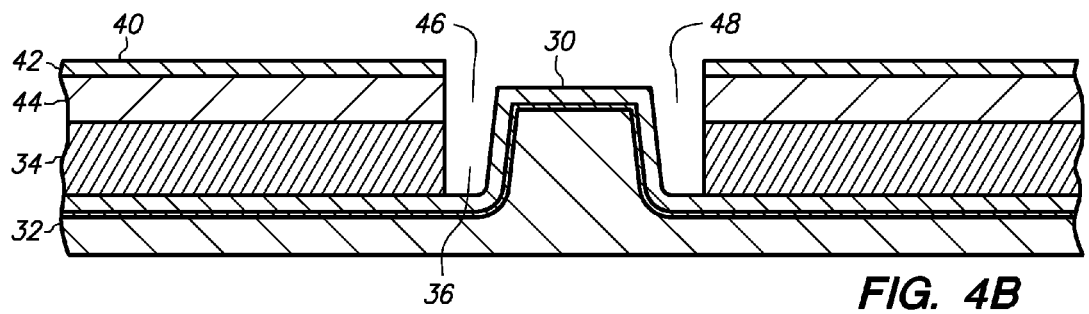
Figure 4C:
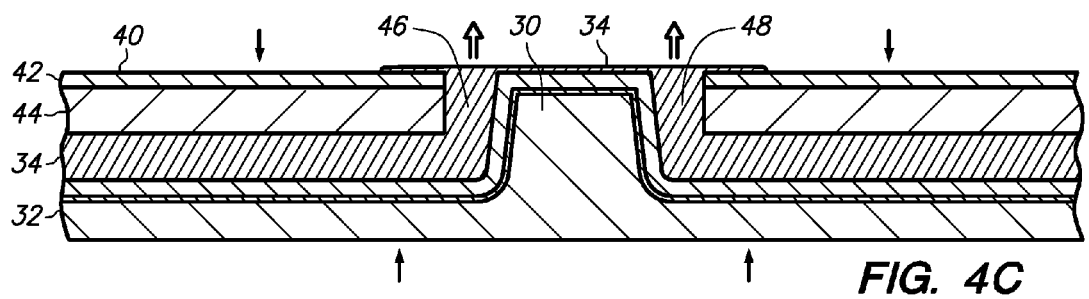
Figure 4D:
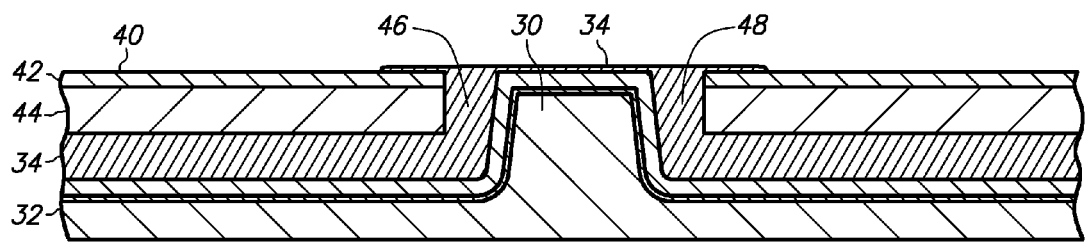
Figure 4E:
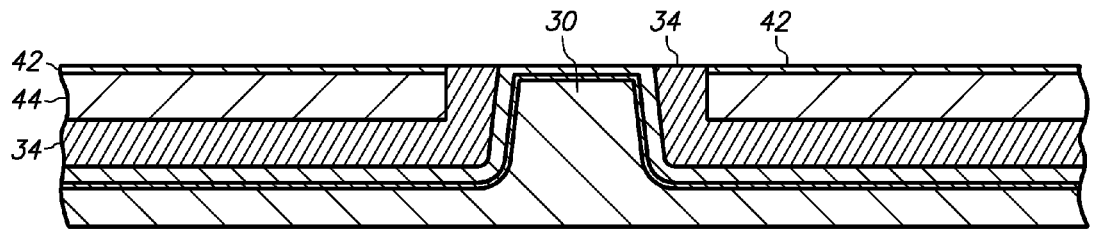
Figure 4F:
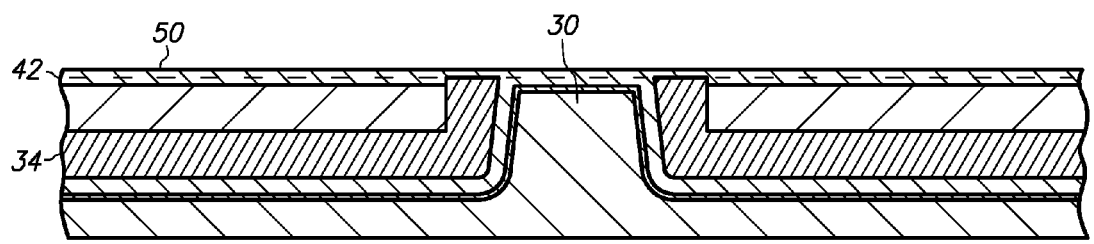
Figure 4G:
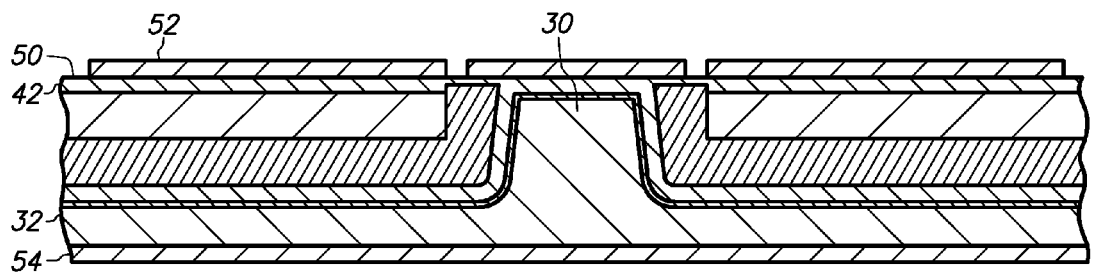
Figure 4H:
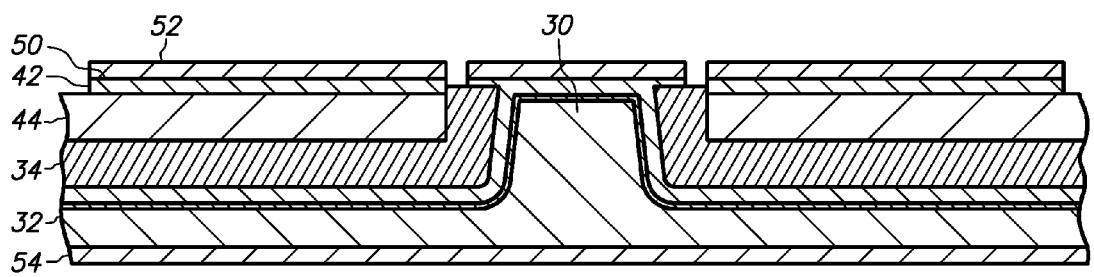
Figure 4I:
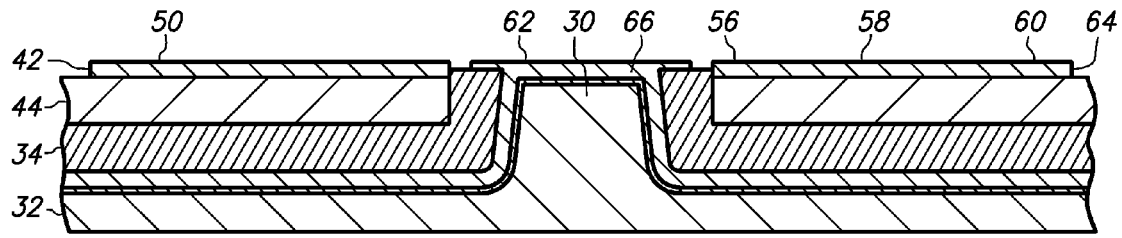
Figure 4J:
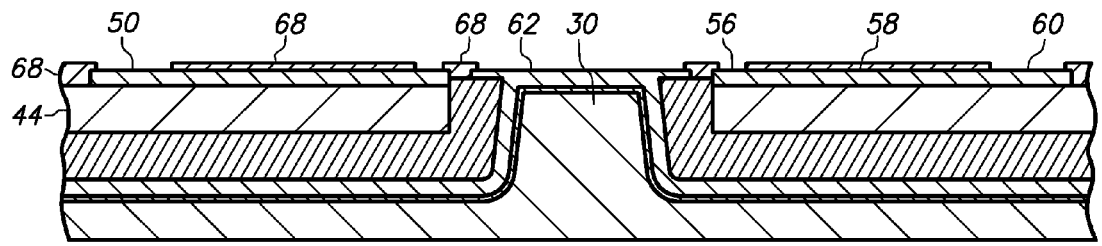
Figure 4K:
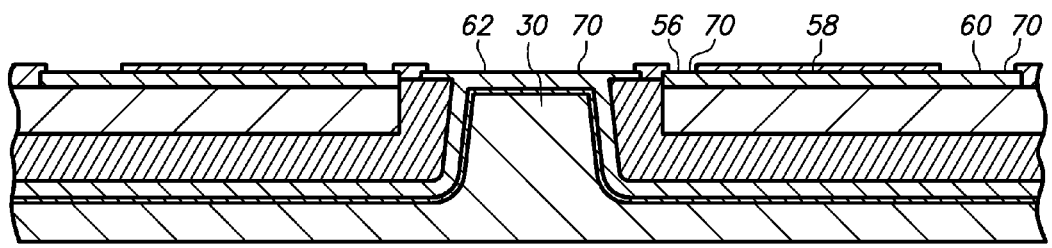
Figure 4L:
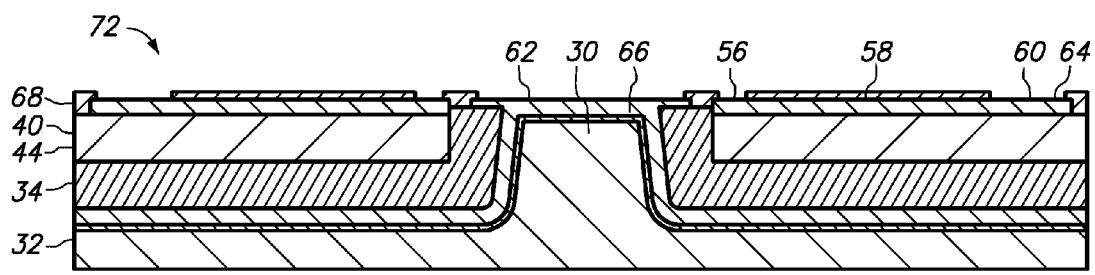
Figure 4M:
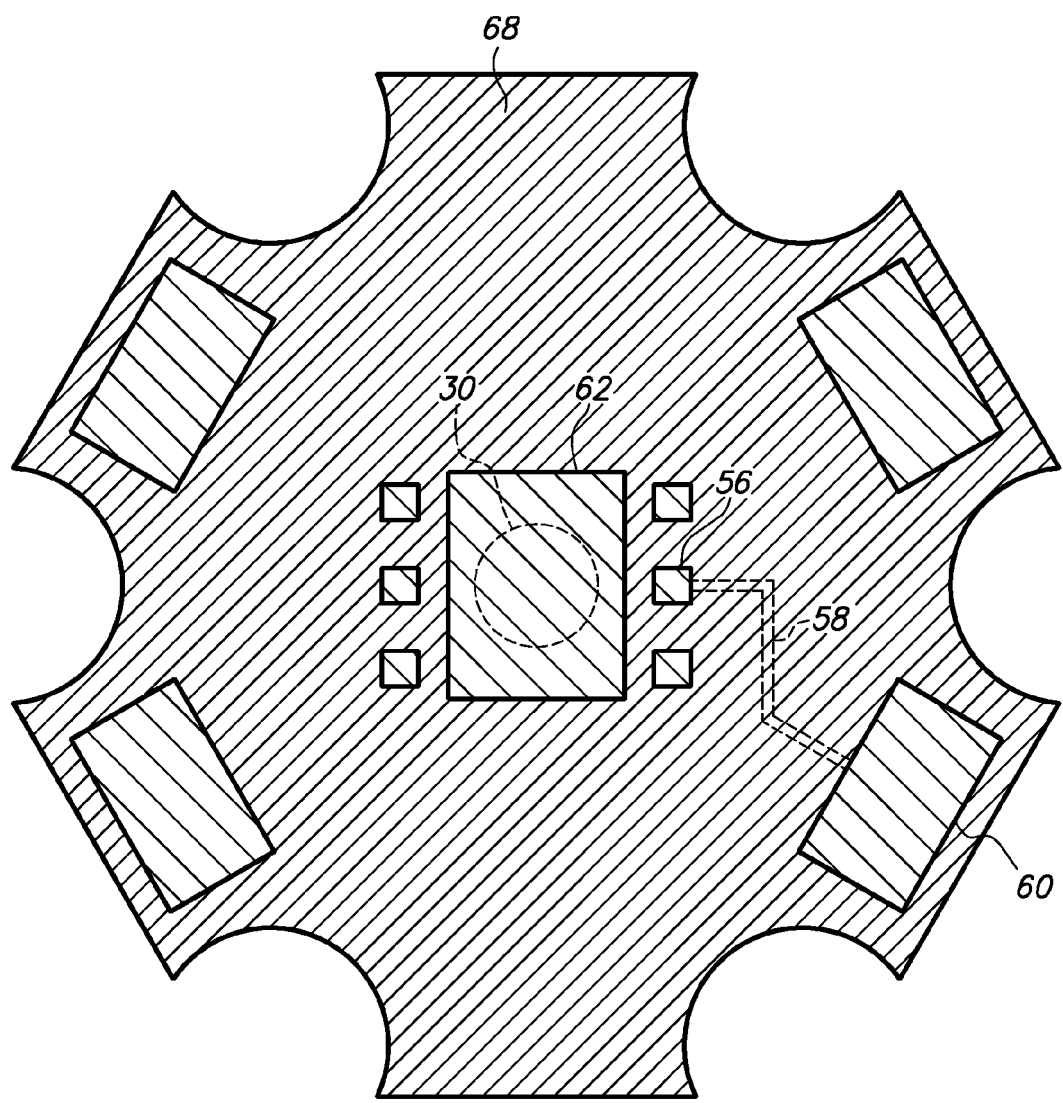
FIGS. 4M and 4N are top and bottom views, respectively, corresponding to FIG. 4L.
Figure 4N:
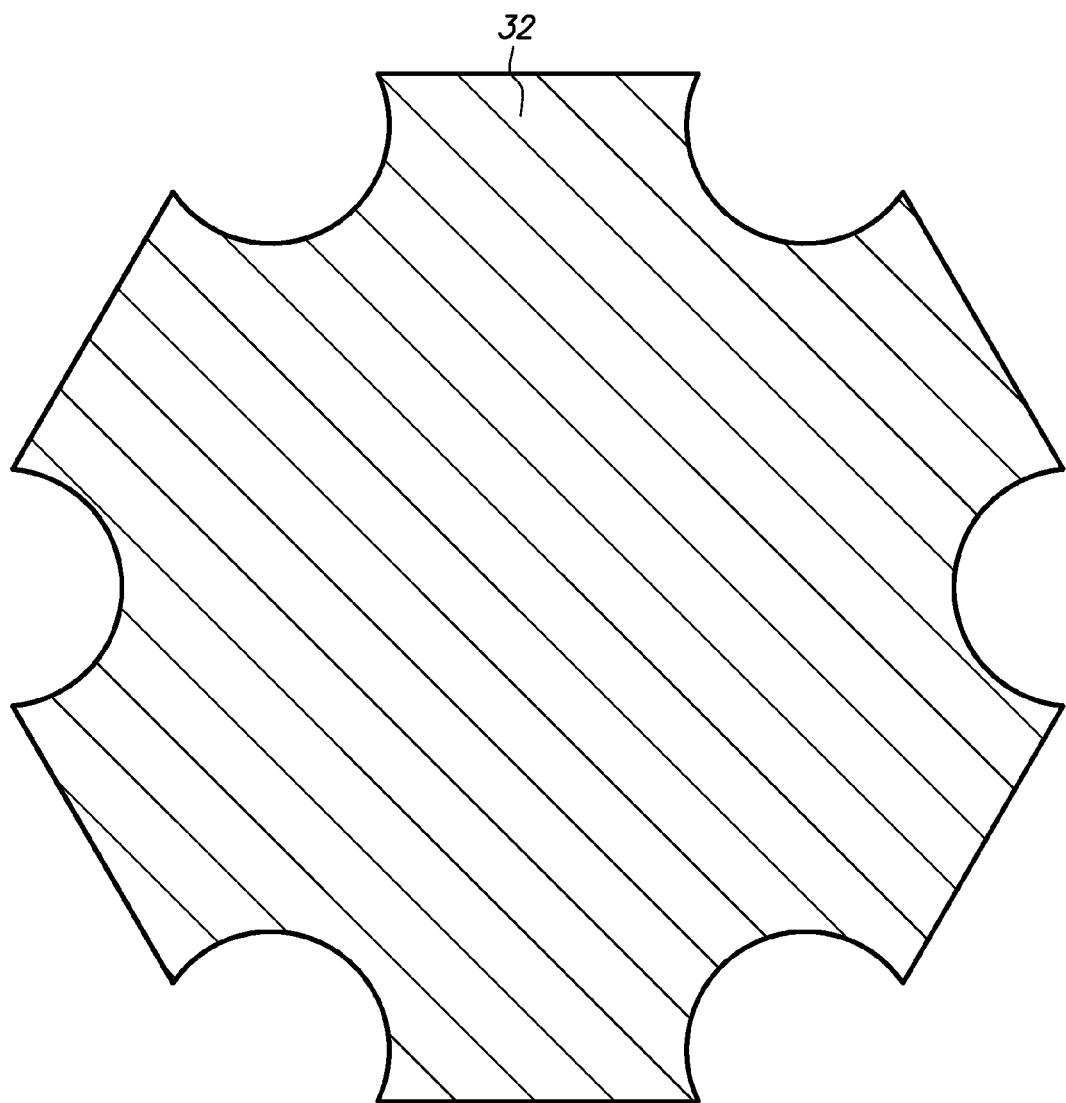

FIGS. 4A-4L are cross-sectional views showing a method of making a thermal board with horizontal signal routing that includes post 30, base 32, adhesive 34 and substrate 40 in accordance with an embodiment of the present invention, and FIGS. 4M and 4N are top and bottom views, respectively, corresponding to FIG. 4L.

FIG. 4A is a cross-sectional view of the structure with adhesive 34 mounted on base 32. Adhesive 34 is mounted by lowering it onto base 32 as post 30 is inserted into and through and upwards in opening 36. Adhesive 34 eventually contacts and rests on base 32. Preferably, post 30 is inserted into and extends through opening 36 without contacting adhesive 34 and is aligned with and centrally located within opening 36.

FIG. 4B is a cross-sectional view of the structure with substrate 40 mounted on adhesive 34. Substrate 40 is mounted by lowering it onto adhesive 34 as post 30 is inserted into and upwards in aperture 46. Substrate 40 eventually contacts and rests on adhesive 34. Preferably, post 30 is inserted into but not through aperture 46 without contacting substrate 40 and is aligned with and centrally located within aperture 46. As a result, gap 48 is located in aperture 46 between post 30 and substrate 40. Gap 48 laterally surrounds post 30 and is laterally surrounded by substrate 40. In addition, opening 36 and aperture 46 are precisely aligned with one another and have the same diameter.

At this stage, substrate 40 is mounted on and contacts and extends above adhesive 34. Post 30 extends through opening 36 into aperture 46 to dielectric layer 44, is 60 microns below the top surface of conductive layer 42 and is exposed through aperture 46 in the upward direction. Adhesive 34 contacts and is sandwiched between base 32 and substrate 40, contacts dielectric layer 44 but is spaced from conductive layer 42 and remains a non-solidified prepreg with B-stage uncured epoxy, and gap 48 is filled with air.

FIG. 4C is a cross-sectional view of the structure with adhesive 34 in gap 48. Adhesive 34 is flowed into gap 48 by applying heat and pressure. In this illustration, adhesive 34 is forced into gap 48 by applying downward pressure to conductive layer 42 and/or upward pressure to base 32, thereby moving base 32 and substrate 40 towards one another and applying pressure to adhesive 34 while simultaneously applying heat to adhesive 34. Adhesive 34 becomes compliant enough under the heat and pressure to conform to virtually any shape. As a result, adhesive 34 sandwiched between base 32 and substrate 40 is compressed, forced out of its original shape and flows into and upward in gap 48. Base 32 and substrate 40 continue to move towards one another and adhesive 34 eventually fills gap 48. Moreover, adhesive 34 remains sandwiched between and continues to fill the reduced space between base 32 and substrate 40.

For instance, base 32 and conductive layer 42 can be disposed between top and bottom platens (not shown) of a press. In addition, a top cull plate and top buffer paper (not shown) can be sandwiched between conductive layer 42 and the top platen, and a bottom cull plate and bottom buffer paper (not shown) can be sandwiched between base 32 and the bottom platen. The stack includes the top platen, top cull plate, top buffer paper, substrate 40, adhesive 34, base 32, bottom buffer paper, bottom cull plate and bottom platen in descending order. Furthermore, the stack may be positioned on the bottom platen by tooling pins (not shown) that extend upward from the bottom platen through registration holes (not shown) in base 32.

The platens are heated and move towards one another, thereby applying heat and pressure to adhesive 34. The cull plates disperse the heat from the platens so that it is more uniformly applied to base 32 and substrate 40 and thus adhesive 34, and the buffer papers disperse the pressure from the platens so that it is more uniformly applied to base 32 and substrate 40 and thus adhesive 34. Initially, dielectric layer 44 contacts and presses down on adhesive 34. As the platen motion and heat continue, adhesive 34 between base 32 and substrate 40 is compressed, melted and flows into and upward in gap 48 and across dielectric layer 44 to conductive layer 42. For instance, the uncured epoxy is melted by the heat and the molten uncured epoxy is squeezed by the pressure into gap 48, however the reinforcement and the filler remain between base 32 and substrate 40. Adhesive 34 elevates more rapidly than post 30 in aperture 46 and fills gap 48. Adhesive 34 also rises slightly above gap 48 and overflows onto the top surfaces of post 30 and conductive layer 42 adjacent to gap 48 before the platen motion stops. This may occur due to the prepreg being slightly thicker than necessary. As a result, adhesive 34 creates a thin coating on the top surface of post 30. The platen motion is eventually blocked by post 30 and the platens become stationary but continue to apply heat to adhesive 34.

The upward flow of adhesive 34 in gap 48 is shown by the thick upward arrows, the upward motion of post 30 and base 32 relative to substrate 40 is shown by the thin upward arrows, and the downward motion of substrate 40 relative to post 30 and base 32 is shown by the thin downward arrows.

FIG. 4D is a cross-sectional view of the structure with adhesive 34 solidified.

For instance, the platens continue to clamp post 30 and base 32 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 34 as solidified provides a secure robust mechanical bond between post 30 and substrate 40 as well as between base 32 and substrate 40. Adhesive 34 can withstand normal operating pressure without distortion or damage and is only temporarily distorted under unusually high pressure. Furthermore, adhesive 34 can absorb thermal expansion mismatch between post 30 and substrate 40 and between base 32 and substrate 40.

At this stage, post 30 and conductive layer 42 are essentially coplanar with one another and adhesive 34 and conductive layer 42 extend to a top surface that faces in the upward direction. For instance, adhesive 34 between base 32 and dielectric layer 44 has a thickness of 120 microns which is 60 microns less than its initial thickness of 180 microns, post 30 ascends 60 microns in aperture 46 and substrate 40 descends 60 microns relative to post 30. The 300 micron height of post 30 is essentially the same as the combined height of conductive layer 42 (30 microns), dielectric layer 44 (150 microns) and the underlying adhesive 34 (120 microns). Furthermore, post 30 continues to be centrally located in opening 36 and aperture 46 and spaced from substrate 40, and adhesive 34 fills the space between base 32 and substrate 40 and fills gap 48. For instance, gap 48 (as well as adhesive 34 between post 30 and substrate 40) has a width of 75 microns ((1150−1000)/2) at the top surface of post 30. Adhesive 34 extends across dielectric layer 44 in gap 48. That is, adhesive 34 in gap 48 extends in the upward and downward directions across the thickness of dielectric layer 44 at the outer sidewall of gap 48. Adhesive 34 also includes a thin top portion above gap 48 that contacts the top surfaces of post 30 and conductive layer 42 and extends above post 30 by 10 microns.

FIG. 4E is a cross-sectional view of the structure after upper portions of post 30, adhesive 34 and conductive layer 42 are removed.

Post 30, adhesive 34 and conductive layer 42 have their upper portions removed by grinding. For instance, a rotating diamond sand wheel and distilled water are applied to the top of the structure. Initially, the diamond sand wheel grinds only adhesive 34. As the grinding continues, adhesive 34 becomes thinner as its grinded surface migrates downwardly. Eventually the diamond sand wheel contacts post 30 and conductive layer 42 (not necessarily at the same time), and as a result, begins to grind post 30 and conductive layer 42 as well. As the grinding continues, post 30, adhesive 34 and conductive layer 42 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 34, a 15 micron thick upper portion of post 30 and a 15 micron thick upper portion of conductive layer 42. The decreased thickness does not appreciably affect adhesive 34. However, it substantially reduces the thickness of conductive layer 42 from 30 microns to 15 microns. It also substantially reduces the thickness of copper surface layer 26 at the top of post 30 from 27 microns to 12 microns. However, the grinding does not reach aluminum core 22 or nickel buffer layer 24.

At this stage, post 30, adhesive 34 and conductive layer 42 are coplanar with one another at a smoothed lapped lateral top surface that includes copper surface layer 26 at the top of post 30, is above and excludes aluminum core 22, nickel buffer layer 24 and dielectric layer 44 and faces in the upward direction.

FIG. 4F is a cross-sectional view of the structure with conductive layer 50 deposited on post 30, adhesive 34 and conductive layer 42.

Conductive layer 50 contacts post 30, adhesive 34 and conductive layer 42 and covers them in the upward direction. For instance, the structure is dipped in an activator solution to render adhesive 34 catalytic to electroless copper, then a first copper layer is electrolessly plated on post 30, adhesive 34 and conductive layer 42, and then a second copper layer is electroplated on the first copper layer. The first copper layer has a thickness of 2 microns, the second copper layer has a thickness of 13 microns, and conductive layer 50 has a thickness of 15 microns. As a result, copper surface layer 26 at the top of post 30 essentially grows and has a thickness of 27 microns (12+15), and conductive layer 42 essentially grows and has a thickness of 30 microns (15+15). Thus, conductive layer 50 serves as a cover layer for post 30 and a build-up layer for post 30 and conductive layer 42. Post 30 and conductive layer 50, and conductive layers 42 and 50 are shown as a single layer for convenience of illustration. The boundary (shown in phantom) between post 30 and conductive layer 50 and between conductive layers 42 and 50 may be difficult or impossible to detect since copper is plated on copper. However, the boundary between adhesive 34 and conductive layer 50 is clear.

FIG. 4G is a cross-sectional view of the structure with etch mask 52 and cover mask 54 formed on the top and bottom surfaces, respectively, of the structure. Etch mask 52 and cover mask 54 are illustrated as photoresist layers similar to photoresist layers 16 and 18, respectively. Photoresist layer 52 has a pattern that selectively exposes conductive layer 50, and photoresist layer 54 remains unpatterned and covers base 32.

FIG. 4H is a cross-sectional view of the structure with selected portions of conductive layers 42 and 50 removed by etching conductive layers 42 and 50 in the pattern defined by etch mask 52. The wet chemical etch etches through conductive layers 42 and 50 to expose adhesive 34 and dielectric layer 44 and converts conductive layers 42 and 50 from unpatterned into patterned layers, and base 32 remains unpatterned.

For instance, the structure can be inverted so that etch mask 52 faces downward and cover mask 54 faces upward as a bottom spray nozzle (not shown) that faces etch mask 52 upwardly sprays the wet chemical etch on conductive layers 42 and 50 and etch mask 52 while a top spray nozzle (not shown) that faces cover mask 54 is deactivated so that gravity assists with removing the etched byproducts. Alternatively, the structure can be dipped in the wet chemical etch since cover mask 54 provides back-side protection. The wet chemical etch is highly selective of copper and etches through conductive layers 42 and 50 to adhesive 34 and dielectric layer 44. A suitable wet chemical etch can be provided by a solution containing alkaline ammonia or a dilute mixture of nitric and hydrochloric acid. Likewise, the wet chemical etch can be acidic or alkaline. The optimal etch time for patterning conductive layers 42 and 50 without excessively exposing them to the wet chemical etch can be established through trial and error.

FIG. 4I is a cross-sectional view of the structure after etch mask 52 and cover mask 54 are removed. Photoresist layers 52 and 54 can be stripped in the same manner as photoresist layers 16 and 18.

Conductive layers 42 and 50 as etched include pad 56, routing line 58 and terminal 60, and conductive layer 50 as etched includes cap 62. Pad 56, routing line 58 and terminal 60 are unetched portions of conductive layers 42 and 50 defined by etch mask 52, and cap 62 is an unetched portion of conductive layer 50 defined by etch mask 52. Thus, conductive layers 42 and 50 are a patterned layer that includes pad 56, routing line 58 and terminal 60 and excludes cap 62. Furthermore, routing line 58 is a copper trace that contacts and extends above dielectric layer 44 and is adjacent to and electrically connects pad 56 and terminal 60.

Conductive trace 64 is provided by pad 56, routing line 58 and terminal 60. Similarly, an electrically conductive path between pad 56 and terminal 60 is routing line 58. Conductive trace 64 provides horizontal (lateral) fan-out routing from pad 56 to terminal 60. Conductive trace 64 is not be limited to this configuration. For instance, the electrically conductive path can include vias that extend through dielectric layer 44 and additional routing lines (above and/or below dielectric layer 44) as well as passive components such as resistors and capacitors mounted on additional pads.

Heat spreader 66 includes post 30, base 32 and cap 62. Post 30 and base 32 are integral with one another. Cap 62 is above and adjacent to and covers in the upward direction and extends laterally in the lateral directions from the top of post 30. Cap 62 is positioned so that post 30 is centrally located within its periphery. Cap 62 also contacts the underlying portion of adhesive 34 that is coplanar with and adjacent to and laterally surrounds post 30 and covers this portion in the upward direction.

Heat spreader 66 is essentially a heat slug with an inverted T-like shape that includes a pedestal (post 30), wings (base 32 portions that extend laterally from the pedestal) and a thermal pad (cap 62).

FIG. 4J is a cross-sectional view of the structure with solder mask 68 formed on dielectric layer 44, conductive layer 50 and cap 62.

Solder mask 68 is an electrically insulative layer that is selectively patterned to expose pad 56, terminal 60 and cap 62 and cover routing line 58 and the exposed portions of adhesive 34 and dielectric layer 44 in the upward direction. Solder mask 68 has a thickness of 25 microns above pad 56 and terminal 60 and extends 55 microns (30+25) above dielectric layer 44.

Solder mask 68 can initially be a photoimageable liquid resin that is dispensed on the structure. Thereafter, solder mask 68 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

FIG. 4K is a cross-sectional view of the structure with plated contacts 70 formed on pad 56, terminal 60 and cap 62.

Plated contacts 70 are thin spot plated metal coatings that contact pad 56, terminal 60 and cap 62 and cover their exposed portions in the upward direction. For instance, a nickel layer is electrolessly plated on pad 56, terminal 60 and cap 62, and then a gold layer is electrolessly plated on the nickel layer. The buried nickel layer has a thickness of 3 microns, the gold surface layer has a thickness of 0.5 microns, and plated contacts 70 have a thickness of 3.5 microns.

Pad 56, terminal 60 and cap 62 treated with plated contacts 70 as a surface finish have several advantages. The buried nickel layer provides the primary mechanical and electrical and/or thermal connection, and the gold surface layer provides a wettable surface to facilitate solder reflow. Plated contacts 70 also protect pad 56, terminal 60 and cap 62 from corrosion. Plated contacts 70 can include a wide variety of metals to accommodate the external connection media. For instance, a silver surface layer plated on a buried nickel layer can accommodate a solder joint or a wire bond.

Pad 56, terminal 60 and cap 62 treated with plated contacts 70 are shown as single layers for convenience of illustration. The boundary (not shown) with plated contacts 70 in pad 56, terminal 60 and cap 62 occurs at the copper/nickel interface.

At this stage, the manufacture of thermal board 72 can be considered complete.

FIGS. 4L, 4M and 4N are cross-sectional, top and bottom views, respectively, of thermal board 72 after it is detached at peripheral edges along cut lines from a support frame and/or adjacent thermal boards in a batch.

Thermal board 72 includes adhesive 34, substrate 40, heat spreader 66 and solder mask 68. Substrate 40 includes dielectric layer 44 and conductive trace 64 which includes pad 56, routing line 58 and terminal 60. Heat spreader 66 includes post 30, base 32 and cap 62.

Post 30 extends through opening 36 and into aperture 46, remains centrally located within opening 36 and aperture 46 and is coplanar with an adjacent portion of adhesive 34 above dielectric layer 44. Post 30 retains its cut-off conical shape with tapered sidewalls in which its diameter decreases as it extends upwardly from base 32 to its flat circular top adjacent to cap 62. Base 32 covers post 30, adhesive 34, substrate 40, cap 62, conductive trace 64 and solder mask 68 in the downward direction and extends to the peripheral edges of thermal board 72. Cap 62 is above and adjacent to and thermally connected to post 30, covers the top of post 30 in the upward direction and laterally extends from the top of post 30 in the lateral directions. Cap 62 also contacts and covers in the upward direction a portion of adhesive 34 that is coplanar with and adjacent to and laterally surrounds post 30. Cap 62 is also coplanar with pad 56 and terminal 60.

Adhesive 34 is mounted on and extends above base 32, contacts and is sandwiched between and fills the space between post 30 and dielectric layer 44 in gap 48, contacts and is sandwiched between and fills the space between base 32 and dielectric layer 44 outside gap 48, extends laterally from post 30 beyond and is overlapped by terminal 60, covers base 32 outside the periphery of post 30 in the upward direction, covers substrate 40 in the downward direction, covers and surrounds post 30 in the lateral directions, is contained in and fills most of the space between substrate 40 and heat spreader 66 and is solidified.

Substrate 40 is mounted on and contacts adhesive 34, extends above the underlying adhesive 34 and extends above base 32, conductive layer 42 (as well as pad 56, routing line 58 and terminal 60) contacts and extends above dielectric layer 44, and dielectric layer 44 contacts and is sandwiched between adhesive 34 and conductive layer 42.

Post 30, base 32 and cap 62 remain spaced from substrate 40. As a result, substrate 40 and heat spreader 66 are mechanically attached and electrically isolated from one another.

Base 32, adhesive 34, dielectric layer 44 and solder mask 68 extend to straight vertical peripheral edges of thermal board 72 after it is detached or singulated from a batch of identical simultaneously manufactured thermal boards.

Pad 56 is customized as an electrical interface for a semiconductor device such as an LED package or a semiconductor chip that is subsequently mounted on cap 62, terminal 60 is customized as an electrical interface for the next level assembly such as a solderable wire from a printed circuit board, cap 62 is customized as a thermal interface for the semiconductor device, and base 32 is customized as a thermal interface for the next level assembly such as a heat sink for an electronic device. Furthermore, cap 62 is thermally connected to base 32 by post 30.

Pad 56 and terminal 60 are laterally offset from one another and exposed at the top surface of thermal board 72, thereby providing horizontal fan-out routing between the semiconductor device and the next level assembly.

Pad 56, terminal 60 and cap 62 are coplanar with one another at their top surfaces above dielectric layer 44.

Conductive trace 64 is shown in cross-section as a continuous circuit trace for convenience of illustration. However, conductive trace 64 typically provides horizontal signal routing in both the X and Y directions. That is, pad 56 and terminal 60 are laterally offset from one another in the X and Y directions, and routing line 58 routes in the X and Y directions.

Heat spreader 66 provides heat spreading and heat dissipation from a semiconductor device that is subsequently mounted on cap 62 to the next level assembly that thermal board 72 is subsequently mounted on. The semiconductor device generates heat that flows into cap 62, from cap 62 into post 30 and through post 30 into base 32 where it is spread out and dissipated in the downward direction, for instance to an underlying heat sink.

Thermal board 72 does not expose post 30 or routing line 58. Post 30 is covered by cap 62, routing line 58 is covered by solder mask 68, and adhesive 34 at its top surface is covered by cap 62 and solder mask 68. Post 30 and routing line 58 are shown in phantom in FIG. 4M for convenience of illustration.

Thermal board 72 includes other conductive traces 64 that typically include pad 56, routing line 58 and terminal 60. A single conductive trace 64 is described and labeled for convenience of illustration. In conductive traces 64, pads 56 and terminals 60 generally have identical shapes and sizes whereas routing lines 58 generally have different routing configurations. For instance, some conductive traces 64 may be spaced and separated and electrically isolated from one another whereas other conductive traces 64 can intersect or route to the same pad 56, routing line 58 or terminal 60 and be electrically connected to one another. Likewise, some pads 56 may receive independent signals whereas other pads 56 share a common signal, power or ground.

Thermal board 72 can be adapted for an LED package with blue, green and red LED chips, with each LED chip including an anode and a cathode and each LED package including a corresponding anode terminal and cathode terminal. In this instance, thermal board 72 can include six pads 56 and four terminals 60 so that each anode is routed from a separate pad 56 to a separate terminal 60 whereas each cathode is routed from a separate pad 56 to a common ground terminal 60.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 64 after they are formed. A plating bus can be disconnected during the wet chemical etch that forms pad 56, routing line 58, terminal 60 and cap 62.

Thermal board 72 can include registration holes (not shown) that are drilled or sliced through base 32, adhesive 34, substrate 40 and solder mask 68 so that thermal board 72 can be positioned by inserting tooling pins through the registration holes when it is subsequently mounted on an underlying carrier.

Thermal board 72 can omit cap 62. This can be accomplished by adjusting etch mask 52 to expose conductive layer 50 above all of aperture 46 to the wet chemical etch that forms pad 56, routing line 58 and terminal 60. This can also be accomplished by omitting conductive layer 50.

Thermal board 72 can accommodate multiple semiconductor devices rather than one. This can be accomplished by adjusting etch mask 16 to define additional posts 30, adjusting adhesive 34 to include additional openings 36, adjusting substrate 40 to include additional apertures 46, adjusting etch mask 52 to define additional pads 56, routing lines 58, terminals 60 and caps 62 and adjusting solder mask 68 to contain additional openings. The elements except for terminals 60 can be laterally repositioned to provide a 2×2 array for four semiconductor devices. In addition, the topography (lateral shape) can be adjusted for some but not all of the elements. For instance, pads 56, terminals 60 and caps 62 can retain the same topography whereas routing lines 58 have different routing configurations.

Figure 5A:
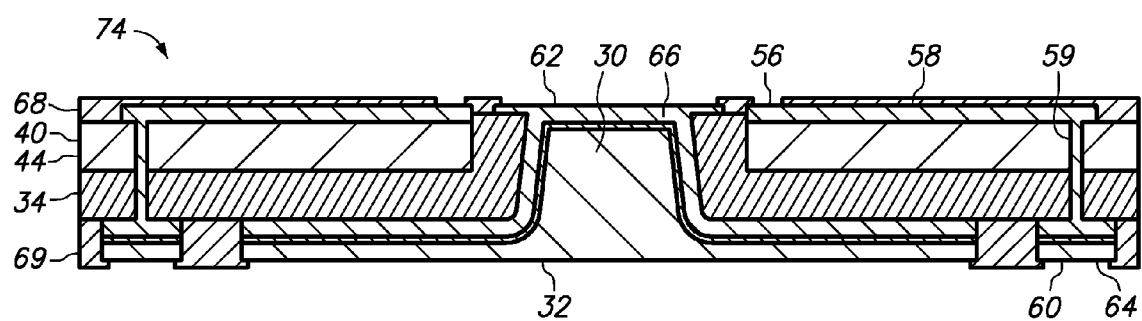
FIGS. 5A, 5B and 5C are cross-sectional, top and bottom views, respectively, of a thermal board with vertical signal routing in accordance with an embodiment of the present invention.
Figure 5B:
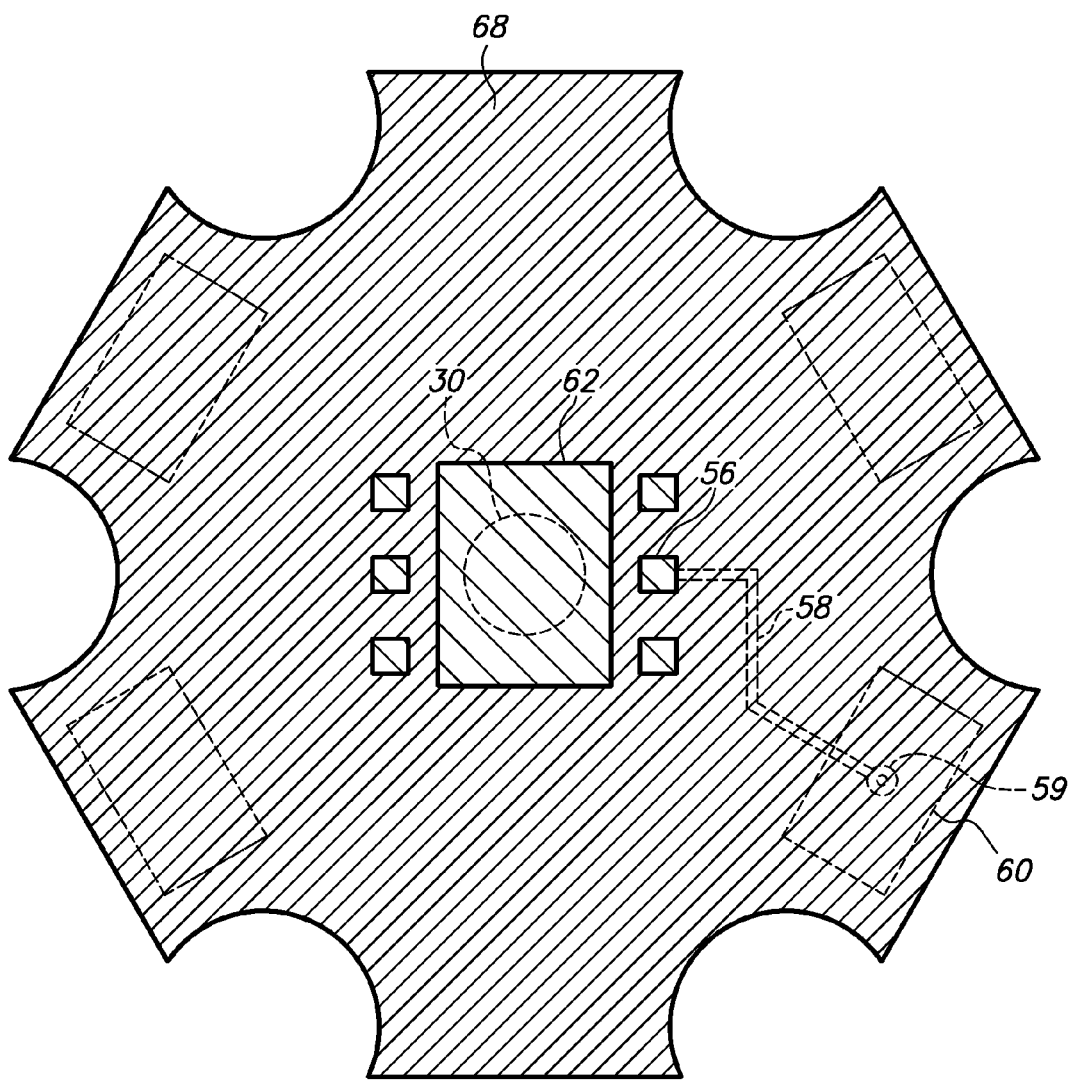
Figure 5C:
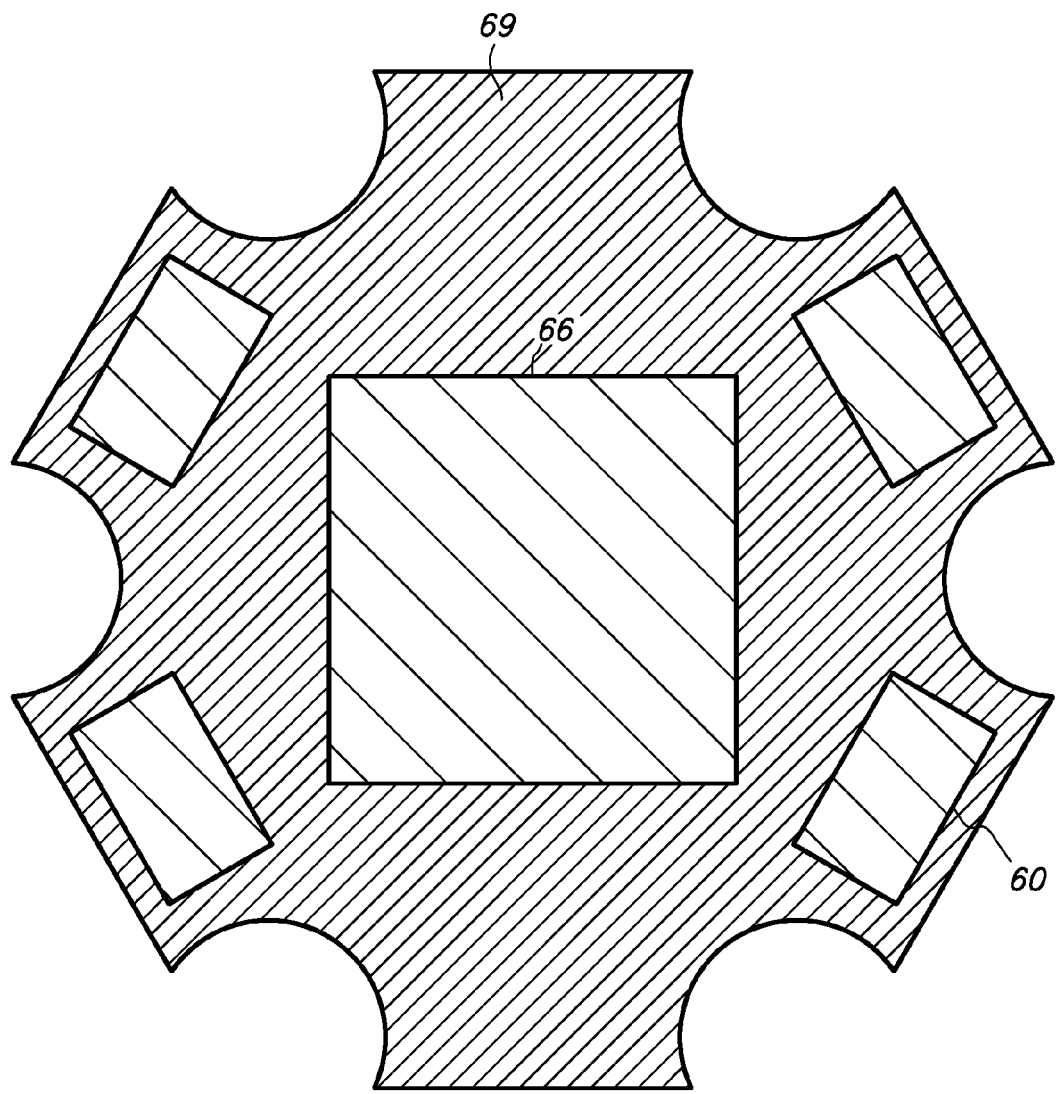

FIGS. 5A, 5B and 5C are cross-sectional, top and bottom views, respectively, of a thermal board with vertical signal routing in accordance with an embodiment of the present invention.

In this embodiment, the terminal is located at the bottom of the thermal board. For purposes of brevity, any description of thermal board 72 is incorporated herein insofar as the same is applicable, and the same description need not be repeated Likewise, elements of the thermal board similar to those in thermal board 72 have corresponding reference numerals.

Thermal board 74 includes adhesive 34, substrate 40, conductive trace 64, heat spreader 66 and solder masks 68 and 69. Substrate 40 includes dielectric layer 44. Conductive trace 64 includes pad 56, routing line 58, via 59 and terminal 60. Heat spreader 66 includes post 30, base 32 and cap 62.

Base 32 is thinner in this embodiment than the previous embodiment and is spaced from the peripheral edges of thermal board 74. Base 32 covers post 30 and cap 62 but not adhesive 34, substrate 40, conductive trace 64 or solder masks 68 and 69 in the downward direction. Base 32 also supports substrate 40 and is coplanar with terminal 60 below adhesive 34.

Via 59 is an electrical conductor that extends vertically from routing line 58 through dielectric layer 44 and adhesive 34 to terminal 60. Furthermore, terminal 60 contacts and extends below adhesive 34, is spaced from and extends below substrate 40 and is spaced from and located between base 32 and the peripheral edges of thermal board 74. Thus, adhesive 34 extends laterally from post 30 beyond and overlaps terminal 60, via 59 is adjacent to and electrically connects routing line 58 and terminal 60, and conductive trace 64 provides vertical (top to bottom) signal routing from pad 56 to terminal 60.

Solder mask 69 is an electrically insulative layer similar to solder mask 68 that exposes base 32 and terminal 60 and covers the exposed portions of adhesive 34 in the downward direction.

Thermal board 74 can be manufactured in a manner similar to thermal board 72 with suitable adjustments for base 32, conductive trace 64 and solder masks 68 and 69. For instance, aluminum plate 10 has a thickness of 330 microns (rather than 500 microns) so that base 32 has a thickness of 60 microns (rather than 230 microns). Thereafter, adhesive 34 is mounted on base 32, substrate 40 is mounted on adhesive 34, heat and pressure are applied to flow and solidify adhesive 34, grinding is applied to planarize the top surface and then conductive layer 50 is deposited on the top surface as previously described. Next, a hole is drilled downward through conductive layers 42 and 50, dielectric layer 44 and adhesive 34 into but not through base 32 and then via 59 is deposited into the hole by electroplating, screen printing or dispensing by an injection nozzle in step-and-repeat fashion. Thereafter, conductive layers 42 and 50 are etched to form pad 56 and routing line 58, conductive layer 50 is etched to form cap 62 and base 32 is etched to form terminal 60. Base 32 as etched is reduced to its central portion and terminal 60 is an unetched portion of base 32 that contacts and extends below adhesive 34, is spaced and separated from and no longer a part of base 32 and is adjacent to via 59. Thereafter, solder mask 68 is formed on the top surface to selectively expose pad 56 and cap 62, solder mask 69 is formed on the bottom surface to selectively expose base 32 and terminal 60 and then plated contacts 70 provide a surface finish for pad 56, terminal 60 and cap 62.

Figure 6A:
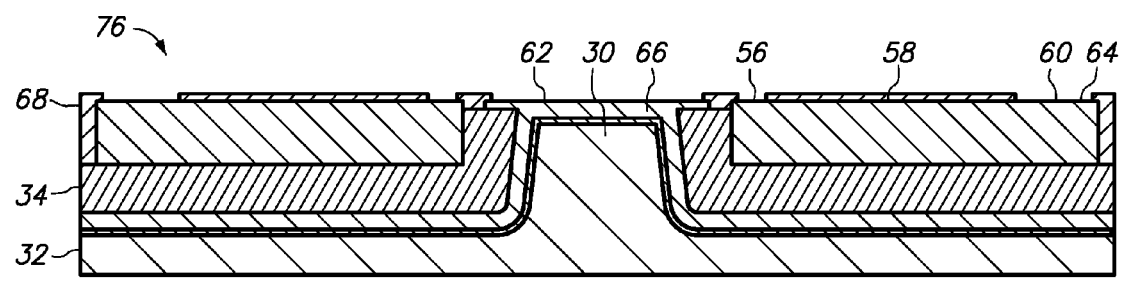
FIGS. 6A, 6B and 6C are cross-sectional, top and bottom views, respectively, of a thermal board with a conductive trace on an adhesive in accordance with an embodiment of the present invention.
Figure 6B:
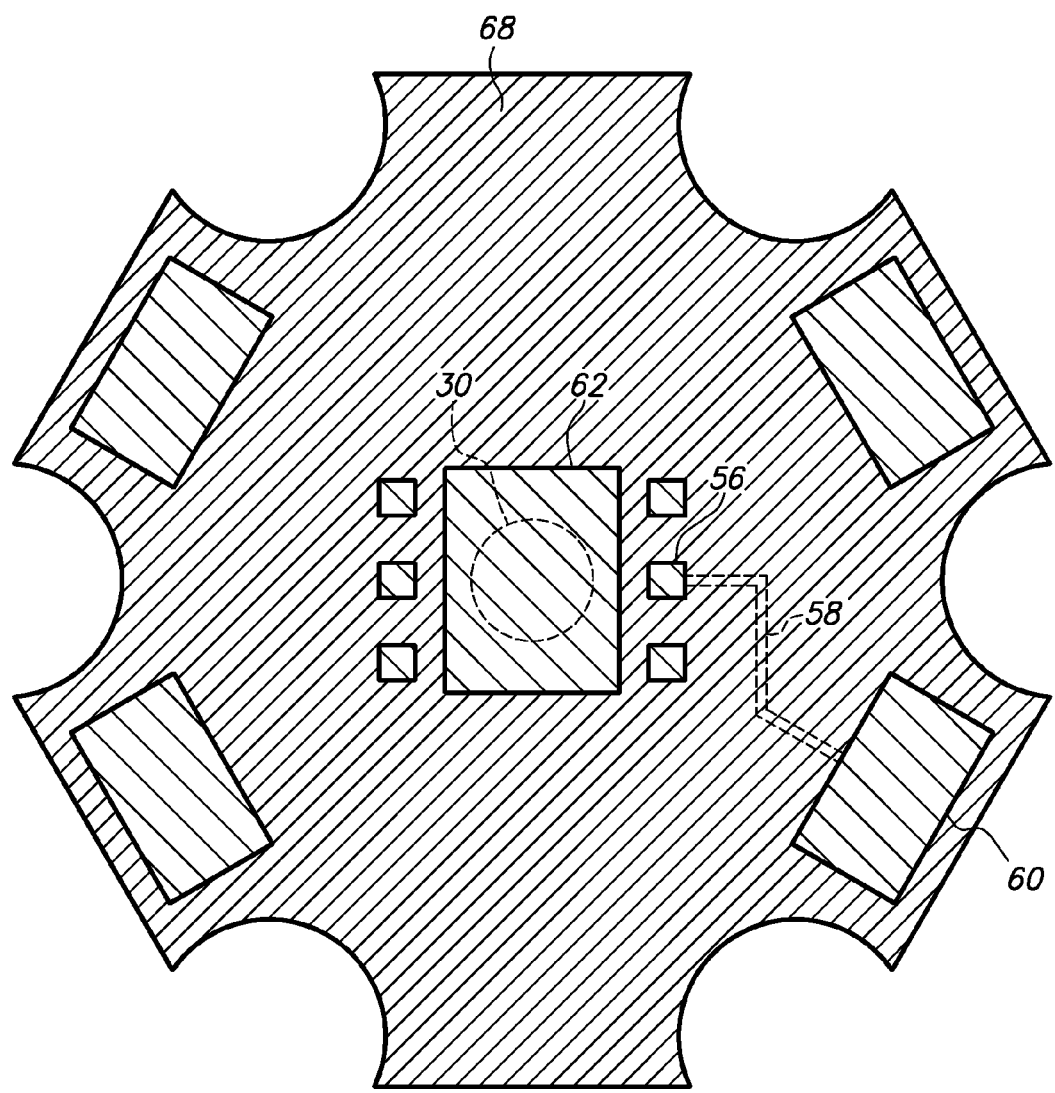
Figure 6C:
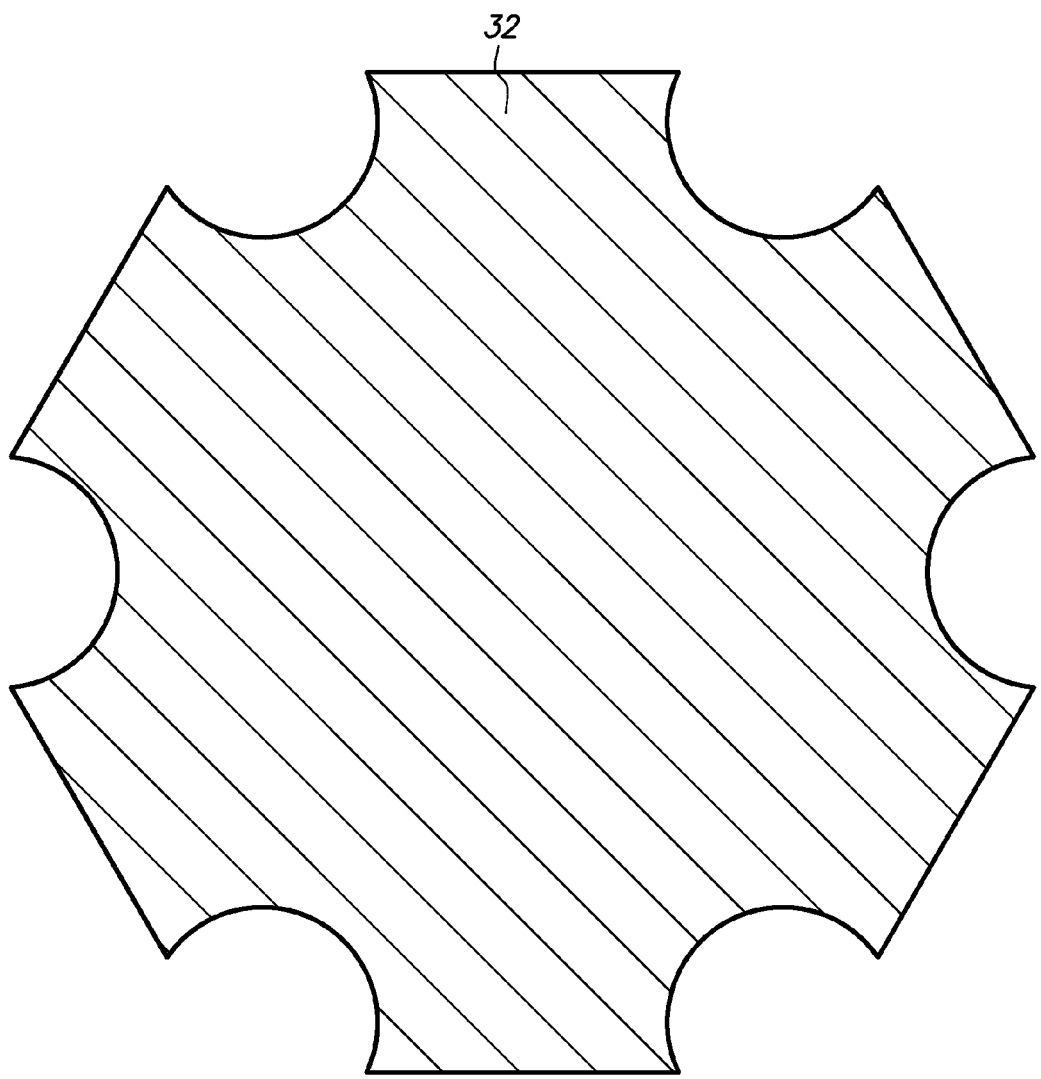

FIGS. 6A, 6B and 6C are cross-sectional, top and bottom views, respectively, of a thermal board with a conductive trace on an adhesive in accordance with an embodiment of the present invention.

In this embodiment, the conductive trace contacts the adhesive and the dielectric layer is omitted. For purposes of brevity, any description of thermal board 72 is incorporated herein insofar as the same is applicable, and the same description need not be repeated. Likewise, elements of the thermal board similar to those in thermal board 72 have corresponding reference numerals.

Thermal board 76 includes adhesive 34, conductive trace 64, heat spreader 66 and solder mask 68. Conductive trace 64 includes pad 56, routing line 58 and terminal 60. Heat spreader 66 includes post 30, base 32 and cap 62.

Conductive layer 42 is thicker in this embodiment than the previous embodiment. For instance, conductive layer 42 has a thickness of 125 microns (rather than 30 microns) so that it can be handled without warping or wobbling. Pad 56, routing line 58 and terminal 60 are therefore thicker and contact and overlap adhesive 34, and thermal board 76 is devoid of a dielectric layer corresponding to dielectric layer 44.

Thermal board 76 can be manufactured in a manner similar to thermal board 72 with suitable adjustments for post 30 and conductive layer 42. For instance, post 30 has a height of 200 microns (rather than 300 microns) so that base 32 has a thickness of 330 microns (rather than 230 microns). This can be accomplished by reducing the etch time. Thereafter, adhesive 34 is mounted on base 32, conductive layer 42 alone is mounted on adhesive 34, heat and pressure are applied to flow and solidify adhesive 34, grinding is applied to planarize the top surface and then conductive layer 50 is deposited on the top surface as previously described. Thereafter, conductive layers 42 and 50 are etched to form pad 56, routing line 58 and terminal 60, conductive layer 50 is etched to form cap 62, then solder mask 68 is formed on the top surface to selectively expose pad 56, terminal 60 and cap 62 and then plated contacts 70 provide a surface finish for pad 56, terminal 60 and cap 62.

Figure 7A:
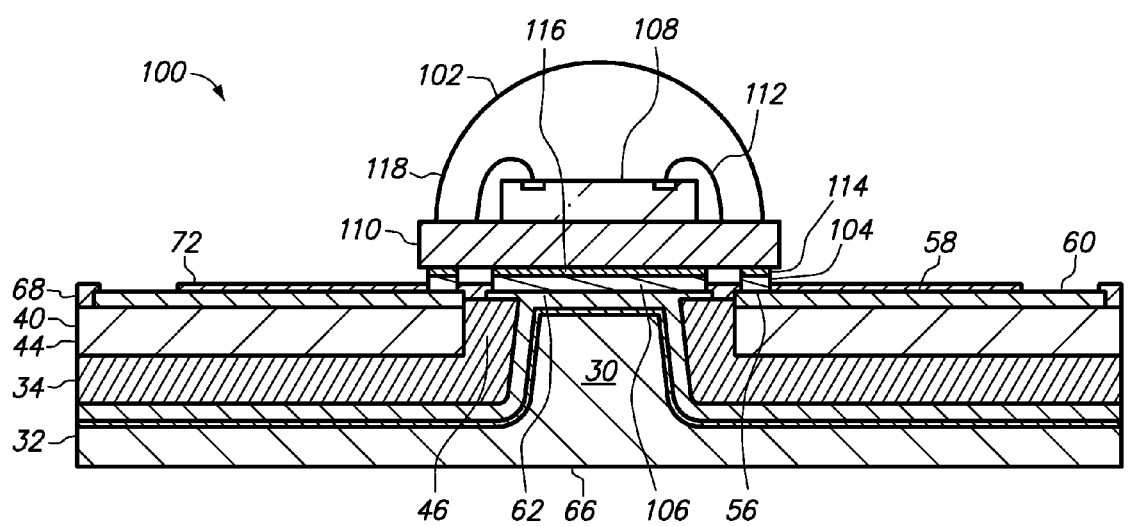
FIGS. 7A, 7B and 7C are cross-sectional, top and bottom views, respectively, of a semiconductor chip assembly that includes a thermal board and an LED package with backside contacts accordance with an embodiment of the present invention.
Figure 7B:
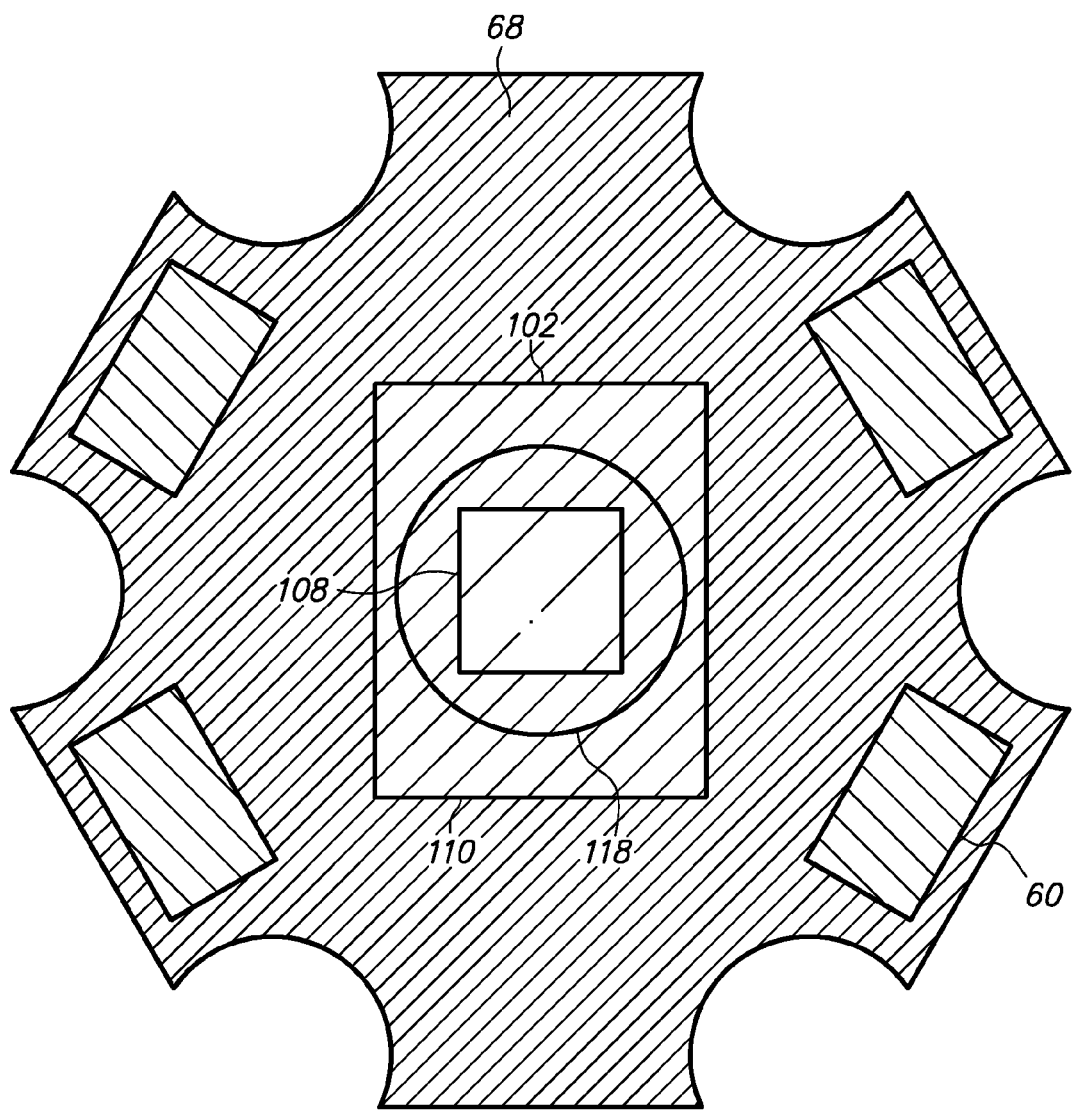
Figure 7C:
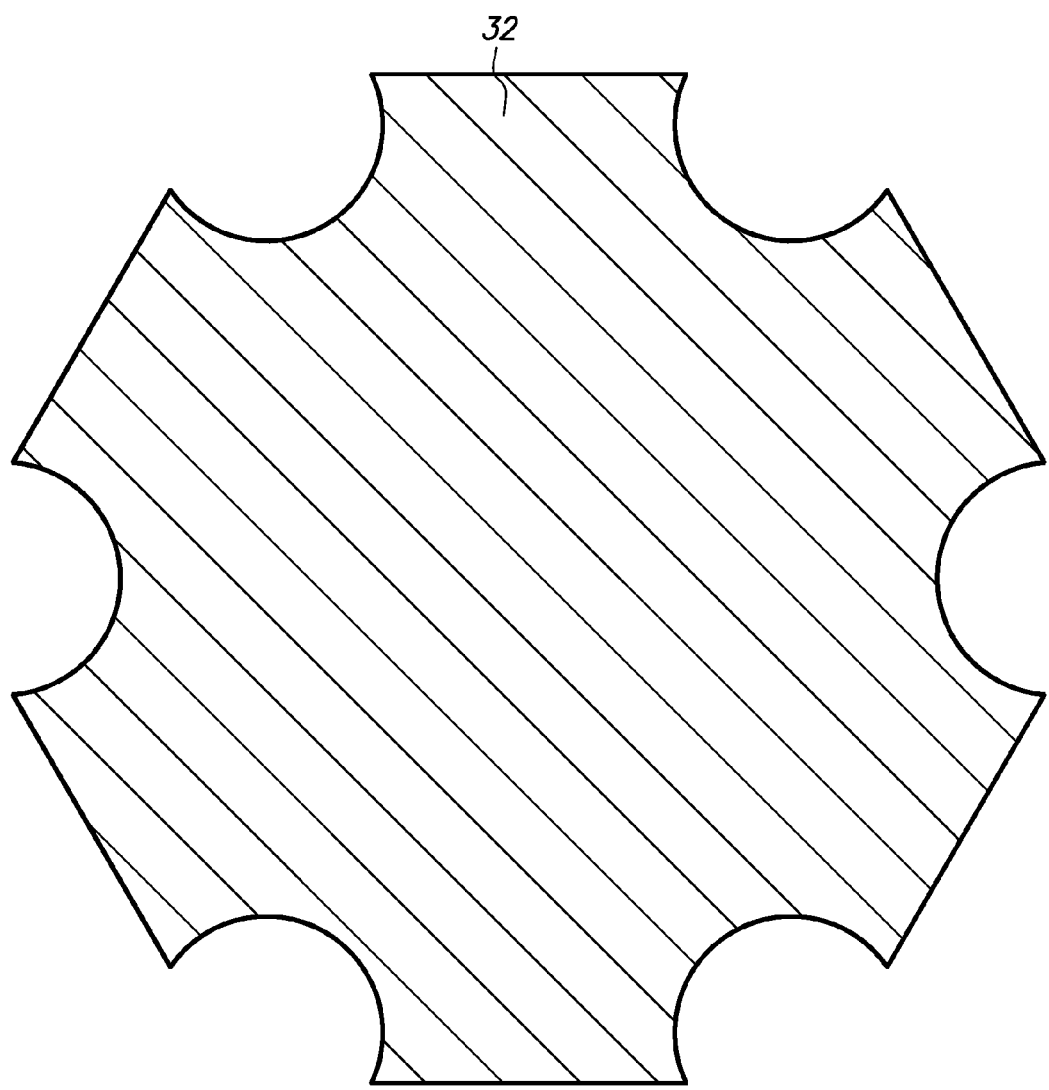

FIGS. 7A, 7B and 7C are cross-sectional, top and bottom views, respectively, of a semiconductor chip assembly that includes a thermal board an LED package with backside contacts in accordance with an embodiment of the present invention.

Semiconductor chip assembly 100 includes thermal board 72, LED package 102 and solder joints 104 and 106. LED package 102 includes LED chip 108, submount 110, wire bond 112, electrical contact 114, thermal contact 116 and transparent encapsulant 118. LED chip 108 includes an electrode (not shown) electrically connected to a via (not shown) in submount 110 by wire bond 112, thereby electrically connecting LED chip 108 to electrical contact 114. LED chip 108 is mounted on and thermally connected to and mechanically attached to submount 110 by a die attach (not shown), thereby thermally connecting LED chip 108 to thermal contact 116. Submount 110 is a ceramic block with low electrical conductivity and high thermal conductivity, and contacts 114 and 116 are plated on and protrude downwardly from the backside of submount 110.

LED package 102 is mounted on substrate 40 and heat spreader 66, electrically connected to substrate 40 and thermally connected to heat spreader 66. In particular, LED package 102 is mounted on pad 56 and cap 62, overlaps post 30, is electrically connected to substrate 40 by solder joint 104 and is thermally connected to heat spreader 66 by solder joint 106. For instance, solder joint 104 contacts and is sandwiched between and electrically connects and mechanically attaches pad 56 and electrical contact 114, thereby electrically connecting LED chip 108 to terminal 60. Likewise, solder joint 106 contacts and is sandwiched between and thermally connects and mechanically attaches cap 62 and thermal contact 116, thereby thermally connecting LED chip 108 to base 32. Pad 56 is spot plated with nickel/gold to bond well with solder joint 104 and is shaped and sized to match electrical contact 114, thereby improving signal transfer from substrate 40 to LED package 102 Likewise, cap 62 is spot plated with nickel/gold to bond well with solder joint 106 and is shaped and sized to match thermal contact 116, thereby improving heat transfer from LED package 102 to heat spreader 66. Furthermore, post 30 is not and need not be shaped and sized to match thermal contact 116.

Transparent encapsulant 118 is a solid adherent electrically insulative protective plastic enclosure that provides environmental protection such as moisture resistance and particle protection for LED chip 108 and wire bond 112. LED chip 108 and wire bond 112 are embedded in transparent encapsulant 118.

Semiconductor chip assembly 100 can be manufactured by depositing a solder material on pad 56 and cap 62, then placing contacts 114 and 116 on the solder material over pad 56 and cap 62, respectively, and then reflowing the solder material to provide solder joints 104 and 106.

For instance, solder paste is selectively screen printed on pad 56 and cap 62, then LED package 102 is positioned over thermal board 72 using a pick-up head and an automated pattern recognition system in step-and-repeat fashion. The pick-up head places contacts 114 and 116 on the solder paste over pad 56 and cap 62, respectively. Next, the solder paste is heated and reflowed at a relatively low temperature such as 190° C. and then the heat is removed and the solder paste cools and solidifies to form hardened solder joints 104 and 106. Alternatively, solder balls are placed on pad 56 and cap 62, then contacts 114 and 116 are placed on the solder balls over pad 56 and cap 62, respectively, and then the solder balls are heated and reflowed to form solder joints 104 and 106.

The solder material can be initially deposited on thermal board 72 or LED package 102 by plating or printing or placement techniques, then sandwiched between thermal board 72 and LED package 102 and then reflowed. The solder material can also be deposited on terminal 60 if required for the next level assembly. Furthermore, a conductive adhesive such as silver-filled epoxy or other connection media can be used instead of solder, and the connection media on pad 56, terminal 60 and cap 62 need not be the same.

Semiconductor chip assembly 100 is a second-level single-chip module.

Figure 8A:
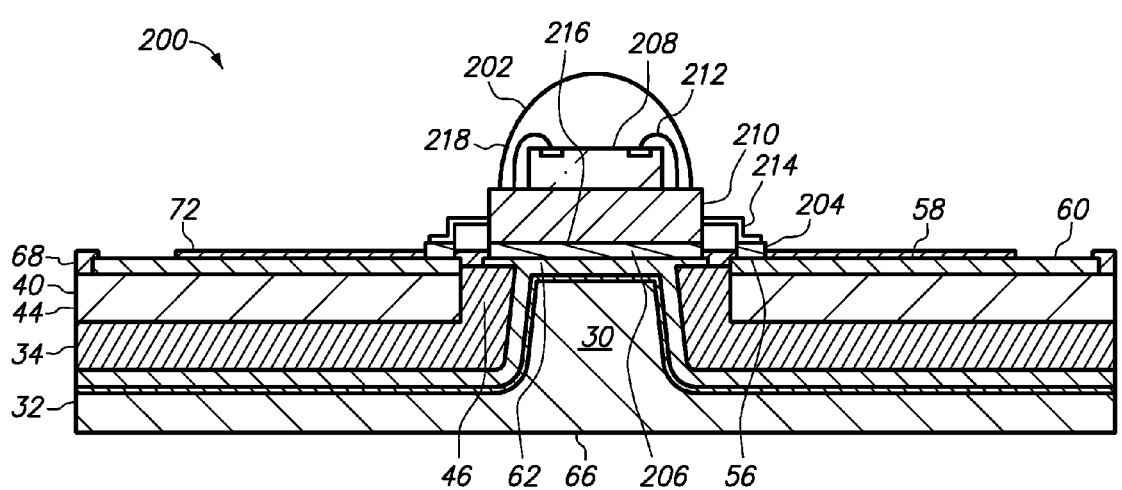
FIGS. 8A, 8B and 8C are cross-sectional, top and bottom views, respectively, of a semiconductor chip assembly that includes a thermal board and an LED package with lateral leads in accordance with an embodiment of the present invention.
Figure 8B:
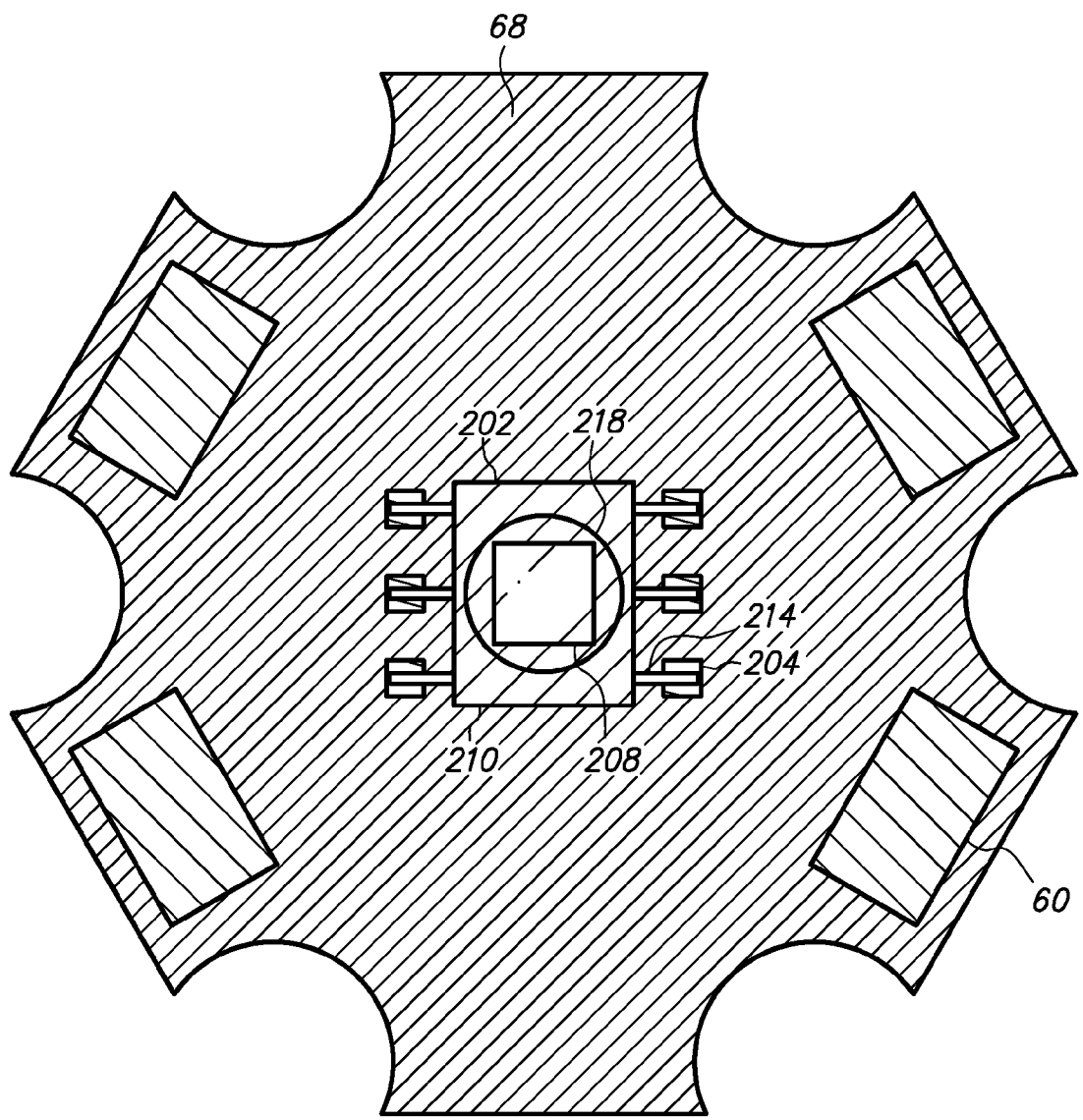
Figure 8C:
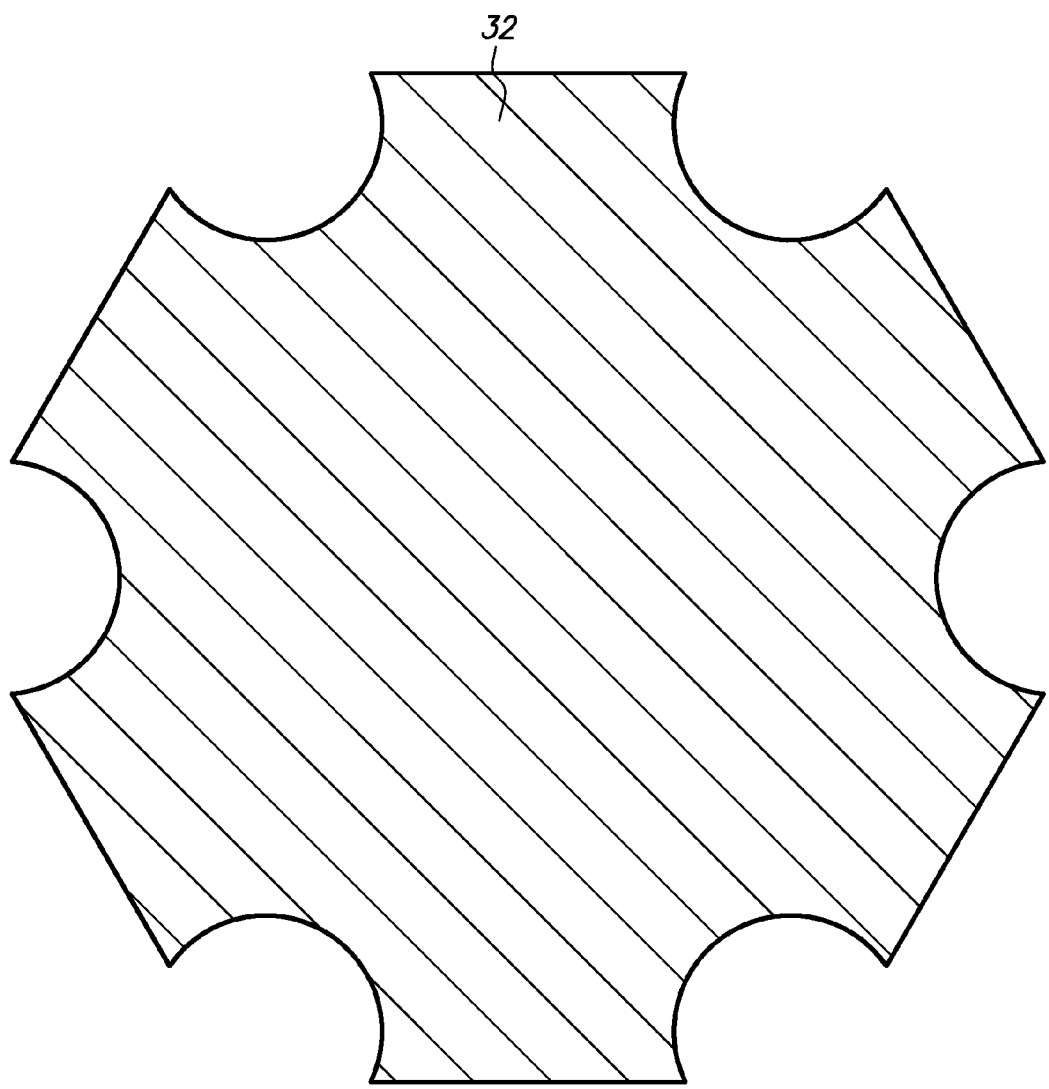

FIGS. 8A, 8B and 8C are cross-sectional, top and bottom views, respectively, of a semiconductor chip assembly that includes a thermal board and an LED package with lateral leads in accordance with an embodiment of the present invention.

In this embodiment, the LED package has lateral leads rather than backside contacts. For purposes of brevity, any description of assembly 100 is incorporated herein insofar as the same is applicable, and the same description need not be repeated Likewise, elements of the assembly similar to those in assembly 100 have corresponding reference numerals indexed at two-hundred rather than one-hundred. For instance, LED chip 208 corresponds to LED chip 108, submount 210 corresponds to submount 110, etc.

Semiconductor chip assembly 200 includes thermal board 72, LED package 202 and solder joints 204 and 206. LED package 202 includes LED chip 208, submount 210, wire bond 212, lead 214 and transparent encapsulant 218. LED chip 208 is electrically connected to lead 214 by wire bond 212. Submount 210 includes thermal contact surface 216 at its backside, is narrower than submount 110 and has the same lateral size and shape as thermal contact 116. LED chip 208 is mounted on and thermally connected to and mechanically attached to submount 210 by a die attach (not shown), thereby thermally connecting LED chip 208 to thermal contact surface 216. Lead 214 extends laterally from submount 210 and thermal contact surface 216 faces downward.

LED package 202 is mounted on substrate 40 and heat spreader 66, electrically connected to substrate 40 and thermally connected to heat spreader 66. In particular, LED package 202 is mounted on pad 56 and cap 62, overlaps post 30, is electrically connected to substrate 40 by solder joint 204 and is thermally connected to heat spreader 66 by solder joint 206. For instance, solder joint 204 contacts and is sandwiched between and electrically connects and mechanically attaches pad 56 and lead 214, thereby electrically connecting LED chip 208 to terminal 60. Likewise, solder joint 206 contacts and is sandwiched between and thermally connects and mechanically attaches cap 62 and thermal contact surface 216, thereby thermally connecting LED chip 208 to base 32.

Semiconductor chip assembly 200 can be manufactured by depositing a solder material on pad 56 and cap 62, then placing lead 214 and thermal contact surface 216 on the solder material over pad 56 and cap 62, respectively, and then reflowing the solder material to provide solder joints 204 and 206.

Semiconductor chip assembly 200 is a second-level single-chip module.

Figure 9A:
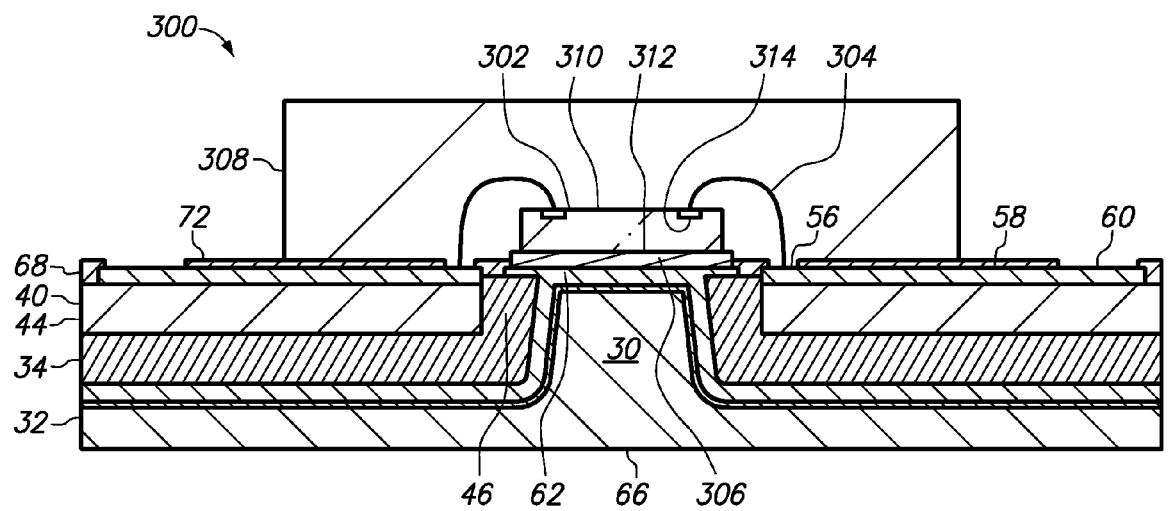
FIGS. 9A, 9B and 9C are cross-sectional, top and bottom views, respectively, of a semiconductor chip assembly that includes a thermal board with horizontal signal routing and a semiconductor chip in accordance with an embodiment of the present invention.
Figure 9B:
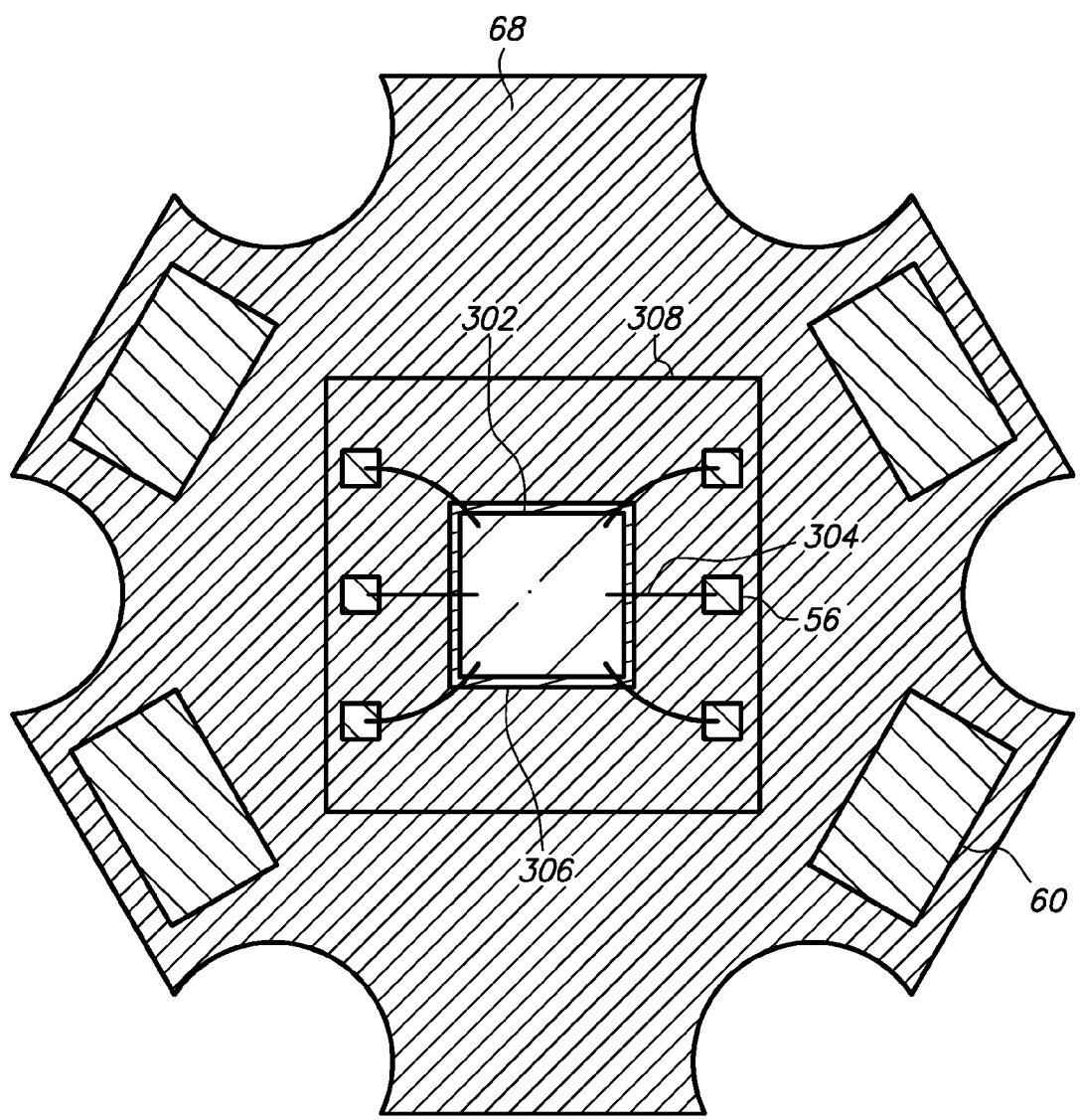
Figure 9C:
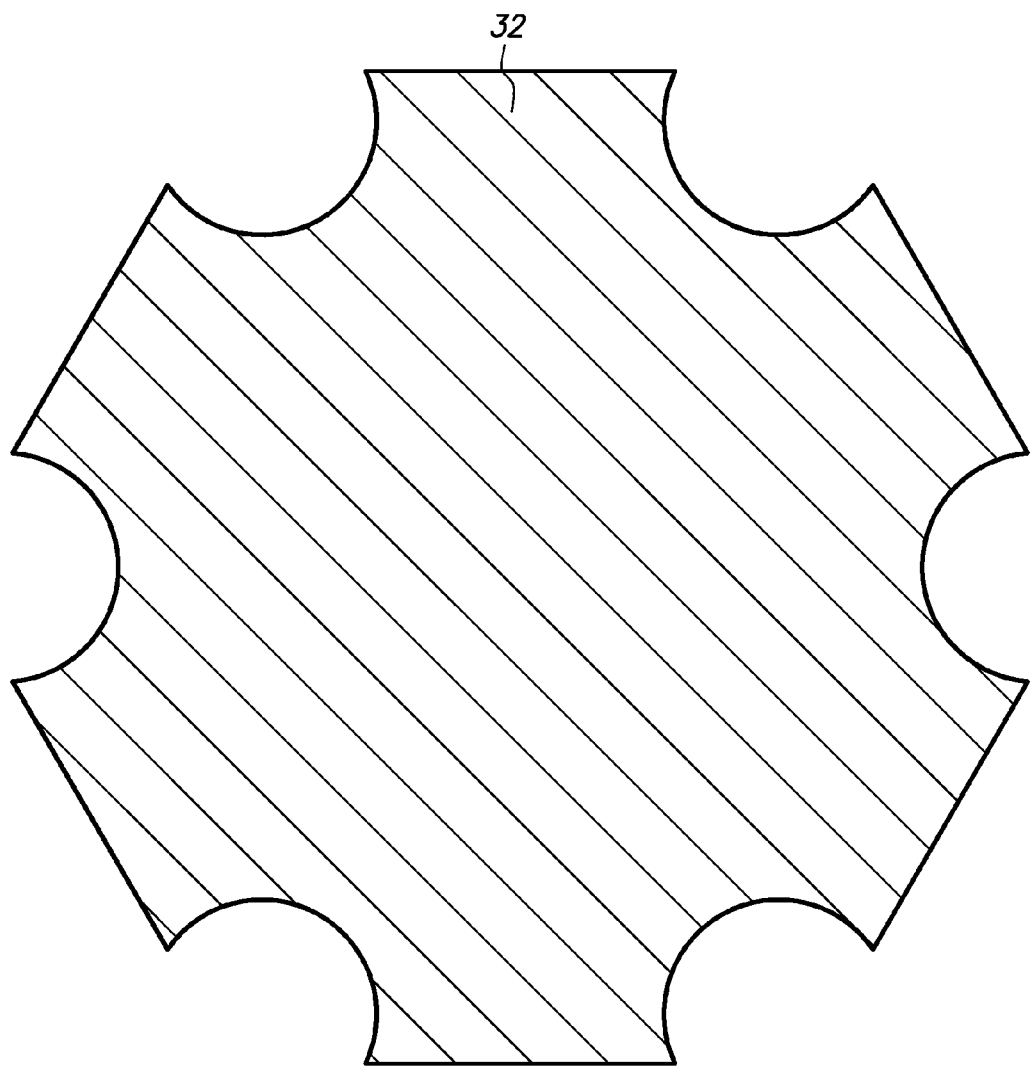

FIGS. 9A, 9B and 9C are cross-sectional, top and bottom views, respectively, of a semiconductor chip assembly that includes a thermal board with horizontal signal routing and a semiconductor chip in accordance with an embodiment of the present invention.

In this embodiment, the semiconductor device is a chip rather than a package and the chip is mounted on the heat spreader but not the substrate. Furthermore, the chip overlaps the post but not the substrate, is electrically connected to the pad using a wire bond and is thermally connected to the cap using a die attach.

Semiconductor chip assembly 300 includes thermal board 72, chip 302, wire bond 304, die attach 306 and encapsulant 308. Chip 302 includes top surface 310, bottom surface 312 and bond pad 314. Top surface 310 is the active surface and includes bond pad 314 and bottom surface 312 is the thermal contact surface.

Chip 302 is mounted on heat spreader 66, electrically connected to substrate 40 and thermally connected to heat spreader 66. In particular, chip 302 is mounted on cap 62, is within the periphery of cap 62, overlaps post 30 but does not overlap substrate 40, is electrically connected to substrate 40 by wire bond 304 and is thermally connected to and mechanically attached to heat spreader 66 by die attach 306. For instance, wire bond 304 is bonded to and electrically connects pads 56 and 314, thereby electrically connecting chip 302 to terminal 60. Likewise, die attach 306 contacts and is sandwiched between and thermally connects and mechanically attaches cap 62 and thermal contact surface 312, thereby thermally connecting chip 302 to base 32. Pad 56 is spot plated with nickel/silver to bond well with wire bond 304, thereby improving signal transfer from substrate 40 to chip 302, and cap 62 is shaped and sized to match thermal contact surface 312, thereby improving heat transfer from chip 302 to heat spreader 66. Furthermore, post 30 is not and need not be shaped and sized to match thermal contact surface 312.

Encapsulant 308 is a solid adherent electrically insulative protective plastic enclosure that provides environmental protection such as moisture resistance and particle protection for chip 302 and wire bond 304. Chip 302 and wire bond 304 are embedded in encapsulant 308. Furthermore, encapsulant 308 can be transparent if chip 302 is an optical chip such as an LED. Encapsulant 308 is transparent in FIG. 8B for convenience of illustration.

Semiconductor chip assembly 300 can be manufactured by mounting chip 302 on cap 62 using die attach 306, then wire bonding pads 56 and 314 and then forming encapsulant 308.

For instance, die attach 306 is initially a silver-filled epoxy paste with high thermal conductivity that is selectively screen printed on cap 62 and then chip 302 placed on the epoxy paste using a pick-up head and an automated pattern recognition system in step-and-repeat fashion. Thereafter, the epoxy paste is heated and hardened at a relatively low temperature such as 190° C. to form die attach 306. Next, wire bond 304 is a gold wire that is thermosonically ball bonded to pads 56 and 314 and then encapsulant 308 is transfer molded on the structure.

Chip 302 can be electrically connected to pad 56 by a wide variety of connection media, thermally connected to and mechanically attached to heat spreader 66 by a wide variety of thermal adhesives and encapsulated by a wide variety of encapsulants.

Semiconductor chip assembly 300 is a first-level single-chip package.

Figure 10A:
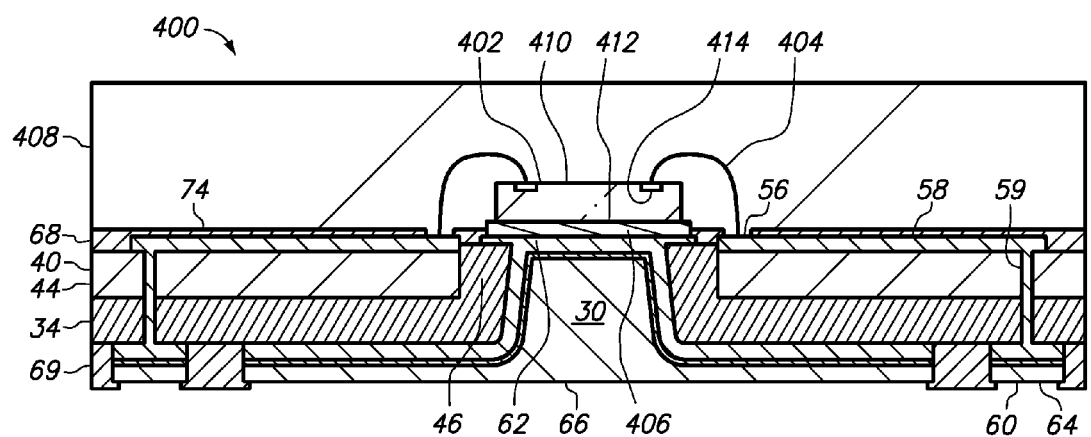
FIGS. 10A, 10B and 10C are cross-sectional, top and bottom views, respectively, of a semiconductor chip assembly that includes a thermal board with vertical signal routing and a semiconductor chip in accordance with an embodiment of the present invention.
Figure 10B:
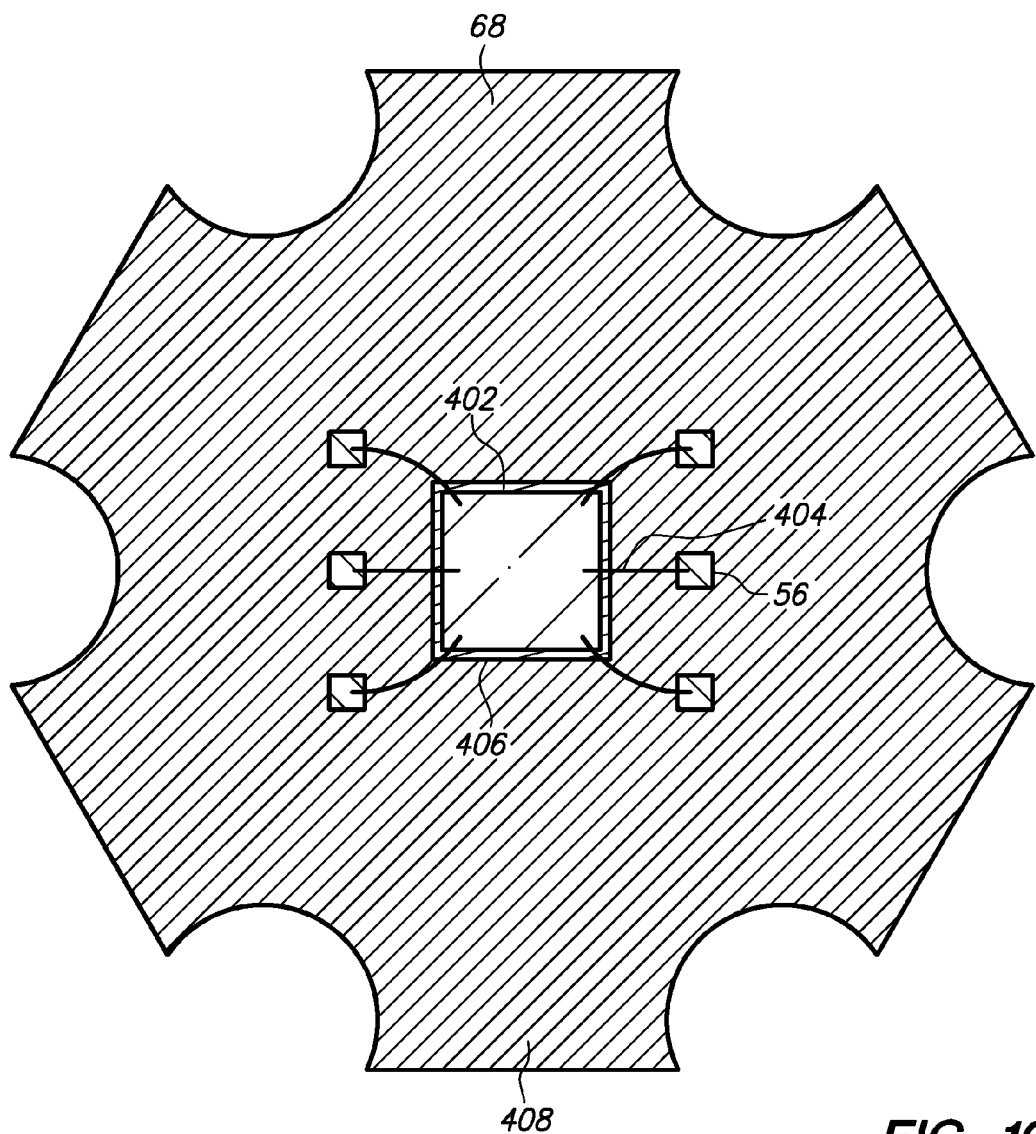
Figure 10C:
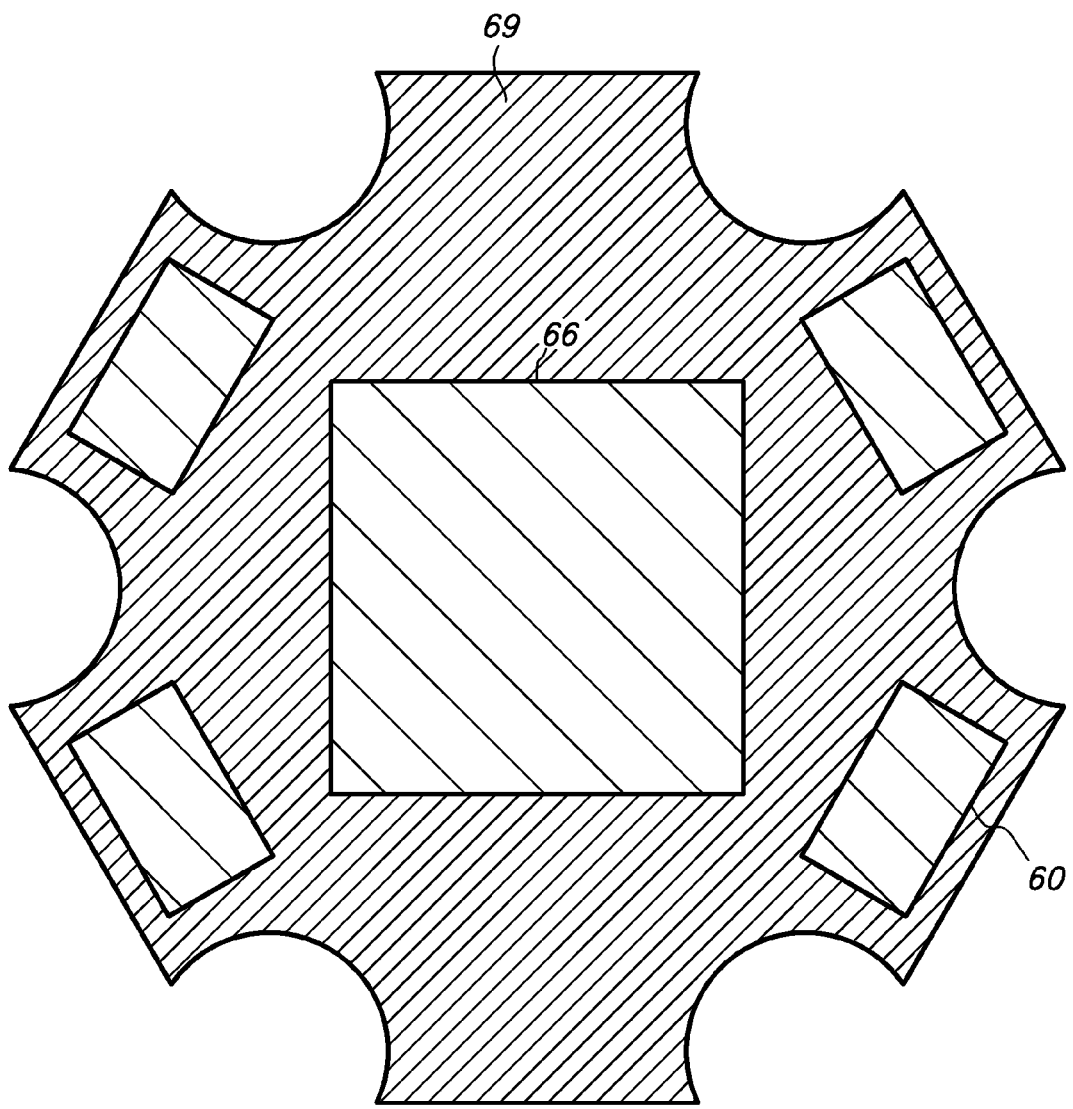

FIGS. 10A, 10B and 10C are cross-sectional, top and bottom views, respectively, of a semiconductor chip assembly that includes a thermal board with vertical signal routing and a semiconductor chip in accordance with an embodiment of the present invention.

Semiconductor chip assembly 400 includes thermal board 74, chip 402, wire bond 404, die attach 406 and encapsulant 408. Chip 402 includes top surface 410, bottom surface 412 and bond pad 414.

Figure 11A:
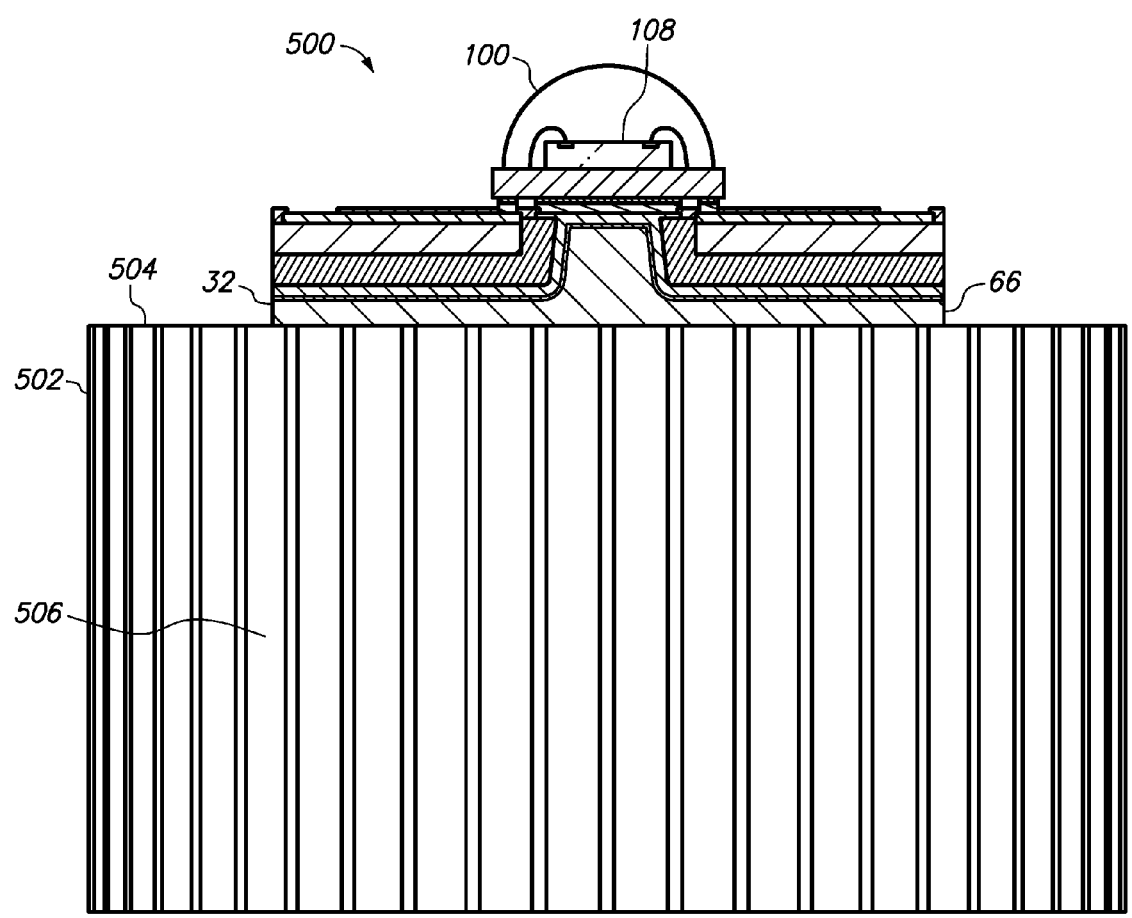
FIGS. 11A, 11B and 11C are cross-sectional, top and bottom views, respectively, of a light source subassembly that includes a semiconductor chip assembly and a heat sink in accordance with an embodiment of the present invention.
Figure 11B:
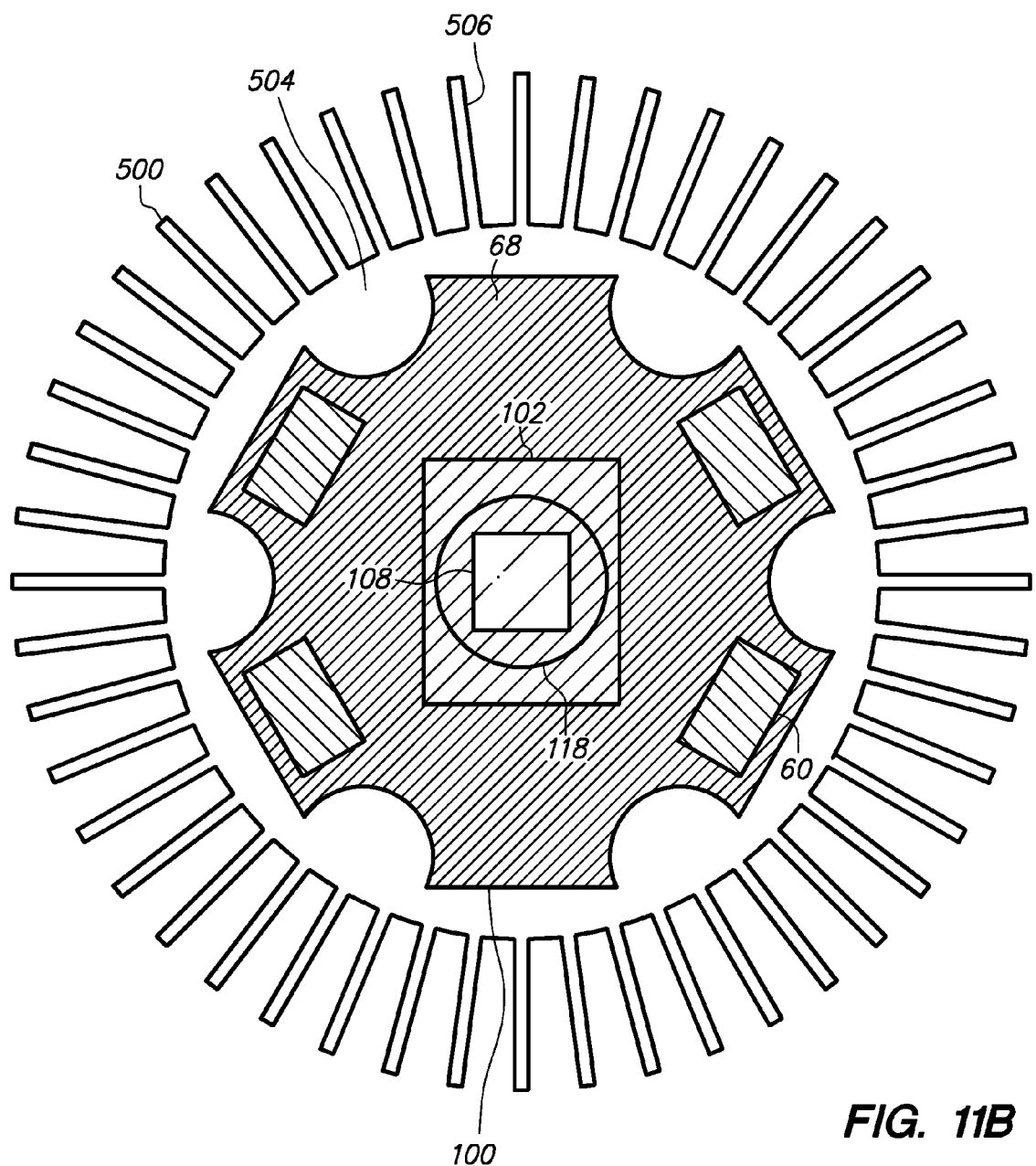
Figure 11C:
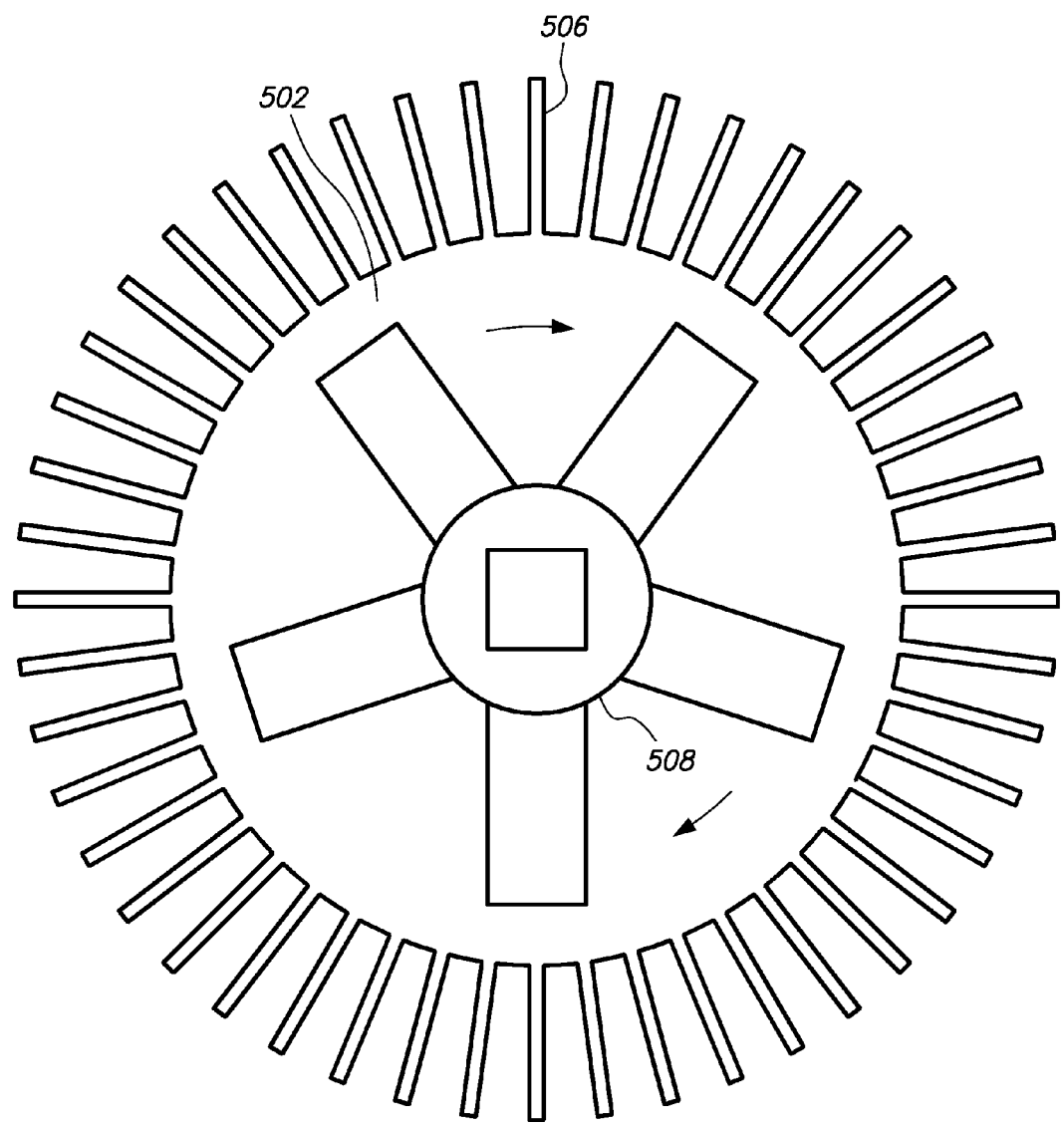

FIGS. 11A, 11B and 11C are cross-sectional, top and bottom views, respectively, of a light source subassembly that includes a semiconductor chip assembly and a heat sink in accordance with an embodiment of the present invention.

Light source subassembly 500 includes semiconductor chip assembly 100 and heat sink 502. Heat sink 502 includes thermal contact surface 504, fins 506 and fan 508. Assembly 100 is mounted on heat sink 502 and mechanically fastened to heat sink 502, for instance by screws (not shown). As a result, base 32 is clamped against and thermally connected to thermal contact surface 504, thereby thermally connecting heat spreader 66 to heat sink 502. Heat spreader 66 spreads the heat from LED chip 108 and transfers the spread heat to heat sink 502, which in turn dissipates the heat into the exterior environment using fins 506 and fan 508.

Light source subassembly 500 is designed for a light fixture (not shown) that is interchangeable with a standard incandescent light bulb. The light fixture includes subassembly 500, a glass cap, a threaded base, a control board, wiring and a housing. Subassembly 500, the control board and the wiring are enclosed within the housing. The wiring extends from the control board and is soldered to terminals 60. The glass cap and the threaded base protrude from opposite ends of the housing. The glass cap exposes LED chip 108, the threaded base is configured to screw into a light socket and the control board is electrically connected to terminals 60 by the wiring. The housing is a two-piece plastic shell with top and bottom pieces. The glass cap is attached to and protrudes above the top piece, the threaded base is attached to and protrudes below the bottom piece, and subassembly 500 and the control board are mounted on the bottom piece and extend into the top piece.

During operation, the threaded base transfers AC from a light socket to the control board, which converts the AC to modulated DC and the wiring transmits the modulated DC to terminal 60 and grounds another terminal 60. As a result, LED chip 108 illuminates bright light through the glass cap. LED chip 108 also generates intense localized heat that flows into and is spread by heat spreader 66 and flows from heat spreader 66 into heat sink 502 where fins 506 heat the air, and fan 508 blows the hot air radially outward through slots in the housing into the external environment.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the semiconductor device can be an LED package and the thermal board can provide vertical signal routing. The substrate can include single-level conductive traces and multi-level conductive traces. The thermal board can include multiple posts arranged in an array for multiple semiconductor devices and can include additional conductive traces to accommodate the additional semiconductor devices. Likewise, the semiconductor device can be an LED package with multiple LED chips and the thermal board can include additional conductive traces to accommodate the additional LED chips. The semiconductor device and the cap can overlap the substrate and cover the post, the aperture and the opening in the upward direction.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the post and the substrate can include additional conductive traces to receive and route additional wire bonds to the chips. This may be more cost effective than providing a miniature post for each chip.

The semiconductor chip can be optical or non-optical. For instance, the chip can be an LED, a solar cell, a microprocessor, a controller or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a post and base that are integral with one another and a cap that is metallurgically bonded and thermally connected to the post, thereby enhancing reliability and reducing cost. The cap can be coplanar with the pad, thereby facilitating the electrical, thermal and mechanical connections with the semiconductor device. Furthermore, the cap can be customized for the semiconductor device and the base can be customized for the next level assembly, thereby enhancing the thermal connection from the semiconductor device to the next level assembly. For instance, the post can have a circular shape in a lateral plane and the cap can have a square or rectangular shape in a lateral plane with the same or similar topography as the thermal contact of the semiconductor device.

The heat spreader can be electrically connected to or isolated from the semiconductor device and the substrate. For instance, the second conductive layer on the grinded surface can include a routing line that extends across the adhesive between the substrate and the cap and electrically connects the semiconductor device to the heat spreader. Thereafter, the heat spreader can be electrically connected to ground, thereby electrically connecting the semiconductor device to ground.

The heat spreader can be copper/nickel/aluminum or other thermally conductive metallic structures.

The post can be deposited on or integral with the base. The post can be integral with the base when they share single-piece metals at their interface such as a copper coating on a nickel buffer layer on an aluminum core.

The post can include a flat top surface that is coplanar with the adhesive. For instance, the post can be coplanar with the adhesive or the post can be etched after the adhesive is solidified to provide a cavity in the adhesive over the post. The post can also be selectively etched to provide a cavity in the post that extends below its top surface. In any case, the semiconductor device can be mounted on the post and located in the cavity, and the wire bond can extend from the semiconductor device in the cavity to the pad outside the cavity. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding. The base can also cover the assembly in the downward direction when the terminal is above the dielectric layer, or alternatively, be spaced from the peripheral edges of the assembly when the terminal is below the adhesive. Furthermore, the base can include fins at its backside that protrude in the downward direction. For instance, the base can be cut at its bottom surface by a routing machine to form lateral grooves that define the fins. In this instance, the base can have a thickness of 700 microns, the grooves can have a depth of 500 microns and the fins can have a height of 500 microns. The fins can increase the surface area of the base, thereby increasing the thermal conductivity of the base by thermal convection when it remains exposed to the air rather than mounted on a heat sink.

The cap can be formed by numerous deposition techniques including electroplating, electroless plating, evaporating and sputtering as a single layer or multiple layers after the adhesive is solidified, either before, during or after the pad and/or the terminal is formed. The cap can be the same metal as the post or the adjacent top of the post. Furthermore, the cap can extend across the aperture to the substrate or reside within the periphery of the aperture. Thus, the cap may contact or be spaced from the substrate. In any case, the cap extends laterally from the top of the post in the lateral directions.

The adhesive can provide a robust mechanical bond between the heat spreader and the substrate. For instance, the adhesive can extend laterally from the post beyond the conductive trace to the peripheral edges of the assembly, the adhesive can fill the space between the heat spreader and the substrate, the adhesive can be located in this space and the adhesive can be void-free with consistent bond lines. The adhesive can also absorb thermal expansion mismatch between the heat spreader and the substrate. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the aperture can be formed in the conductive layer and then the conductive layer and nothing else can be mounted on the adhesive so that the conductive layer contacts the adhesive and is exposed in the upward direction and the post extends into and is exposed in the upward direction by the aperture. In this instance, the conductive layer can have a thickness of 100 to 200 microns such as 125 microns which is thick enough to handle without warping and wobbling and to accommodate high drive current yet thin enough to pattern without excessive etching.

The conductive layer and the dielectric layer can be mounted on the adhesive. For instance, the conductive layer can be laminated on the dielectric layer, then the aperture can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the post extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the post is aligned with the aperture and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned to provide the conductive trace. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad and the cap can be coplanar at their top surfaces, thereby enhancing solder joints between the semiconductor device and the thermal board by controlling solder ball collapse.

The pad, the terminal and the routing line over the dielectric layer can be formed by numerous deposition techniques including electroplating, electroless plating, evaporating and sputtering as a single layer or multiple layers, either before or after the substrate is mounted on the adhesive. For instance, the conductive layer can be patterned on the substrate before it is mounted on the adhesive or after it is attached to the post and the base by the adhesive.

The plated contact surface finish can be formed before or after the pad and the terminal are formed. For instance, the plated layer can be deposited on the second conductive layer and then patterned using the etch mask that defines the pad and the terminal.

The conductive trace can include additional pads, terminals, vias and routing lines as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations.

Those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation. Those skilled in the art will also understand that in the context of a semiconductor chip assembly, the aluminum material can be pure elemental aluminum but is typically an aluminum alloy that is mostly aluminum such as aluminum alloy 5052 (aluminum (~97%), magnesium (2.2-2.8%) and other trace elements such as silicon, iron, chromium or copper (<0.5%)) and aluminum alloy 6061 (aluminum (~97%), magnesium (0.18-1.2%), silicon (0.5-0.8%) and other trace elements such as iron, copper, titanium or magnesium (<0.5%)). Those skilled in the art will further understand that in the context of a semiconductor chip assembly, the nickel material can be pure elemental nickel but is typically a nickel alloy such as nickel-phosphorous (92-99.5% nickel).

The cap, dielectric layer, solder mask, plated contacts and second conductive layer on the grinded surface are generally desirable but may be omitted in some embodiments. For instance, if the opening and aperture are punched rather than drilled so that the top of the post is shaped and sized to accommodate a thermal contact surface of the semiconductor device then the cap and the second conductive layer may be omitted to reduce cost. Likewise, if single-level signal routing is used then the dielectric layer may be omitted to reduce cost.

The thermal board can include a thermal via that is spaced from the post, extends through the dielectric layer and the adhesive outside the opening and the aperture and is adjacent to and thermally connects the base and the cap to improve heat dissipation from the cap to the base and heat spreading in the base.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single copper/nickel/aluminum carrier, a single adhesive, a single substrate and a single solder mask and then separated from one another. Likewise, numerous sets of heat spreaders and conductive traces that are each dedicated to a single semiconductor device can be simultaneously batch manufactured for each thermal board in the batch using a single copper/nickel/aluminum carrier, a single adhesive, a single substrate and a single solder mask.

For example, multiple recesses can be etched in the aluminum plate to form the aluminum core for multiple posts and the base, then the nickel buffer layer can be plated on the aluminum core, then the copper surface layer can be plated on the nickel buffer layer, then the non-solidified adhesive with openings corresponding to the posts can be mounted on the base such that each post extends through an opening, then the substrate (with a single conductive layer, a single dielectric layer and apertures corresponding to the posts) can be mounted on the adhesive such that each post extends through an opening into an aperture, then the base and the substrate can be moved towards one another by platens to force the adhesive into the gaps in the apertures between the posts and the substrate, then the adhesive can be cured and solidified, then the posts, the adhesive and the first conductive layer can be grinded to form a lateral top surface, then the second conductive layer can be plated on the posts, the adhesive and the first conductive layer, then the first and second conductive layers can be etched to form the pads and the terminals corresponding to the posts and the second conductive layer can be etched to form the caps corresponding to the posts, then the solder mask can be deposited on the structure and patterned to expose the pads, the terminals and the caps, then the plated contact surface finish can be formed on the pads, the terminals and the caps and then the base, the substrate, the adhesive and the solder mask can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the caps, then the LED packages can be placed on the solder paste portions, then the solder paste portions can be simultaneously heated, reflowed and hardened to provide the solder joints, and then the thermal boards can be separated from one another.

As another example, die attach paste portions can be deposited on the caps, then the chips can be placed on the die attach paste portions, then the die attach paste portions can be simultaneously heated and hardened to provide the die attaches, then the chips can be wired bonded to the corresponding pads, then the encapsulant can be formed over the chips and the wire bonds, and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the post since an imaginary vertical line intersects the semiconductor device and the post, regardless of whether another element such as the cap is between the semiconductor device and the post and is intersected by the line, and regardless of whether another imaginary vertical line intersects the semiconductor device but not the post (outside the periphery of the post). Likewise, the adhesive overlaps the base and is overlapped by the pad, and the base is overlapped by the post. Likewise, the post overlaps and is within a periphery of the base. Moreover, overlap is synonymous with over and overlapped by is synonymous with under or beneath.

The term "contact" refers to direct contact. For instance, the dielectric layer contacts the pad but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "cap" in conjunction with the heat spreader refers to a contact region that is adapted to contact and/or bond to external connection media (such as solder or thermally conductive adhesive) that thermally connects the heat spreader to the semiconductor device.

The terms "opening" and "aperture" refer to a through-hole and are synonymous. For instance, the post is exposed by the adhesive in the upward direction when it is inserted into the opening in the adhesive Likewise, the post is exposed by the substrate in the upward direction when it is inserted into the aperture in the substrate.

The term "inserted" refers to relative motion between elements. For instance, the post is inserted into the aperture regardless of whether the post is stationary and the substrate moves towards the base, the substrate is stationary and the post moves towards the substrate or the post and the substrate both approach the other. Furthermore, the post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the post is aligned with the aperture when the adhesive is mounted on the base, the substrate is mounted on the adhesive, the post is inserted into and aligned with the opening and the aperture is aligned with the opening regardless of whether the post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach. Likewise, the semiconductor device is mounted on the heat spreader regardless of whether it is mounted on the heat spreader alone or the heat spreader and the substrate.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the post and the dielectric layer in the gap refers to the adhesive in the gap that contacts and is sandwiched between the post at the inner sidewall of the gap and the dielectric layer at the outer sidewall of the gap.

The term "above" refers to upward extension and includes adjacent and non-adjacent elements as well as overlapping and non-overlapping elements. For instance, the post extends above, is adjacent to, overlaps and protrudes from the base. Likewise, the post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post. Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the post extends vertically above the base in the upward direction and the adhesive extends vertically below the pad in the downward direction regardless of whether the assembly is inverted and/or mounted on a heat sink Likewise, the base extends "laterally" from the post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED packages and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a semiconductor chip assembly, comprising:

providing a post, a base, an adhesive and a conductive layer, wherein the post is adjacent to the base, extends above the base in an upward direction, extends into an opening in the adhesive and is aligned with an aperture in the conductive layer, the base extends below the post in a downward direction opposite the upward direction and extends laterally from the post in lateral directions orthogonal to the upward and downward directions, the post and the base include a copper surface layer and an aluminum core, the copper surface layer conformally coats and extends above the aluminum core, and the aluminum core of the post extends above the copper surface layer of the base, the adhesive is mounted on and extends above the base, is sandwiched between the base and the conductive layer and is non-solidified, and the conductive layer is mounted on and extends above the adhesive; then flowing the adhesive into and upward in a gap located in the aperture between the post and the conductive layer;

solidifying the adhesive; then providing a conductive trace that includes a pad, a terminal and a selected portion of the conductive layer;

providing a heat spreader that includes the post and the base, wherein providing the heat spreader includes grinding the post, the adhesive and the conductive layer such that the post, the adhesive and the conductive layer are laterally aligned with one another at a top lateral surface that includes the copper surface layer, excludes the aluminum core and faces in the upward direction;

mounting a semiconductor device on the heat spreader, wherein the semiconductor device overlaps the post;

electrically connecting the semiconductor device to the pad, thereby electrically connecting the semiconductor device to the terminal; and thermally connecting the semiconductor device to the post, thereby thermally connecting the semiconductor device to the base.

2. The method of claim 1, wherein providing the post and the base includes:

providing an aluminum plate;

forming an etch mask on the aluminum plate that selectively exposes the aluminum plate;

etching the aluminum plate in a pattern defined by the etch mask, thereby forming a recess in the aluminum plate that extends into but not through the aluminum plate; then removing the etch mask, wherein the aluminum core of the post is an unetched portion of the aluminum plate that is laterally surrounded by the recess, and the aluminum core of the base is an unetched portion of the aluminum plate below the recess; and then depositing the copper surface layer over the aluminum core.

3. The method of claim 1, wherein:

providing the adhesive includes providing a prepreg with uncured epoxy;

flowing the adhesive includes melting the uncured epoxy and compressing the uncured epoxy between the base and the conductive layer; and solidifying the adhesive includes curing the uncured epoxy.

4. The method of claim 1, wherein flowing the adhesive includes filling the gap with the adhesive.

5. The method of claim 1, wherein mounting the conductive layer includes mounting the conductive layer alone on the adhesive.

6. The method of claim 1, wherein:

mounting the conductive layer includes mounting the conductive layer and a carrier on the adhesive, wherein the carrier is attached to and overlaps the conductive layer and the conductive layer contacts the adhesive and is sandwiched between the adhesive and the carrier; then solidifying the adhesive; then removing the carrier; and then providing the conductive trace.

7. The method of claim 1, wherein providing the pad includes removing selected portions of the conductive layer after solidifying the adhesive.

8. The method of claim 1, wherein providing the heat spreader includes providing a cap that extends above and is adjacent to and covers in the upward direction and extends laterally in the lateral directions from a top of the post and that overlaps and is adjacent to the adhesive after grinding the post, the adhesive and the conductive layer and before mounting the semiconductor device.

9. The method of claim 1, wherein mounting the semiconductor device includes providing a first solder joint between the semiconductor device and the pad and a second solder joint between the semiconductor device and the heat spreader, electrically connecting the semiconductor device includes providing the first solder joint between the semiconductor device and the pad, and thermally connecting the semiconductor device includes providing the second solder joint between the semiconductor device and the heat spreader.

10. The method of claim 1, wherein mounting the semiconductor device includes providing a die attach between the semiconductor device and the heat spreader, electrically connecting the semiconductor device includes providing a wire bond between the semiconductor device and the pad, and thermally connecting the semiconductor device includes providing the die attach between the semiconductor device and the heat spreader.

11. A method of making a semiconductor chip assembly, comprising:

providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer and an aluminum core, the copper surface layer conformally coats and extends above the aluminum core, and the aluminum core of the post extends above the copper surface layer of the base, and providing the post and the base includes:

providing an aluminum plate;

forming an etch mask on the aluminum plate that selectively exposes the aluminum plate;

etching the aluminum plate in a pattern defined by the etch mask, thereby forming a recess in the aluminum plate that extends into but not through the aluminum plate; then removing the etch mask, wherein the aluminum core of the post is an unetched portion of the aluminum plate that is laterally surrounded by the recess, and the aluminum core of the base is an unetched portion of the aluminum plate below the recess; then electrolessly plating a nickel buffer layer on the aluminum core;

electrolessly plating a first copper layer on the nickel buffer layer; and electroplating a second copper layer on the first copper layer, wherein the copper surface layer includes the first and second copper layers;

providing an adhesive, wherein an opening extends through the adhesive;

providing a conductive layer, wherein an aperture extends through the conductive layer;

mounting the adhesive on the base, including inserting the post into the opening, wherein the adhesive extends above the base and the post extends through the opening;

mounting the conductive layer on the adhesive, including aligning the post with the aperture, wherein the conductive layer extends above the adhesive and the adhesive is sandwiched between the base and the conductive layer and is non-solidified; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;

applying heat to solidify the molten adhesive, thereby mechanically attaching the post and the base to the conductive layer; then providing a conductive trace that includes a pad and a terminal, wherein the conductive trace includes selected portions of the conductive layer and an electrically conductive path is between the pad and the terminal;

mounting a semiconductor device on a heat spreader that includes the post and the base, wherein the semiconductor device overlaps the post;

electrically connecting the semiconductor device to the pad, thereby electrically connecting the semiconductor device to the terminal; and thermally connecting the semiconductor device to the post, thereby thermally connecting the semiconductor device to the base.

12. The method of claim 11, wherein:

providing the adhesive includes providing a prepreg with uncured epoxy;

flowing the adhesive includes melting the uncured epoxy and compressing the uncured epoxy between the base and the conductive layer; and solidifying the adhesive includes curing the uncured epoxy.

13. The method of claim 11, wherein providing the pad and the terminal includes removing selected portions of the conductive layer using a second etch mask that defines the pad and the terminal after solidifying the adhesive.

14. The method of claim 11, wherein providing the pad includes removing selected portions of the conductive layer using a second etch mask that defines the pad after solidifying the adhesive, and providing the terminal includes removing selected portions of the base using a third etch mask that defines the terminal after solidifying the adhesive.

15. The method of claim 11, wherein providing the heat spreader includes providing a cap that extends above and is adjacent to and covers in the upward direction and extends laterally in the lateral directions from a top of the post and that overlaps and is adjacent to the adhesive using a second etch mask after solidifying the adhesive and before mounting the semiconductor device.

16. A method of making a semiconductor chip assembly, comprising:

providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer, a nickel buffer layer and an aluminum core, the copper surface layer conformally coats and extends above the aluminum core, the aluminum core of the post extends above the copper surface layer of the base and the nickel buffer layer contacts and is sandwiched between and separates the copper surface layer and the aluminum core;

providing an adhesive, wherein an opening extends through the adhesive;

providing a conductive layer, wherein an aperture extends through the conductive layer;

mounting the adhesive on the base, including inserting the post through the opening, wherein the adhesive extends above the base and the post extends through the opening;

mounting the conductive layer alone on the adhesive, including inserting the post into the aperture, wherein the conductive layer extends above the adhesive, the post extends through the opening into the aperture, the adhesive is sandwiched between the base and the first conductive layer and is non-solidified, and a gap is located in the aperture between the post and the conductive layer; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in the gap;

applying heat to solidify the molten adhesive, thereby mechanically attaching the post and the base to the conductive layer; then grinding the post, the adhesive and the conductive layer such that the post, the adhesive and the conductive layer are laterally aligned with one another at a top lateral surface that includes the copper surface layer, excludes the nickel buffer layer and the aluminum core and faces in the upward direction; then providing a pad, a terminal and a routing line that include selected portions of the conductive layer, including removing selected portions of the conductive layer, wherein the pad, the terminal and the routing line include selected portions of the conductive layer and an electrically conductive path between the pad and the terminal includes the routing line;

mounting a semiconductor device on a heat spreader that includes the post and the base, wherein the semiconductor device overlaps the post;

electrically connecting the semiconductor device to the pad, thereby electrically connecting the semiconductor device to the terminal; and thermally connecting the semiconductor device to the post, thereby thermally connecting the semiconductor device to the base.

17. The method of claim 16, wherein providing the post and the base includes:

providing an aluminum plate;

forming an etch mask on the aluminum plate that selectively exposes the aluminum plate;

etching the aluminum plate in a pattern defined by the etch mask, thereby forming a recess in the aluminum plate that extends into but not through the aluminum plate; then removing the etch mask, wherein the aluminum core of the post is an unetched portion of the aluminum plate that is laterally surrounded by the recess, and the aluminum core of the base is an unetched portion of the aluminum plate below the recess; then electrolessly plating a nickel buffer layer on the aluminum core;

electrolessly plating a first copper layer on the nickel buffer layer; and electroplating a second copper layer on the first copper layer, wherein the copper surface layer includes the first and second copper layers.

18. The method of claim 16, wherein:

providing the adhesive includes providing a prepreg with uncured epoxy;

flowing the adhesive includes melting the uncured epoxy and compressing the uncured epoxy between the base and the conductive layer; and solidifying the adhesive includes curing the uncured epoxy.

19. The method of claim 16, wherein mounting the semiconductor device includes mounting an LED package that includes an LED chip on the pad using a first solder joint and on the heat spreader using a second solder joint, electrically connecting the semiconductor device includes providing the first solder joint between the LED package and the pad, and thermally connecting the semiconductor device includes providing the second solder joint between the LED package and the heat spreader.

20. The method of claim 16, wherein mounting the semiconductor device includes providing a die attach between the semiconductor device and the heat spreader, electrically connecting the semiconductor device includes providing a wire bond between the semiconductor device and the pad, and thermally connecting the semiconductor device includes providing the die attach between the semiconductor device and the heat spreader.

21. A method of making a semiconductor chip assembly, comprising:
  providing a post, a base, an adhesive and a substrate, wherein
    the substrate includes a conductive layer and a dielectric layer,
    the post is adjacent to the base, extends above the base in an upward direction, extends through an opening in the adhesive and extends into an aperture in the substrate,
    the base extends below the post in a downward direction opposite the upward direction and extends laterally from the post in lateral directions orthogonal to the upward and downward directions,
    the post and the base include a copper surface layer and an aluminum core, the copper surface layer conformally coats and extends above the aluminum core, and the aluminum core of the post extends above the copper surface layer of the base,
    the adhesive is mounted on and extends above the base, is sandwiched between the base and the substrate and is non-solidified,
    the substrate is mounted on and extends above the adhesive, and the conductive layer extends above the dielectric layer, and
    a gap is located in the aperture between the post and the substrate; then
  flowing the adhesive into and upward in the gap;
  solidifying the adhesive; then
  providing a heat spreader that includes the post and the base, wherein providing the heat spreader includes grinding the post, the adhesive and the conductive layer such that the post, the adhesive and the conductive layer are laterally aligned with one another at a top lateral surface that includes the copper surface layer, excludes the aluminum core and faces in the upward direction;
  mounting a semiconductor device on the heat spreader, wherein the semiconductor device overlaps the post, a conductive trace includes a pad, a terminal and a selected portion of the conductive layer and the pad is electrically connected to the terminal;
  electrically connecting the semiconductor device to the pad, thereby electrically connecting the semiconductor device to the terminal; and
  thermally connecting the semiconductor device to the post, thereby thermally connecting the semiconductor device to the base.

22. The method of claim 21, wherein providing the post and the base includes:
  providing an aluminum plate;
  forming an etch mask on the aluminum plate that selectively exposes the aluminum plate;
  etching the aluminum plate in a pattern defined by the etch mask, thereby forming a recess in the aluminum plate that extends into but not through the aluminum plate; then
  removing the etch mask, wherein the aluminum core of the post is an unetched portion of the aluminum plate that is laterally surrounded by the recess, and the aluminum core of the base is an unetched portion of the aluminum plate below the recess; and then
  depositing the copper surface layer over the aluminum core.

23. The method of claim 21, wherein:
  providing the adhesive includes providing a prepreg with uncured epoxy;
  flowing the adhesive includes melting the uncured epoxy and compressing the uncured epoxy between the base and the substrate; and
  solidifying the adhesive includes curing the uncured epoxy.

24. The method of claim 21, wherein flowing the adhesive includes filling the gap with the adhesive.

25. The method of claim 21, wherein providing the pad includes removing selected portions of the conductive layer after solidifying the adhesive.

26. The method of claim 21, wherein providing the pad and the terminal includes removing selected portions of the conductive layer after solidifying the adhesive.

27. The method of claim 21, wherein providing the terminal includes removing selected portions of the base after solidifying the adhesive.

28. The method of claim 21, wherein providing the heat spreader includes providing a cap that extends above and is adjacent to and covers in the upward direction and extends laterally in the lateral directions from a top of the post and that overlaps and is adjacent to the adhesive after grinding the post, the adhesive and the conductive layer and before mounting the semiconductor device.

29. The method of claim 21, wherein mounting the semiconductor device includes providing a first solder joint between the semiconductor device and the pad and a second solder joint between the semiconductor device and the heat spreader, electrically connecting the semiconductor device includes providing the first solder joint between the semiconductor device and the pad, and thermally connecting the semiconductor device includes providing the second solder joint between the semiconductor device and the heat spreader.

30. The method of claim 21, wherein mounting the semiconductor device includes providing a die attach between the semiconductor device and the heat spreader, electrically connecting the semiconductor device includes providing a wire bond between the semiconductor device and the pad, and thermally connecting the semiconductor device includes providing the die attach between the semiconductor device and the heat spreader.

31. A method of making a semiconductor chip assembly, comprising:
  providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer and an aluminum core, the copper surface layer conformally coats and extends above the aluminum core, and the aluminum core of the post extends above the copper surface layer of the base, and providing the post and the base includes:
  providing an aluminum plate;
  forming an etch mask on the aluminum plate that selectively exposes the aluminum plate;
  etching the aluminum plate in a pattern defined by the etch mask, thereby forming a recess in the aluminum plate that extends into but not through the aluminum plate; then
  removing the etch mask, wherein the aluminum core of the post is an unetched portion of the aluminum plate that is laterally surrounded by the recess, and the aluminum core of the base is an unetched portion of the aluminum plate below the recess; then electrolessly plating a nickel buffer layer on the aluminum core;

electrolessly plating a first copper layer on the nickel buffer layer; and electroplating a second copper layer on the first copper layer, wherein the copper surface layer includes the first and second copper layers;

providing an adhesive, wherein an opening extends through the adhesive;

providing a substrate that includes a conductive layer and a dielectric layer, wherein an aperture extends through the substrate;

mounting the adhesive on the base, including inserting the post through the opening, wherein the adhesive extends above the base and the post extends through the opening;

mounting the substrate on the adhesive, including inserting the post into the aperture, wherein the substrate extends above the adhesive, the conductive layer extends above the dielectric layer, the post extends through the opening into the aperture, the adhesive is sandwiched between the base and the substrate and is non-solidified, and a gap is located in the aperture between the post and the substrate; then applying heat to melt the adhesive;

moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer;

applying heat to solidify the molten adhesive, thereby mechanically attaching the post and the base to the substrate; then mounting a semiconductor device on a heat spreader that includes the post and the base, wherein the semiconductor device overlaps the post, a conductive trace includes a pad, a terminal and a selected portion of the conductive layer and the pad is electrically connected to the terminal;

electrically connecting the semiconductor device to the pad, thereby electrically connecting the semiconductor device to the terminal; and thermally connecting the semiconductor device to the post, thereby thermally connecting the semiconductor device to the base.

32. The method of claim 31, wherein:

providing the adhesive includes providing a prepreg with uncured epoxy;

flowing the adhesive includes melting the uncured epoxy and compressing the uncured epoxy between the base and the substrate; and solidifying the adhesive includes curing the uncured epoxy.

33. The method of claim 31, wherein providing the pad and the terminal includes removing selected portions of the conductive layer using a second etch mask that defines the pad and the terminal after solidifying the adhesive.

34. The method of claim 31, wherein providing the pad includes removing selected portions of the conductive layer using a second etch mask that defines the pad after solidifying the adhesive, and providing the terminal includes removing selected portions of the base using a third etch mask that defines the terminal after solidifying the adhesive.

35. The method of claim 31, wherein providing the heat spreader includes providing a cap that extends above and is adjacent to and covers in the upward direction and extends laterally in the lateral directions from a top of the post and that overlaps and is adjacent to the adhesive using a second etch mask after solidifying the adhesive and before mounting the semiconductor device.

36. A method of making a semiconductor chip assembly, comprising:

providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer, a nickel buffer layer and an aluminum core, the copper surface layer conformally coats and extends above the aluminum core, the aluminum core of the post extends above the copper surface layer of the base and the nickel buffer layer contacts and is sandwiched between and separates the copper surface layer and the aluminum core;

providing an adhesive, wherein an opening extends through the adhesive;

providing a substrate that includes a first conductive layer and a dielectric layer, wherein an aperture extends through the substrate;

mounting the adhesive on the base, including inserting the post through the opening, wherein the adhesive extends above the base and the post extends through the opening;

mounting the substrate on the adhesive, including inserting the post into the aperture, wherein the substrate extends above the adhesive, the first conductive layer extends above the dielectric layer, the post extends through the opening into the aperture, the adhesive is sandwiched between the base and the substrate and is non-solidified, and a gap is located in the aperture between the post and the substrate; then applying heat to melt the adhesive;

moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer;

applying heat to solidify the molten adhesive, thereby mechanically attaching the post and the base to the substrate; then grinding the post, the adhesive and the conductive layer such that the post, the adhesive and the conductive layer are laterally aligned with one another at a top lateral surface that includes the copper surface layer, excludes the nickel buffer layer and the aluminum core and faces in the upward direction; then providing a pad and a terminal that include selected portions of the conductive layer, including removing selected portions of the conductive layer;

mounting a semiconductor device on a heat spreader that includes the post and the base, wherein the semiconductor device overlaps the post and the pad is electrically connected to the terminal;

electrically connecting the semiconductor device to the pad, thereby electrically connecting the semiconductor device to the terminal; and thermally connecting the semiconductor device to the post, thereby thermally connecting the semiconductor device to the base.

37. The method of claim 36, wherein providing the post and the base includes:
providing an aluminum plate;
forming an etch mask on the aluminum plate that selectively exposes the aluminum plate;
etching the aluminum plate in a pattern defined by the etch mask, thereby forming a recess in the aluminum plate that extends into but not through the aluminum plate; then
removing the etch mask, wherein the aluminum core of the post is an unetched portion of the aluminum plate that is laterally surrounded by the recess, and the aluminum core of the base is an unetched portion of the aluminum plate below the recess; then
electrolessly plating a nickel buffer layer on the aluminum core;
electrolessly plating a first copper layer on the nickel buffer layer; and
electroplating a second copper layer on the first copper layer, wherein the copper surface layer includes the first and second copper layers.

38. The method of claim 36, wherein:
providing the adhesive includes providing a prepreg with uncured epoxy;
flowing the adhesive includes melting the uncured epoxy and compressing the uncured epoxy between the base and the substrate; and
solidifying the adhesive includes curing the uncured epoxy.

39. The method of claim 36, wherein mounting the semiconductor device includes mounting an LED package that includes an LED chip on the pad using a first solder joint and on the heat spreader using a second solder joint, electrically connecting the semiconductor device includes providing the first solder joint between the LED package and the pad, and thermally connecting the semiconductor device includes providing the second solder joint between the LED package and the heat spreader.

40. The method of claim 36, wherein mounting the semiconductor device includes providing a die attach between the semiconductor device and the heat spreader, electrically connecting the semiconductor device includes providing a wire bond between the semiconductor device and the pad, and thermally connecting the semiconductor device includes providing the die attach between the semiconductor device and the heat spreader.

41. A method of making a semiconductor chip assembly, comprising:
providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer and an aluminum core, the copper surface layer conformally coats and extends above the aluminum core, and the aluminum core of the post extends above the copper surface layer of the base;
providing an adhesive, wherein an opening extends through the adhesive;
providing a conductive layer, wherein an aperture extends through the conductive layer;
mounting the adhesive on the base, including inserting the post into the opening, wherein the adhesive extends above the base and the post extends through the opening;
mounting the conductive layer on the adhesive, including aligning the post with the aperture, wherein the conductive layer extends above the adhesive and the adhesive is sandwiched between the base and the conductive layer and is non-solidified; then
applying heat to melt the adhesive;
moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;
applying heat to solidify the molten adhesive, thereby mechanically attaching the post and the base to the conductive layer; then
providing a conductive trace that includes a pad and a terminal, wherein the conductive trace includes selected portions of the conductive layer and an electrically conductive path is between the pad and the terminal;
providing a heat spreader that includes the post and the base;
providing the pad and the heat spreader including:
grinding the post, the adhesive and the conductive layer such that the post, the adhesive and the conductive layer are laterally aligned with one another at a top lateral surface that includes the copper surface layer, excludes the aluminum core and faces in the upward direction; and then
removing selected portions of the conductive layer using an etch mask that defines the pad;
mounting a semiconductor device on the heat spreader, wherein the semiconductor device overlaps the post;
electrically connecting the semiconductor device to the pad, thereby electrically connecting the semiconductor device to the terminal; and
thermally connecting the semiconductor device to the post, thereby thermally connecting the semiconductor device to the base.

42. The method of claim 41, wherein providing the post and the base includes:
providing an aluminum plate;
etching the aluminum plate, thereby forming a recess in the aluminum plate that extends into but not through the aluminum plate, wherein the aluminum core of the post is an unetched portion of the aluminum plate that is laterally surrounded by the recess, and the aluminum core of the base is an unetched portion of the aluminum plate below the recess; then
electrolessly plating a nickel buffer layer on the aluminum core;
electrolessly plating a first copper layer on the nickel buffer layer; and
electroplating a second copper layer on the first copper layer, wherein the copper surface layer includes the first and second copper layers.

43. The method of claim 41, wherein:
providing the adhesive includes providing a prepreg with uncured epoxy;
flowing the adhesive includes melting the uncured epoxy and compressing the uncured epoxy between the base and the conductive layer; and
solidifying the adhesive includes curing the uncured epoxy.

44. The method of claim 41, wherein mounting the conductive layer includes mounting the conductive layer alone on the adhesive.

45. The method of claim 41, including grinding the adhesive without grinding the post.

46. A method of making a semiconductor chip assembly, comprising:

providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer and an aluminum core, the copper surface layer conformally coats and extends above the aluminum core, and the aluminum core of the post extends above the copper surface layer of the base;

providing an adhesive, wherein an opening extends through the adhesive;

providing a conductive layer, wherein an aperture extends through the conductive layer;

mounting the adhesive on the base, including inserting the post into the opening, wherein the adhesive extends above the base and the post extends through the opening;

mounting the conductive layer on the adhesive, including aligning the post with the aperture, wherein the conductive layer extends above the adhesive and the adhesive is sandwiched between the base and the conductive layer and is non-solidified; then applying heat to melt the adhesive;

moving the base and the conductive layer towards one another, thereby moving the post upward in the aperture and applying pressure to the molten adhesive between the base and the conductive layer, wherein the pressure forces the molten adhesive to flow into and upward in a gap located in the aperture between the post and the conductive layer;

applying heat to solidify the molten adhesive, thereby mechanically attaching the post and the base to the conductive layer; then providing a conductive trace that includes a pad and a terminal, wherein the conductive trace includes selected portions of the conductive layer and an electrically conductive path is between the pad and the terminal;

providing a heat spreader that includes the post and the base;

providing the pad and the heat spreader including:
grinding the post, the adhesive and the conductive layer such that the post, the adhesive and the conductive layer are laterally aligned with one another at a top lateral surface that includes the copper surface layer, excludes the aluminum core and faces in the upward direction; then
depositing a second conductive layer on the post, the adhesive and the conductive layer;
forming an etch mask on the second conductive layer;
etching the conductive layers using the etch mask to define the pad;
etching the second conductive layer using the etch mask to define a cap that extends above and is adjacent to and covers in the upward direction and extends laterally in the lateral directions from a top of the post and that overlaps and is adjacent to the adhesive, wherein the heat spreader includes the cap; and then
removing the etch mask;

mounting a semiconductor device on the cap, wherein the semiconductor device overlaps the post;

electrically connecting the semiconductor device to the pad, thereby electrically connecting the semiconductor device to the terminal; and thermally connecting the semiconductor device to the cap, thereby thermally connecting the semiconductor device to the base.

47. The method of claim 46, wherein providing the post and the base includes:

providing an aluminum plate;

etching the aluminum plate, thereby forming a recess in the aluminum plate that extends into but not through the aluminum plate, wherein the aluminum core of the post is an unetched portion of the aluminum plate that is laterally surrounded by the recess, and the aluminum core of the base is an unetched portion of the aluminum plate below the recess; then electrolessly plating a nickel buffer layer on the aluminum core;

electrolessly plating a first copper layer on the nickel buffer layer; and electroplating a second copper layer on the first copper layer, wherein the copper surface layer includes the first and second copper layers.

48. The method of claim 46, wherein:

providing the adhesive includes providing a prepreg with uncured epoxy;

flowing the adhesive includes melting the uncured epoxy and compressing the uncured epoxy between the base and the conductive layer; and solidifying the adhesive includes curing the uncured epoxy.

49. The method of claim 46, wherein mounting the conductive layer includes mounting the conductive layer alone on the adhesive.

50. The method of claim 46, including grinding the adhesive without grinding the post.

51. A method of making a semiconductor chip assembly, comprising:

providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer and an aluminum core, the copper surface layer conformally coats and extends above the aluminum core, and the aluminum core of the post extends above the copper surface layer of the base;

providing an adhesive, wherein an opening extends through the adhesive;

providing a substrate that includes a conductive layer and a dielectric layer, wherein an aperture extends through the substrate;

mounting the adhesive on the base, including inserting the post through the opening, wherein the adhesive extends above the base and the post extends through the opening;

mounting the substrate on the adhesive, including inserting the post into the aperture, wherein the substrate extends above the adhesive, the conductive layer extends above the dielectric layer, the post extends through the opening into the aperture, the adhesive is sandwiched between the base and the substrate and is non-solidified, and a gap is located in the aperture between the post and the substrate; then applying heat to melt the adhesive;

moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer;

applying heat to solidify the molten adhesive, thereby mechanically attaching the post and the base to the substrate; then providing a conductive trace that includes a pad, a terminal and a selected portion of the conductive layer, wherein the pad is electrically connected to the terminal;

providing a heat spreader that includes the post and the base;

providing the pad and the heat spreader including:
  grinding the post, the adhesive and the conductive layer such that the post, the adhesive and the conductive layer are laterally aligned with one another at a top lateral surface that includes the copper surface layer, excludes the aluminum core and faces in the upward direction; and then
  removing selected portions of the conductive layer using an etch mask that defines the pad;

mounting a semiconductor device on the heat spreader, wherein the semiconductor device overlaps the post;

electrically connecting the semiconductor device to the pad, thereby electrically connecting the semiconductor device to the terminal; and thermally connecting the semiconductor device to the post, thereby thermally connecting the semiconductor device to the base.

52. The method of claim 51, wherein providing the post and the base includes:
  providing an aluminum plate;
  etching the aluminum plate, thereby forming a recess in the aluminum plate that extends into but not through the aluminum plate, wherein the aluminum core of the post is an unetched portion of the aluminum plate that is laterally surrounded by the recess, and the aluminum core of the base is an unetched portion of the aluminum plate below the recess; then
  electrolessly plating a nickel buffer layer on the aluminum core;
  electrolessly plating a first copper layer on the nickel buffer layer; and
  electroplating a second copper layer on the first copper layer, wherein the copper surface layer includes the first and second copper layers.

53. The method of claim 51, wherein:
  providing the adhesive includes providing a prepreg with uncured epoxy;
  flowing the adhesive includes melting the uncured epoxy and compressing the uncured epoxy between the base and the conductive layer; and
  solidifying the adhesive includes curing the uncured epoxy.

54. The method of claim 51, including grinding the adhesive without grinding the post.

55. The method of claim 51, including using the etch mask to define the terminal.

56. A method of making a semiconductor chip assembly, comprising:
  providing a post and a base, wherein the post is adjacent to and integral with the base and extends above the base in an upward direction, the base extends below the post in a downward direction opposite the upward direction and extends laterally from the post in lateral directions orthogonal to the upward and downward directions, the post and the base include a copper surface layer and an aluminum core, the copper surface layer conformally coats and extends above the aluminum core, and the aluminum core of the post extends above the copper surface layer of the base;

providing an adhesive, wherein an opening extends through the adhesive;

providing a substrate that includes a conductive layer and a dielectric layer, wherein an aperture extends through the substrate;

mounting the adhesive on the base, including inserting the post through the opening, wherein the adhesive extends above the base and the post extends through the opening;

mounting the substrate on the adhesive, including inserting the post into the aperture, wherein the substrate extends above the adhesive, the conductive layer extends above the dielectric layer, the post extends through the opening into the aperture, the adhesive is sandwiched between the base and the substrate and is non-solidified, and a gap is located in the aperture between the post and the substrate; then applying heat to melt the adhesive;

moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer;

applying heat to solidify the molten adhesive, thereby mechanically attaching the post and the base to the substrate; then providing a conductive trace that includes a pad, a terminal and a selected portion of the conductive layer, wherein the pad is electrically connected to the terminal;

providing a heat spreader that includes the post and the base;

providing the pad and the heat spreader including:
  grinding the post, the adhesive and the conductive layer such that the post, the adhesive and the conductive layer are laterally aligned with one another at a top lateral surface that includes the copper surface layer, excludes the aluminum core and faces in the upward direction; then
  depositing a second conductive layer on the post, the adhesive and the conductive layer;
  forming an etch mask on the second conductive layer;
  etching the conductive layers using the etch mask to define the pad;
  etching the second conductive layer using the etch mask to define a cap that extends above and is adjacent to and covers in the upward direction and extends laterally in the lateral directions from a top of the post and that overlaps and is adjacent to the adhesive, wherein the heat spreader includes the cap; and then
  removing the etch mask;

mounting a semiconductor device on the cap, wherein the semiconductor device overlaps the post;

electrically connecting the semiconductor device to the pad, thereby electrically connecting the semiconductor device to the terminal; and thermally connecting the semiconductor device to the cap, thereby thermally connecting the semiconductor device to the base.

57. The method of claim 56, wherein providing the post and the base includes:
  providing an aluminum plate;
  etching the aluminum plate, thereby forming a recess in the aluminum plate that extends into but not through the aluminum plate, wherein the aluminum core of the post is an unetched portion of the aluminum plate that is laterally surrounded by the recess, and the aluminum core of the base is an unetched portion of the aluminum plate below the recess; then
  electrolessly plating a nickel buffer layer on the aluminum core;
  electrolessly plating a first copper layer on the nickel buffer layer; and
  electroplating a second copper layer on the first copper layer, wherein the copper surface layer includes the first and second copper layers.

58. The method of claim 56, wherein:
  providing the adhesive includes providing a prepreg with uncured epoxy;
  flowing the adhesive includes melting the uncured epoxy and compressing the uncured epoxy between the base and the conductive layer; and
  solidifying the adhesive includes curing the uncured epoxy.

59. The method of claim 56, including grinding the adhesive without grinding the post.

60. The method of claim 56, including etching the conductive layers using the etch mask to define the terminal.

* * * * *